United States Patent

Masuyama et al.

(10) Patent No.: US 9,563,124 B2
(45) Date of Patent: Feb. 7, 2017

(54) PHOTORESIST COMPOSITION AND METHOD FOR PRODUCING PHOTORESIST PATTERN

(71) Applicant: SUMITOMO CHEMICAL COMPANY, LIMITED, Tokyo (JP)

(72) Inventors: Tatsuro Masuyama, Osaka (JP); Satoshi Yamaguchi, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/949,700

(22) Filed: Jul. 24, 2013

(65) Prior Publication Data

US 2014/0030654 A1 Jan. 30, 2014

(30) Foreign Application Priority Data

Jul. 27, 2012 (JP) .................. 2012-166681

(51) Int. Cl.
G03F 7/004 (2006.01)
G03F 7/38 (2006.01)
G03F 7/039 (2006.01)
G03F 7/20 (2006.01)

(52) U.S. Cl.
CPC ........... *G03F 7/0397* (2013.01); *G03F 7/0046* (2013.01); *G03F 7/20* (2013.01); *G03F 7/2041* (2013.01); *G03F 7/38* (2013.01)

(58) Field of Classification Search
CPC ................................ G03F 7/0397; G03F 7/38
USPC ...................... 430/270.1, 907, 910, 326, 905
See application file for complete search history.

(56) References Cited

U.S. PATENT DOCUMENTS

| | | | | |
|---|---|---|---|---|
| 8,034,537 B2* | 10/2011 | Fukuhara et al. | ......... | 430/270.1 |
| 8,173,353 B2* | 5/2012 | Masuyama | ........... | G03F 7/0046 430/270.1 |
| 8,802,349 B2* | 8/2014 | Yoshidome et al. | ....... | 430/270.1 |
| 8,877,421 B2* | 11/2014 | Kanna | ........................ | 430/270.1 |
| 8,900,789 B2* | 12/2014 | Saegusa et al. | ........... | 430/270.1 |
| 2007/0172761 A1 | 7/2007 | Takahashi et al. | | |
| 2008/0081293 A1* | 4/2008 | Harada | ................. | C07C 309/17 430/287.1 |
| 2008/0248420 A1* | 10/2008 | Kanna | ........................ | 430/281.1 |
| 2010/0015554 A1* | 1/2010 | Saegusa et al. | ........... | 430/286.1 |
| 2012/0058431 A1 | 3/2012 | Takahashi et al. | | |

FOREIGN PATENT DOCUMENTS

JP 2010-197413 A 9/2010

OTHER PUBLICATIONS

Tarutani, "Negative Developing Process and Materials for Resist," Monthly Display, Techno Times Co , Ltd., Jun. 2011, pp. 31-36 (including partial English translation).

* cited by examiner

*Primary Examiner* — John S Chu
(74) *Attorney, Agent, or Firm* — Birch, Stewart, Kolasch & Birch, LLP

(57) ABSTRACT

A photoresist composition comprising
a resin which has no acid-labile group and which comprises a structural unit represented by formula (I);

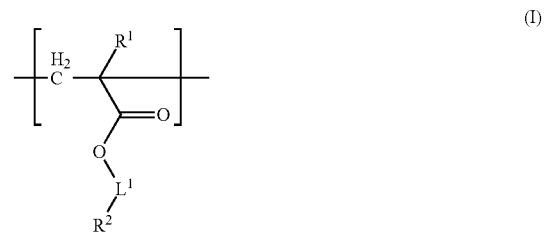

and a structural unit represented by formula (a4);

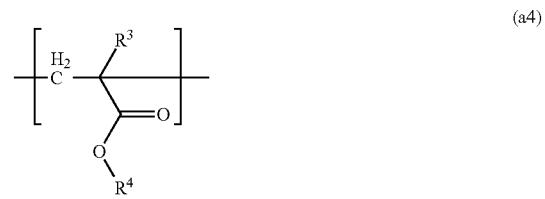

a resin which has an acid-labile group; and
an acid generator.

7 Claims, No Drawings

PHOTORESIST COMPOSITION AND METHOD FOR PRODUCING PHOTORESIST PATTERN

This nonprovisional application claims priority under 35 U.S.C. §119(a) on Patent Application No. 2012-166681 filed in JAPAN on Jul. 27, 2012, the entire contents of which are hereby incorporated by reference.

FIELD OF THE INVENTION

The present invention relates to a photoresist composition and a method for producing a photoresist pattern.

BACKGROUND OF THE INVENTION

As a method for forming a negative photoresist pattern, JP2010-197413A1 mentions a positive type photoresist composition for immersion exposure, which comprises:
a fluorine-containing macromolecular compound (F1) which comprises a structural unit having a base-dissociable group and a structural unit represented by the following general formula (f2-1);

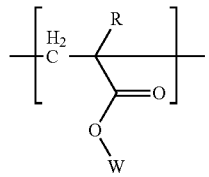

(f2-1)

where R represents a hydrogen atom, a C1-C5 alkyl group, or a C1-C5 halogenated alkyl group, and
W represents a polycyclic hydrocarbon-containing group,
a base component (A) which shows increased solubility in an alkaline developer by action of an acid, and
a compound which generates an acid by exposure.

"Monthly Display", June, 2011, page 31, published by Techno Times Co., Ltd., teaches that development with positive developer gives positive photoresist pattern, and development with negative developer gives negative photoresist pattern, in a process of forming photoresist pattern from photoresist composition by photolithography.

SUMMARY OF THE INVENTION

The present invention provides a photoresist composition suitable for producing negative photoresist pattern.
The present invention relates to the followings:
<1> A photoresist composition comprising
a resin which has no acid-labile group and which comprises a structural unit represented by formula (I);

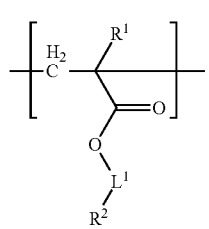

(I)

wherein $R^1$ represents a hydrogen atom or a methyl group,
$R^2$ represents a C3-C18 alicyclic hydrocarbon group where a hydrogen atom can be replaced by a C1-C8 aliphatic hydrocarbon group or a hydroxyl group provided that the carbon atom attached to $L^1$ is unsubstituted with a C1-C8 aliphatic hydrocarbon group, and
$L^1$ represents a single bond or a C1-C18 divalent saturated hydrocarbon group where a methylene group can be replaced by an oxygen atom or a carbonyl group, and
a structural unit represented by formula (a4);

(a4)

wherein $R^3$ represents a hydrogen atom or a methyl group, and
$R^4$ represents a C1-C24 fluorine-containing saturated hydrocarbon group where a methylene group can be replaced by an oxygen atom or a carbonyl group;
a resin which has an acid-labile group; and
an acid generator.

<2> The photoresist composition according to <1>, wherein $R^2$ represents a C3-C18 unsubstituted alicyclic hydrocarbon group.

<3> The photoresist composition according to <1> or <2>, wherein the structural unit represented by formula (a4) is one selected from the group consisting of a structural unit represented by formula (a4-1), a structural unit represented by formula (a4-2) and a structural unit represented by formula (a4-0);

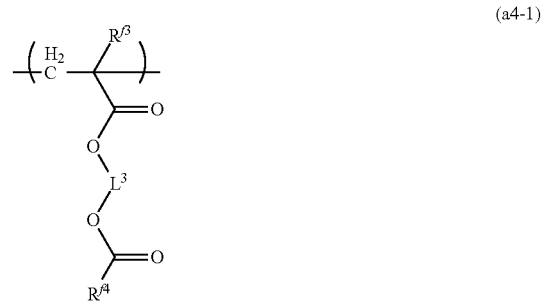

(a4-1)

where $R^{f3}$ represents a hydrogen atom or a methyl group,
$L^3$ represents a C1-C18 divalent saturated hydrocarbon group where a methylene group can be replaced by an oxygen atom or a carbonyl group, and
$R^{f4}$ represents a C1-C20 fluorine-containing saturated hydrocarbon group provided that the total number of carbon atoms in $L^3$ and $R^{f4}$ is 20 or less;

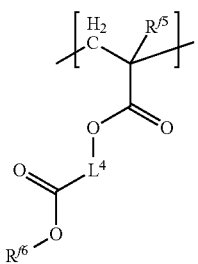

(a4-2)

where $R^{f5}$ represents a hydrogen atom or a methyl group,
L$^4$ represents a C1-C18 divalent saturated hydrocarbon group where a methylene group can be replaced by an oxygen atom or a carbonyl group, and
$R^{f6}$ represents a C1-C20 fluorine-containing saturated hydrocarbon group provided that the total number of carbon atoms in L$^4$ and $R^{f6}$ is 20 or less;

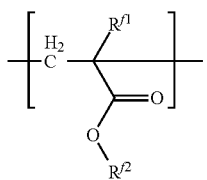

(a4-0)

where $R^{f1}$ represents a hydrogen atom or a methyl group, and
$R^{f2}$ represents a C1-C20 fluorine-containing saturated hydrocarbon group.

<4> The photoresist composition according to any one of <1> to <3>, wherein the resin which has an acid-labile group comprises a structural unit represented by formula (a1-1) and a structural unit represented by formula (a1-2);

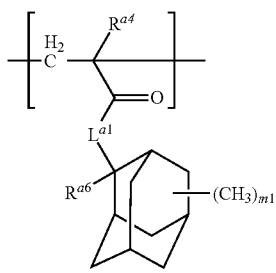

(a1-1)

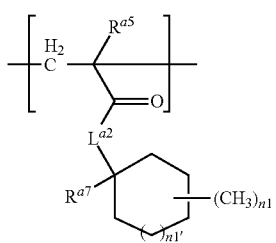

(a1-2)

wherein L$^{a1}$ and L$^{a2}$ each independently represents *—O— or *—O—(CH$_2$)$_{k1}$—CO—O— in which * represents a binding position to —CO—, and k1 represents an integer of 1 to 7, $R^{a4}$ and $R^{a5}$ each independently represent a hydrogen atom or a methyl group,
$R^{a6}$ and $R^{a7}$ each independently represent a C1-C8 alkyl group, a C3-C18 alicyclic hydrocarbon group, and a combination of them,
m1 represents an integer of 0 to 14, n1 represents an integer of 0 to 10, and n1' represents 0 to 3.

<5> A process for producing a photoresist pattern comprising the following steps (1) to (5):
(1) a step of applying the photoresist composition according to any one of <1> to <4> on a substrate,
(2) a step of forming a composition film by drying the composition,
(3) a step of exposing the composition film to radiation,
(4) a step of baking the exposed composition film, and
(5) a step of developing the baked composition film, thereby forming a photoresist pattern.

DESCRIPTION OF PREFERRED EMBODIMENTS

The photoresist composition of the present invention will be illustrated.

The photoresist composition of the present invention comprises a resin which has no acid-labile group and which comprises a structural unit represented by formula (I) and a structural unit represented by formula (a4), which resin is sometimes referred to as "resin (A1)",
a resin which has an acid-labile group, which resin is sometimes referred to as "resin (A2)"; and
an acid generator.

The resin (A1) comprises a structural unit represented by formula (I).

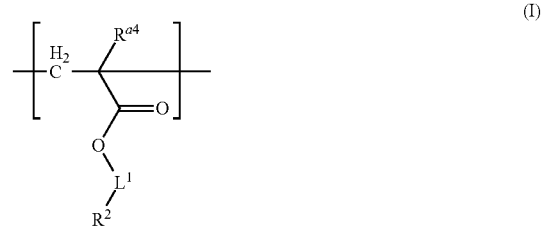

(I)

In formula (I), R$^1$ represents a hydrogen atom or a methyl group,
R$^2$ represents a C3-C18 alicyclic hydrocarbon group where a hydrogen atom can be replaced by a C1-C8 aliphatic hydrocarbon group or a hydroxyl group provided that the carbon atom attached to L$^1$ is unsubstituted with a C1-C8 aliphatic hydrocarbon group, and
L$^1$ represents a single bond or a C1-C18 divalent saturated aliphatic hydrocarbon group where a methylene group can be replaced by an oxygen atom or a carbonyl group.

The alicyclic hydrocarbon group represented by R$^2$ may be monocyclic or polycyclic. Examples of monocyclic one include a cyclopropyl group, a cyclobutyl group, a cyclopentyl group and a cyclohexyl group. Examples of polycyclic one include an adamantyl group and a norbornyl group.

Examples of the aliphatic hydrocarbon group for the substituents of the alicyclic hydrocarbon group include a methyl group, an ethyl group, n-propyl group, an isopropyl group, n-butyl group, sec-butyl group, tert-butyl group, a pentyl group, a hexyl group, an octyl group and a 2-ethylhexyl group.

Examples of the substituted saturated hydrocarbon group represented by $R^2$ include 3-methyladamantyl group.

$R^2$ is preferably a C3-C18 unsubstituted alicyclic hydrocarbon group, more preferably adamantyl group, a norbornyl group and a cyclohexyl group.

The divalent saturated hydrocarbon group represented by $L^1$ includes divalent aliphatic saturated hydrocarbon groups and divalent alicyclic saturated hydrocarbon groups, preferably divalent aliphatic hydrocarbon groups. Examples of the divalent aliphatic saturated hydrocarbon groups include an alkanediyl group such as a methylene group, an ethylene group, a propanediyl group, a butanediyl group and a pentanediyl group.

The alicyclic saturated hydrocarbon group represented by $L^1$ may be monocyclic or polycyclic. Examples of monocyclic one include a cycloalkanediyl group such as a cyclopentylene group and a cyclohexylene group.

Examples of polycyclic one include an adamantanediyl group and a norbornanediyl group.

The divalent aliphatic saturated hydrocarbon group where a methylene group can be replaced by an oxygen atom or a carbonyl group includes groups represented by formulae (L1-1) to (L1-4);

  (L1-1)

  (L1-2)

  (L1-3)

  (L1-4)

wherein $X^{x1}$ represents a carbonyloxy group or an oxycarbonyl group,
$L^{x1}$ represents a C1-C16 divalent aliphatic saturated hydrocarbon group, and
$L^{x2}$ represents a single bond or a C1-C15 divalent saturated hydrocarbon group provided that the total number of the carbon atoms in $L^{x1}$ and $L^{x2}$ is up to 16,
$L^{x3}$ represents a C1-C17 divalent saturated hydrocarbon group,
$L^{x4}$ represents a single bond or a C1-C16 divalent saturated hydrocarbon group provided that the total number of the carbon atoms in $L^{x3}$ and $L^{x4}$ is up to 17,
$L^{x5}$ represents a C1-C15 divalent saturated hydrocarbon group,
$L^{x6}$ and $L^{x7}$ independently each represent a single bond or a C1-C14 divalent saturated hydrocarbon group provided that the total number of the carbon atoms in $L^{x5}$, $L^{x6}$ and $L^{x7}$ is up to 15,
$L^{x8}$ and $L^{x9}$ independently each represent a single bond or a C1-C12 divalent saturated aliphatic hydrocarbon group, and
$W^{x1}$ represents a C3-C15 divalent alicyclic saturated hydrocarbon group, provided that the total number of the carbon atoms in $L^{x8}$, $L^{x9}$ and $W^{x1}$ is up to 15, and
* represents a binding site to an oxygen atom.

$L^{x1}$ is preferably a C1-C8 divalent aliphatic saturated hydrocarbon group, more preferably a methylene group or an ethylene group.

$L^{x2}$ is preferably a single bond or a C1-C8 divalent aliphatic saturated hydrocarbon group, more preferably a single bond or a C1-C5 divalent aliphatic saturated hydrocarbon group, and still more preferably a single bond.

$L^{x3}$ is preferably a C1-C8 divalent aliphatic saturated hydrocarbon group, and more preferably a C1-C5 divalent aliphatic saturated hydrocarbon group.

$L^{x4}$ is preferably a single bond or a C1-C8 divalent aliphatic saturated hydrocarbon group, and more preferably a single bond or a C1-C5 divalent aliphatic saturated hydrocarbon group.

$L^{x5}$ is preferably a C1-C8 divalent aliphatic saturated hydrocarbon group, more preferably a methylene group or an ethylene group.

$L^{x6}$ is preferably a single bond or a C1-C8 divalent aliphatic saturated hydrocarbon group, more preferably a methylene group or an ethylene group.

$L^{x7}$ is preferably a single bond or a C1-C8 divalent aliphatic saturated hydrocarbon group, and more preferably a single bond or a C1-C5 divalent aliphatic saturated hydrocarbon group.

$L^{x8}$ is preferably a single bond or a C1-C8 divalent aliphatic saturated hydrocarbon group, more preferably a single bond or a methylene group.

$L^{x9}$ is preferably a single bond or a C1-C8 divalent aliphatic saturated hydrocarbon group, more preferably a single bond or a methylene group.

$W^{x1}$ is preferably a C3-C10 divalent alicyclic saturated hydrocarbon group, more preferably a cyclohexanediyl group or an adamantanediyl group.

The group represented by formula (L1-1) includes the following divalent groups;

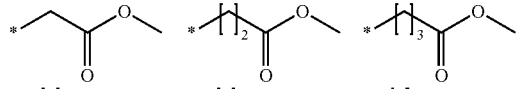

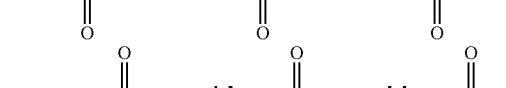

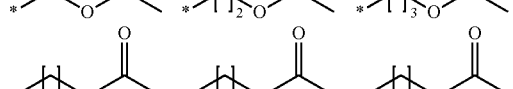

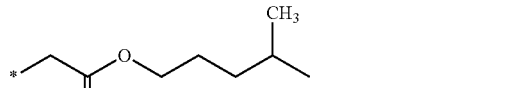

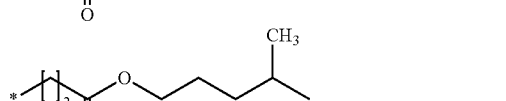

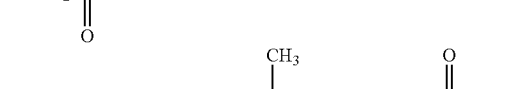

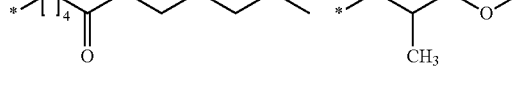

-continued

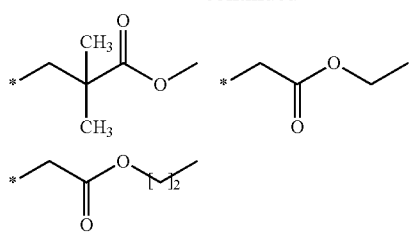

where * represents a binding site to —O—.

The group represented by formula (L1-2) includes the following divalent groups;

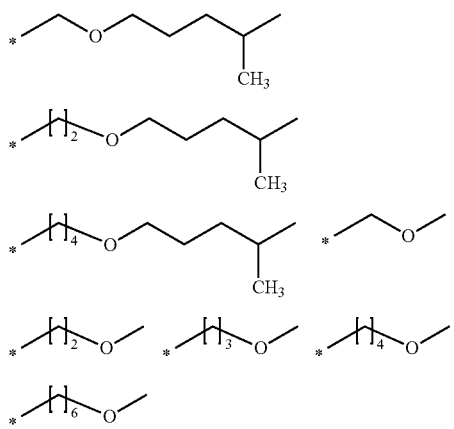

where * represents a binding site to —O—.

The group represented by formula (L1-3) includes the following divalent groups;

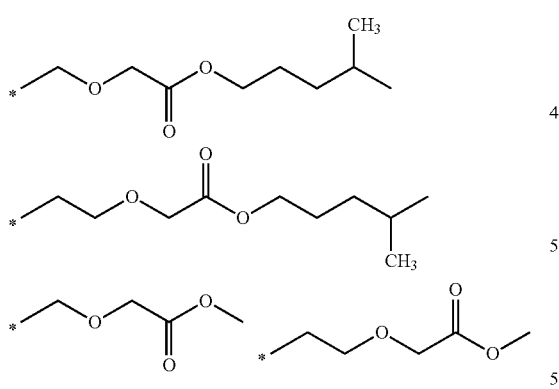

where * represents a binding site to —O—.

The group represented by formula (L1-4) includes the following divalent groups;

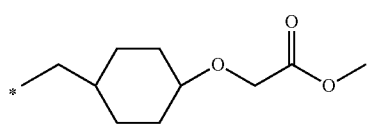

-continued

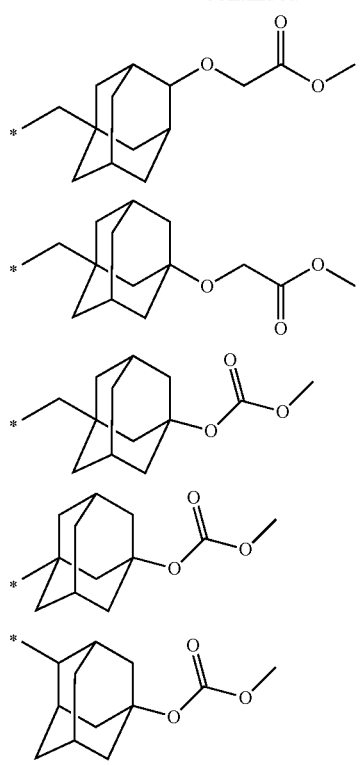

where * represents a binding site to —O—.

$L^1$ is preferably a single bond or a group represented by formula (L1-1).

The structural unit represented by formula (I) include the following ones.

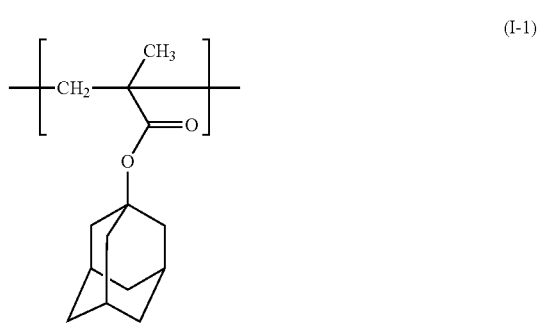
(I-1)

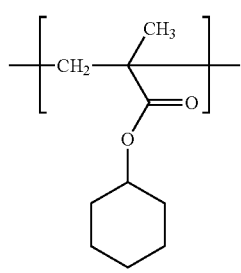
(I-2)

(I-3)
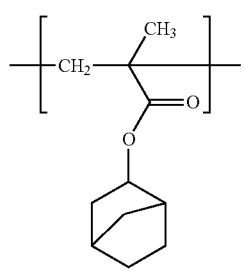

(I-4)
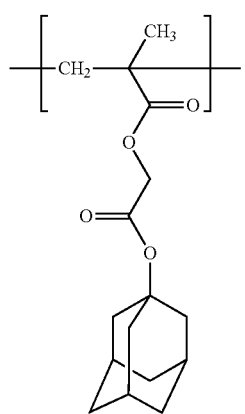

(I-5)
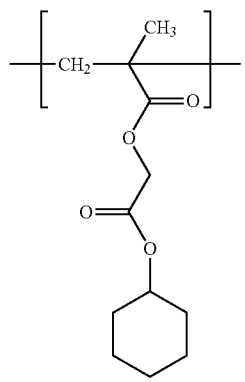

(I-6)
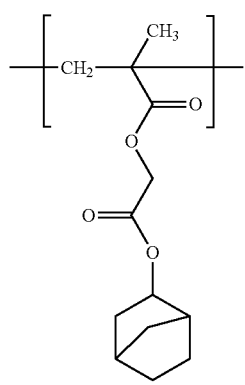

(I-7)
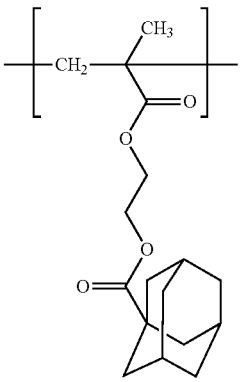

(I-8)
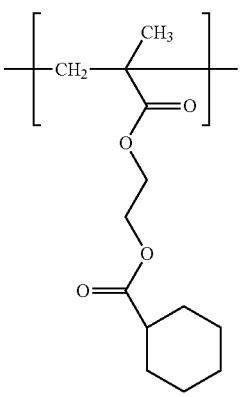

(I-9)
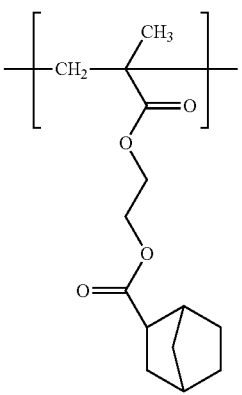

Other examples of the structural unit represented by formula (I) include the same groups as those represented by formulae (I-1) to (I-9) except that their methyl group has been replaced by a hydrogen atom.

The structural unit represented by formula (I) can be derived from a compound represented by formula (I');

(I')
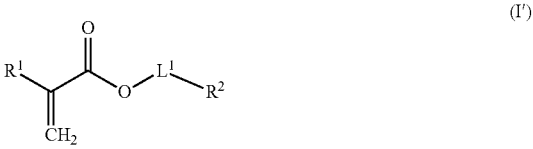

where $R^1$, $R^2$ and $L^1$ are as defined above.

The compounds represented by formula (I') may be a commercial product such as adamantane-1-ylmethacylate or adamantane-1-ylacylate, or one produced by a known method such as what comprises condensating (meth)acrylate or its derivative, e.g. (meth)acyl chloride, with an alcohol compound represented by OH-L$^1$-R$^2$ where L$^1$ and R$^2$ are as defined above.

The resin (A1) further comprises a structural unit represented by formula (a4);

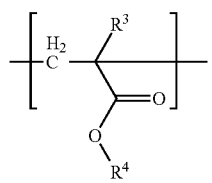
(a4)

where R$^3$ represents a hydrogen atom or a methyl group,
R$^4$ represents a C1-C24 fluorine-containing saturated hydrocarbon group where a methylene group can be replaced by an oxygen atom or a carbonyl group.

The fluorine-containing saturated hydrocarbon group represented by R$^4$ includes fluorine-containing alkyl groups such as a difluoromethyl group, a trifluoromethyl group, 1,1-difluoroethyl group, 2,2-difluoroethyl group, 2,2,2-trifluoroethyl group, perfluoroethyl group, 1,1,2,2-tetrafluoropropyl group, 1,1,2,2,3,3-hexafluoropropyl group, perfluofoethylmethyl group, 1-(trifluoromethyl)-1,2,2,2-tetrafluoroethyl group, perfluoropropyl group, 1,1,2,2-tetrafluorobutyl group, 1,1,2,2,3,3,4,4-octafluorobutyl group, perfluorobutyl group, 1,1-bis(trifluoromethyl)-2,2,2-trifluoroethyl group, 2-(perfluoropropyl)ethyl group, 1,1,2,2,3,3,4,4-octafluoropentyl group, perfluoropentyl group, 1,1,2,2,3,3,4,4,5,5-decafluoropentyl group, 1,1-bis (trifluoromethyl)-2,2,3,3,3-pentafluoropropyl group, 2-(perfluorobutyl)ethyl group, 1,1,2,2,3,3,4,4,5,5-decafluorohexyl group, 1,1,2,2,3,3,4,4,5,5,6,6-dodecafluohexyl groups, perfluoropentylmethyl group and perfluorohexyl group; and fluorine-containing alicyclic hydrocarbon groups such as a perfluorocyclohexyl group and a perfluoroadamantyl group.

The structural unit represented by formula (a4) is preferably one selected from the group consisting of those represented by formula (a4-0), formula (a4-1) and (a4-2);

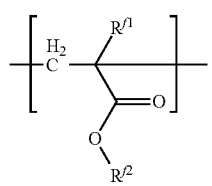
(a4-0)

where R$^{f1}$ represents a hydrogen atom or a methyl group, and
R$^{f2}$ represents a C1-C20 fluorine-containing saturated hydrocarbon group;

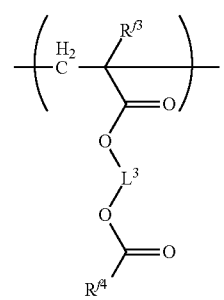
(a4-1)

where R$^{f3}$ represents a hydrogen atom or a methyl group,
L$^3$ represents a C1-C18 divalent saturated hydrocarbon group where a methylene group can be replaced by an oxygen atom or a carbonyl group, and
R$^{f4}$ represents a C1-C20 fluorine-containing saturated hydrocarbon group provided that the total number of carbon atoms in L$^3$ and R$^{f4}$ is 22 or less, preferably 20 or less;

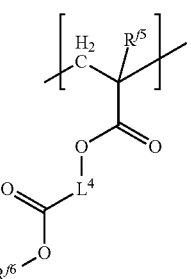
(a4-2)

where R$^{f5}$ represents a hydrogen atom or a methyl group,
L$^4$ represents a C1-C18 divalent saturated hydrocarbon group where a methylene group can be replaced by an oxygen atom or a carbonyl group, and
R$^{f6}$ represents a C1-C20 fluorine-containing saturated hydrocarbon group provided that the total number of carbon atoms in L$^4$ and R$^{f6}$ is 22 or less, preferably 20 or less.

R$^{f2}$, R$^{f4}$ and R$^{f6}$ are preferably a C1-C4 fluorine-containing alkyl group, respectively.
L$^3$ are preferably a C2-C6 alkyl group.
L$^4$ are preferably a C1-C4 alkyl group.

Examples of the group represented by formula (a4-0) include the following ones.

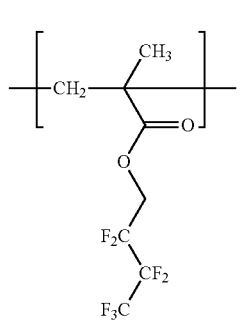
(a4-0-1)

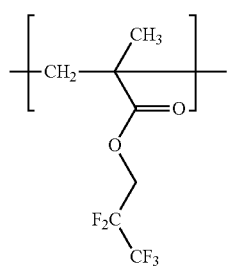 (a4-0-2)
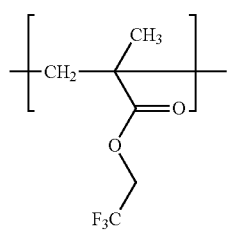 (a4-0-3)
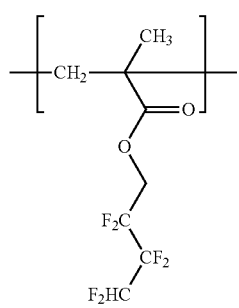 (a4-0-4)
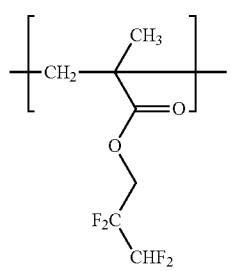 (a4-0-5)
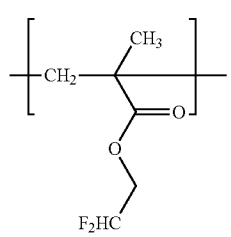 (a4-0-6)
Other examples of that include the same structural units as those represented by formulae (a4-0-1), (a4-0-2), (a4-0-3), (a4-0-4), (a4-0-5) and (a4-0-6) except that their methyl group has been replaced by a hydrogen atom.
Examples of the group represented by formula (a4-1) include the following ones.
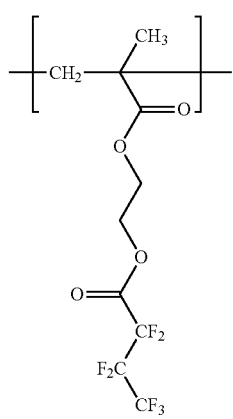 (a-4-1-1)
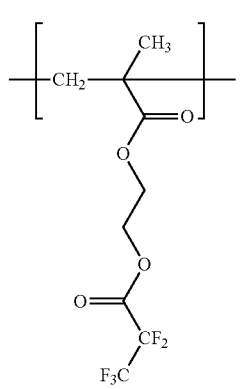 (a-4-1-2)
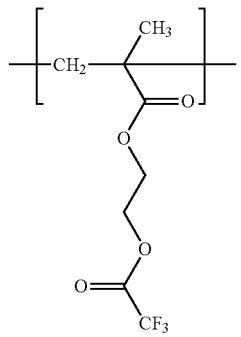 (a-4-1-3)
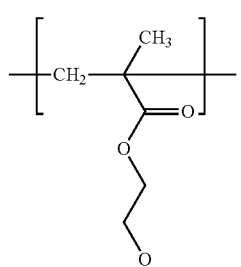 (a-4-1-4)

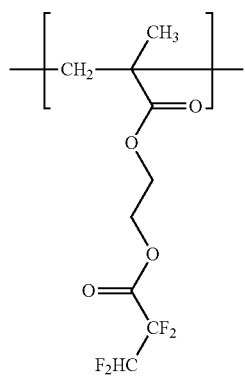
(a4-1-5)
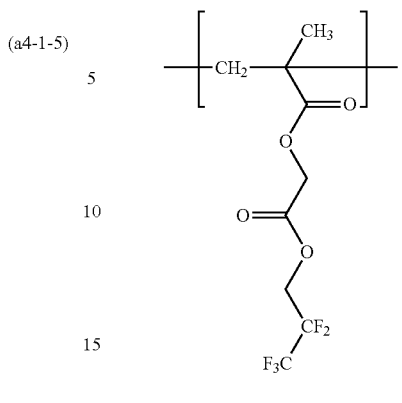
(a4-2-2)
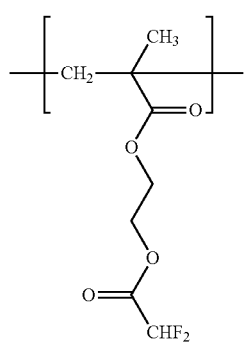
(a4-1-6)
Other examples of that include the same structural units as those represented by formulae (a4-1-1), (a4-1-2), (a4-1-3), (a4-1-4), (a4-1-5) and (a4-1-6) except that their methyl group has been replaced by a hydrogen atom.
Examples of the group represented by formula (a4-2) include the following ones.
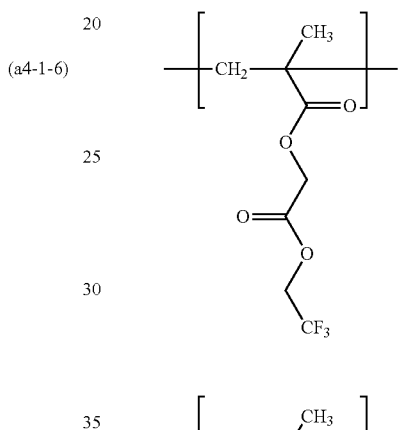
(a4-2-3)
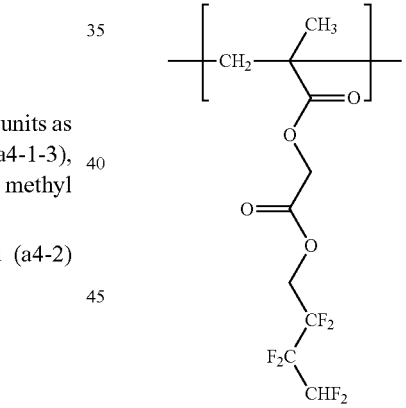
(a4-2-4)
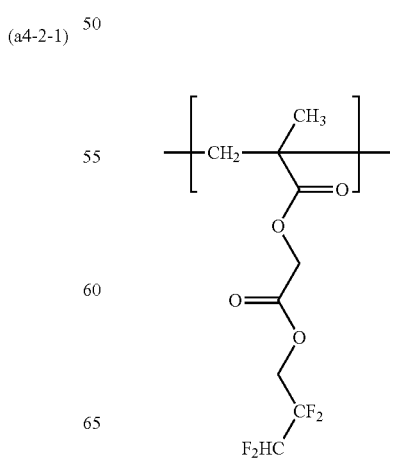
(a4-2-1)
(a4-2-5)

-continued

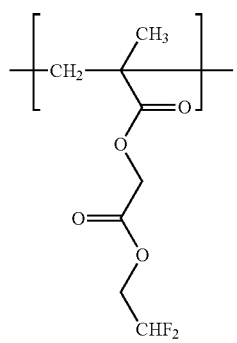

(a4-2-6)

Other examples of that include the same structural units as those represented by formulae (a4-2-1), (a4-2-2), (a4-2-3), (a4-2-4), (a4-2-5) and (a4-2-6) except that their methyl group has been replaced by a hydrogen atom.

Other examples of the structural units represented by formulae (a4-1) and (a4-2) include one represented by formula (a4-3);

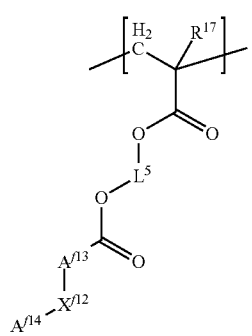

(a4-3)

where $R^{17}$ represents a hydrogen atom or a methyl group,
$L^5$ represents a C1-C6 alkanediyl group,
$A^{f13}$ represents a C1-C18 saturated hydrocarbon group where a hydrogen atom can be replaced by a fluorine atom,
$X^{f12}$ represents a carbonyloxy group or an oxycarbonyl group,
$A^{f14}$ represents a C1-C17 saturated hydrocarbon group where a hydrogen atom can be replaced by a fluorine atom provided that the total number of carbon atoms in $L^5$, $A^{f13}$ and $A^{f14}$ is 20 or less, preferably 18 or less and at least one of $A^{f13}$ and $A^{f14}$ has a fluorine atom.

Examples of the alkanediyl group represented by $L^5$ include linear alkanediyl groups such as a methylene group, an ethylene group, a propane-1,3-diyl group, a propane-1,2-diyl group, a butane-1,4-diyl group, a pentane-1,5-diyl group, a hexane-1,6-diyl group; and branched alkanediyl groups such as a 1-methylpropane-1,3-diyl group, a 2-methyl propane-1,3-diyl group, a 2-methylpropane-1,2-diyl group, a 1-methylbutane-1,4-diyl group, the 2-methylbutane-1,4-diyl group.

Examples of the saturated hydrocarbon group where a hydrogen atom can be replaced by a fluorine atom, which is represented by $A^{f13}$, include an aliphatic saturated hydrocarbon group, an alicyclic saturated hydrocarbon group, and combination of them.

$A^{f13}$ is preferably a C1-C18 divalent aliphatic saturated hydrocarbon group where a hydrogen atom can be replaced by a fluorine atom. The aliphatic saturated hydrocarbon group where a hydrogen atom can be replaced by a fluorine atom includes an alkanediyl group such as a methyl group, an ethylene group, a propanediyl group, a butanediyl group and a pentanediyl group; and a perfluoroalkanediyl group such as a fluoromethylene group, a fluoroethylene group, a perfluoropropanediyl group, a perfluorobutanediyl group and a perfluoropentanediyl group.

The alicyclic saturated hydrocarbon group may be monocyclic or polycyclic hydrocarbon group, monocyclic hydrocarbon groups of which includes a cyclohexanediyl group and a perfluorocyclohexanediyl group, and polycyclic hydrocarbon groups of which includes an adamantanediyl group, norbornanediyl group, a perfluoroadamantanediyl group.

Examples of the saturated hydrocarbon group represented by $A^{f14}$ include an aliphatic saturated hydrocarbon group, an alicyclic saturated hydrocarbon group, and combination of them.

Examples of the saturated aliphatic hydrocarbon group represented by $A^{f14}$ include a trifluoromethyl group, a fluoromethyl group, a methyl group, a perfluoroethyl group, 1,1,1-trifluoroethyl group, 1,1,2,2-tetrafluoroethyl group, an ethyl group, perfluoropropyl group, 1,1,1,2,2-pentafluoropropyl group, a propyl group, a perfluorobutyl group, 1,1,2,2,3,3,4,4-octafluorobutyl group, butyl group, perfluoropentyl group, 1,1,1,2,2,3,3,4,4-nonafluoropentyl group, a pentyl group, a hexyl group, a perfluorohexyl group, a heptyl group, a perfluoroheptyl group, an octyl group and a perfluorooctyl group.

Examples of the alicyclic saturated hydrocarbon group may be monocyclic or polycyclic, examples of which include monocyclic saturated hydrocarbon group such as a cyclopropyl group, a cyclopentyl group, a cyclohexyl group and a perfluoro cyclohexyl group; polycyclic saturated hydrocarbon group such as an adamantyl group, a norbornyl group, perfluoroadamantyl group; and combination of these hydrocarbon groups includes a cyclopropylmethyl group, a cyclobutylmethyl group, an adamantylmethyl group, a norbornylmethyl group, and perfluoroadamantylmethyl group.

In formula (a4-3), $L^5$ is preferably an ethylene group.

$A^{f13}$ is preferably a C1-C18 aliphatic saturated hydrocarbon group, more preferably a C1-C6 aliphatic saturated hydrocarbon group, more preferably a C2-C3 aliphatic saturated hydrocarbon group. $A^{f14}$ has preferably 3 to 12, more preferably 3 to 10 carbon atoms. Among them, preferred is a C3-C12 saturated hydrocarbon group having an alicyclic hydrocarbon group, such as a cyclohexylmethyl group, cyclopentyl group, a cyclohexyl group, a norbornyl group and an adamantyl group.

Examples of the structural unit represented by formula (a4-3) include the units represented by the following formulae (a4-3-1) to (a4-3-6) and those in which their methyl group has been replaced by a hydrogen atom.

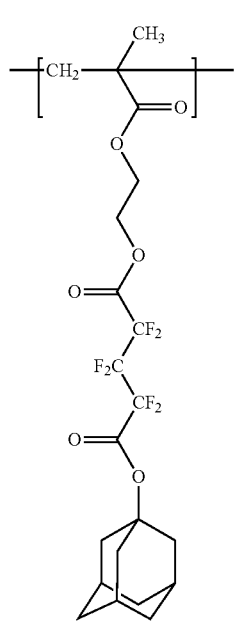 (a4-3-1)
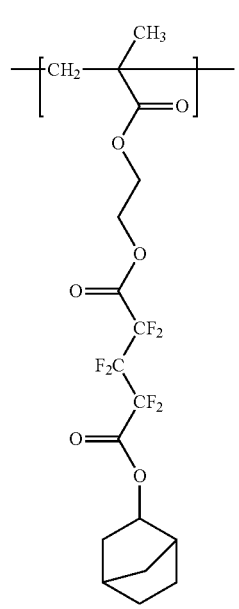 (a4-3-3)
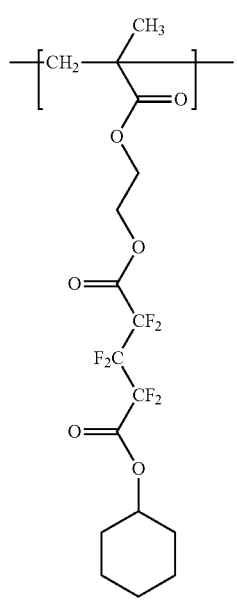 (a4-3-2)
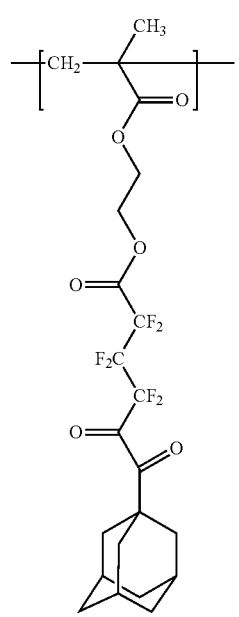 (a4-3-4)

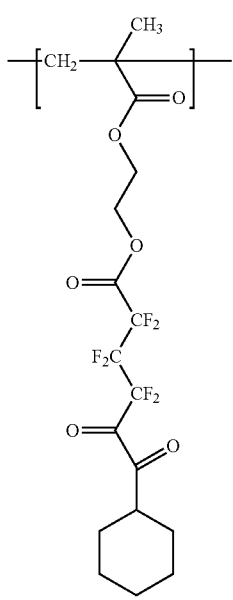

(a4-3-5)

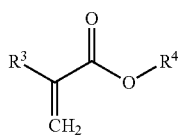

(a4-3-6)

Other examples of that include the same structural units as those represented by formulae (a4-3-1), (a4-3-2), (a4-3-3), (a4-3-4), (a4-3-5) and (a4-3-6) except that their methyl group has been replaced by a hydrogen atom.

The structural unit represented by formula (a4) is derived from a compound represented by formula (a4');

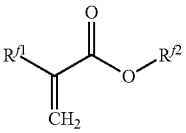

(a4')

wherein $R^3$ and $R^4$ are each independently as defined above.

The compound represented by formula (a4') is available on the market, which can be produced by a know method such as a process comprising condensation of alcohol $R^4$—OH where $R^4$ is as defined above with (meth)acylate or its derivative, e.g. acryl chloride.

The structural unit represented by formula (a4-0) is derived from a compound represented by formula (a4'-0);

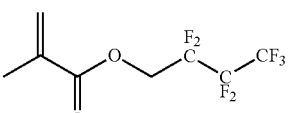

(a4-0)

wherein $R^{/1}$ and $R^{/2}$ are each independently as defined above.

The compound represented by formula (a4'-0) is available on the market, which can be produced by a know method such as a process comprising condensation of alcohol $R^{/2}$—OH where $R^{/2}$ is as defined above with (meth)acylate or its derivative, e.g. acryl chloride. Examples of the compound include the followings.

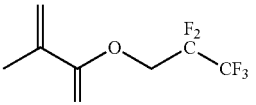

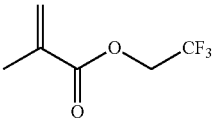

The structural unit represented by formula (a4-1) is derived from a compound represented by formula (a4'-1);

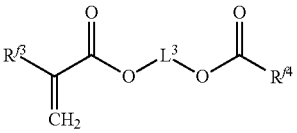

(a4'-1)

wherein $R^{/3}$, $R^{/4}$ and $L^3$ are each independently as defined above.

The compound represented by formula (a4'-1) can be produced by reacting a compound represented by formula (a4'-1-1) with a compound represented by formula (a4'-1-2) in the presence of a basic catalyst such as pyridine, in a solvent such as tetrahydrofuran;

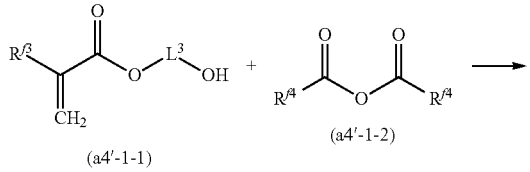

(a4'-1-1)    (a4'-1-2)

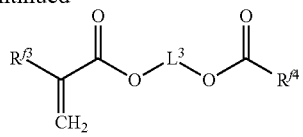

(a4'-1)

wherein $R^{f3}$, $R^{f4}$ and $L^3$ are each independently as defined above.

The compound represented by formula (a4'-1-1) includes hydroxyethylmethacrylate, which is available on the market. The compound can be produced by a know method such as a process comprising condensation of diol HO-$L^3$-OH where $L^3$ is as defined above with (meth)acylate or its derivative, e.g. acryl chloride.

The compound represented by formula (a4'-1-2) includes carboxylic acid anhydrides having a substituent $R^{f4}$, such as heptafluoroisobutylic anhydride.

The structural unit represented by formula (a4-2) is derived from a compound represented by formula (a4'-2);

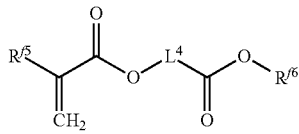

(a4'-2)

wherein $R^{f5}$, $R^{f6}$ and $L^4$ are each independently as defined above.

The compound represented by formula (a4'-2) can be produced by reacting a compound represented by formula (a4'-2-1) with a compound represented by formula (a4'-2-2) in the presence of a catalyst such as potassium carbonate or potassium iodide, in a solvent such as dimethylformamide;

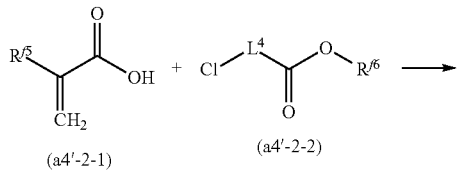

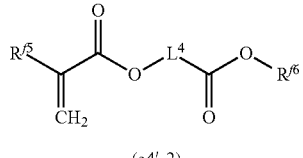

(a4'-2)

wherein $R^{f5}$, $R^{f6}$ and $L^4$ are each independently as defined above.

The compound represented by formula (a4'-2-1) is available on the market, which includes methcarylate.

The compound represented by formula (a4'-2-2) can be produced by reacting a compound represented by formula (a4'-2-3) with a compound represented by formula (a4'-2-4) in the presence of a basic catalyst such as pyridine, in a solvent such as tetrahydrofuran;

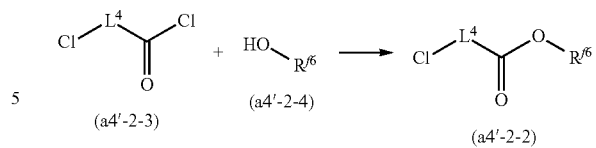

wherein $R^{f6}$ and $L^4$ are each independently as defined above.

The compound represented by formula (a4'-2-3) is selected depending on what $L^4$ represents. When $L^4$ represents a methylene group, chloroacethyl chloride, which is available on the market, can be used as the compound represented by formula (a4'-2-3). As the compound represented by formula (a4'-2-4), a suitable alcohol is selected depending on what $R^{f6}$ represents. When $R^{f6}$ represents a fluorine-containing aliphatic hydrocarbon group, the compound is for example 2,2,3,3,4,4,4-heptafluoro-1-butanol which is available on the market.

The structural unit represented by formula (a4-3) is derived from a compound represented by formula (a4'-3);

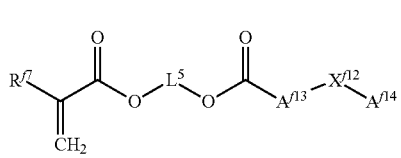

(a4'-3)

wherein $R^{f7}$, $X^{f12}$, $A^{f13}$, $A^{f14}$ and $L^5$ are each independently as defined above.

The compound represented by formula (a4-3) can be produced by reacting a compound represented by formula (a4'-3-1) with a carboxylic acid represented by formula (a4'-3-2) in a solvent such as tetrahydrofuran or toluene, optionally in the presence of a catalyst for esterification such as acid catalysts or carbodiimide;

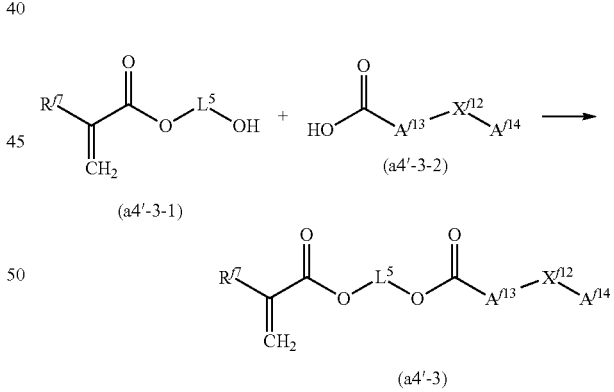

wherein $R^{f7}$, $X^{f12}$, $A^{f13}$, $A^{f14}$ and $L^5$ are each independently as defined above.

The compound represented by formula (a4'-3-1) is available on the market, which can be produced by condensation of (meth)acrylate or its derivative, e.g. (meth)acryl chloride, with a diol HO-$L^5$-OH where $L^5$ is as defined above. Examples of the compound include hydroxyethylmethacrylate.

The carboxylic acid represented by formula (a4'-3-2) can be produced by a known method such as one described in JP2012-256011A1, which includes the followings.

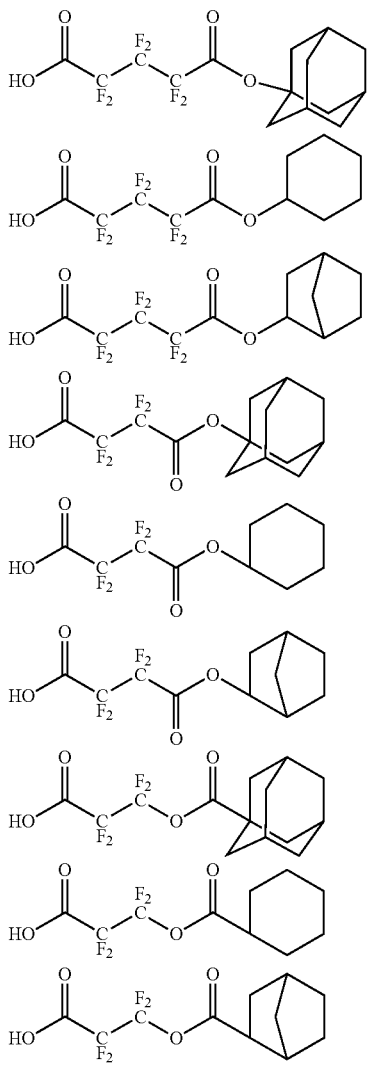

The content of the structural unit represented by formula (I) is usually 5 to 80% by mole, preferably 10 to 70% by mole and more preferably 20 to 60% by mole based on all the structural units of the resin (A1).

The content of the structural unit represented by formula (a4) is usually 20 to 95% by mole, preferably 30 to 90% by mole and more preferably 40 to 80% by mole based on all the structural units of the resin (A1).

The resin (A1) which comprises these structural units respectively in the above-mentioned ranges can provide a photoresist pattern with excellent CD uniformity (CDU) and with fewer defects.

The resin (A1) may comprise one or more species of the structural units represented by formula (I) and one or more species of the structural units represented by formula (a4), respectively.

The resin (A1) may further comprise one or more other structural units having no acid-labile group than the above-mentioned structural units.

The resin (A1) can be produced by polymerizing the compound represented by formula (I') with the compound represented by formula (a4'), optionally with another compound from which the structural unit having no acid-labile group is derived in a manner of radical polymerization or a known polymerization method.

The resin (A1) has no acid-labile group.

The weight average molecular weight of the resin (A1) is preferably 5000 or more, more preferably 7,000 or more, and still more preferably 10000 or more, and preferably 80,000 or less, more preferably 50,000 or less, and still more preferably 30,000 or less.

The weight-average molecular weight can be measured with gel permeation chromatography (standard: polyethylene). The detailed method of measurement is described in Examples of the present specification.

The photoresist composition of the present invention comprises the resin (A2).

The resin (A2) has an acid-labile group.

The resin (A2) generally comprises a structural unit having an acid-labile group, which is usually decomposed by action of an acid to decrease in solubility in an organic solvent for negative development, such as butyl acetate or 2-heptanone.

Herein "an acid-labile group" means a group which comprises a leaving group capable of being cleaved in case of contacting with an acid to give a hydrophilic group such as a hydroxy group or carboxy group.

Specific examples of the acid-labile group include a group represented by the formula (1):

(1)

wherein $R^{a1}$, $R^{a2}$ and $R^{a3}$ each independently represent a C1-C8 alkyl group, a C3-C20 alicyclic hydrocarbon group or a combination of them, or $R^{a1}$ and $R^{a2}$ may be bonded each other to form a C2-C20 divalent hydrocarbon group, and * represents a binding position, and a group represented by the formula (2)

(2)

wherein $R^{a1'}$ and $R^{a2'}$ each independently represent a hydrogen atom or a C1-C12 hydrocarbon group, and $R^{a3'}$ represents a C1-C20 hydrocarbon group, or $R^{a3'}$ together with $R^{a1'}$ and $R^{a2'}$ represents a C2-C20 divalent hydrocarbon group in which a methylene group of the divalent hydrocarbon group may be replaced by —O— or —S—.

Specific examples of the C1-C8 alkyl group include a methyl group, an ethyl group, a propyl group, an isopropyl group, a butyl group, a pentyl group, a hexyl group, a heptyl group and an octyl group.

The alicyclic hydrocarbon group may be monocyclic or polycyclic. Examples of the alicyclic hydrocarbon group include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings.

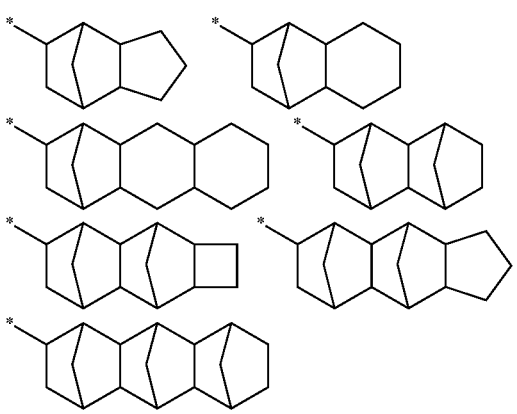

The alicyclic hydrocarbon group preferably has C3-C16 carbon atoms.

The combination of alkyl group and alicyclic hydrocarbon group includes a methylcyclohexyl group, a dimethylcyclohexyl group and a methylnorbornyl group.

When $R^{a1}$ and $R^{a2}$ of formula (1) are bonded each other to form a C2-C20 divalent hydrocarbon group, the moiety represented by —C($R^{a1}$)($R^{a2}$)($R^{a3}$) includes the following groups and the ring preferably has 3 to 12 carbon atoms:

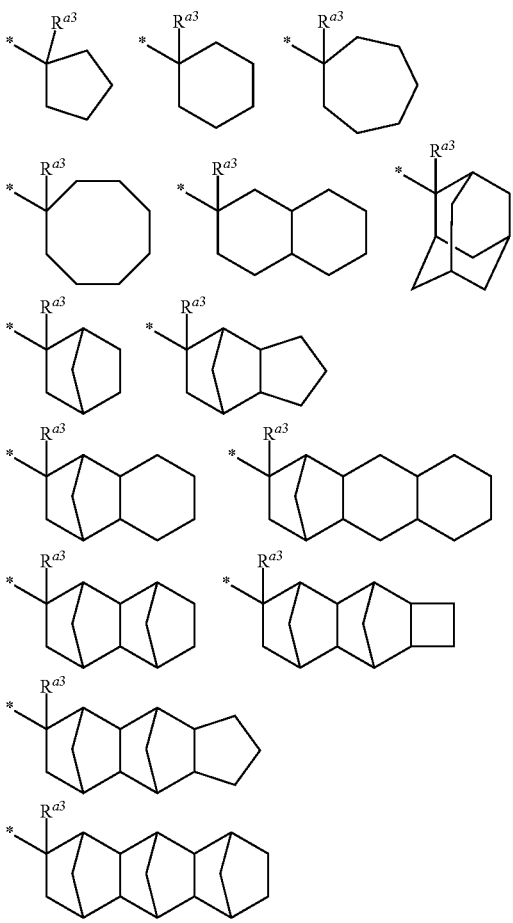

wherein $R^{a3}$ is the same as defined above and * represents a binding position to —O— of formula (1).

Examples of the combination of an alkyl group and an alicyclic hydrocarbon group include a methylcyclohexyl group, a dimethylcyclohexyl group, and methylnorbornyl group.

Preferred are the group represented by the formula (1) wherein $R^{a1}$, $R^{a2}$ and $R^{a3}$ each independently represent a C1-C8 alkyl group such as a tert-butyl group, such as 1,1'-dialkylalkoxylcarbonyl group, the group represented by the formula (1) wherein $R^{a1}$ and $R^{a2}$ are bonded each other to form an adamantyl group and $R^{a3}$ is a C1-C8 alkyl group such as a 2-alkyladaman-2-tyloxycarbonyl group, and the group represented by the formula (1) wherein $R^{a1}$ and $R^{a2}$ are C1-C8 alkyl groups and $R^{a3}$ is an adamantyl group such as a 1-(1-adaman-1-tyl)-1-alkylalkoxycarbonyl group.

As to formula (2), examples of the hydrocarbon group include an alkyl group, an alicyclic hydrocarbon group and an aromatic hydrocarbon group.

Examples of the alkyl group and the alicyclic hydrocarbon group include the same as described above. Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

It is preferred that at least one of $R^{a1'}$ and $R^{a2'}$ is a hydrogen atom.

Examples of the group represented by formula (2) include the following.

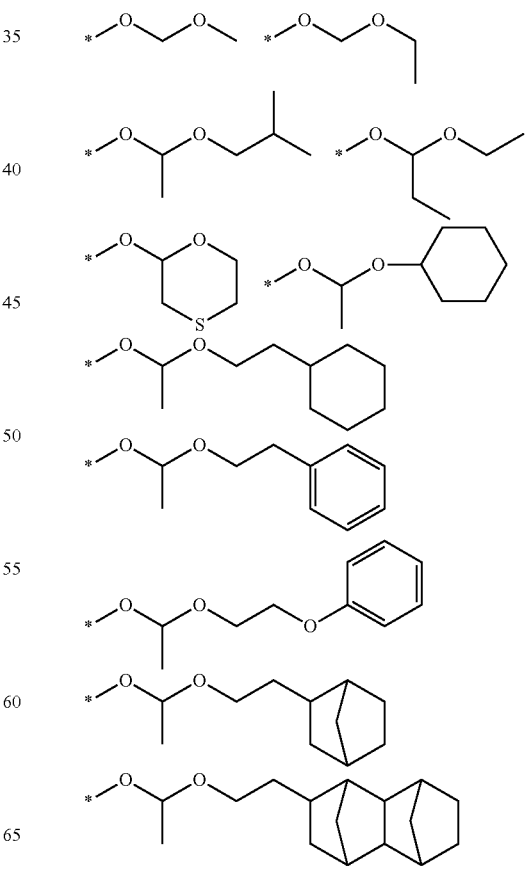

-continued

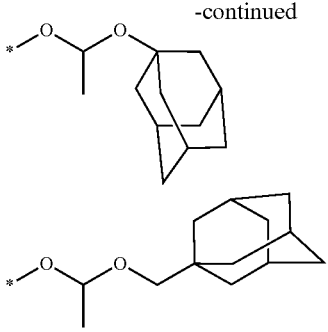

The monomer from which the structural unit having an acid-labile group is derived is preferably a compound having an acid-labile group and a carbon-carbon double bond, and is more preferably a (meth)acryalte compound having an acid-labile group.

Such (meth)acryalte compound preferably has a C5-C20 alicyclic hydrocarbon group.

When the photoresist composition comprises a resin which comprises a structural unit with a bulky structure such as a saturated alicyclic hydrocarbon group, the photoresist composition can provide a photoresist pattern with excellent resolution.

The structural unit derived from the (meth)acryalte compound having an acid-labile group includes those represented by the formulae (a1-1) and (a1-2):

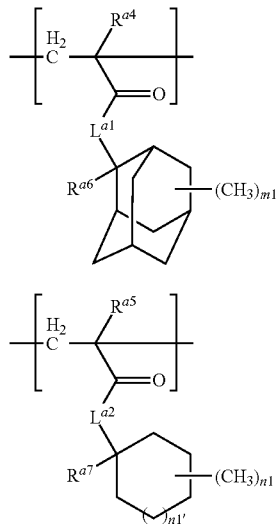

(a1-1)

(a1-2)

wherein $L^{a1}$ and $L^{a2}$ each independently represents an oxygen atom or *—O—$(CH_2)_{k1}$—CO—O— in which * represents a binding position to —CO—, and k1 represents an integer of 1 to 7, $R^{a4}$ and $R^{a5}$ each independently represent a hydrogen atom or a methyl group, $R^{a6}$ and $R^{a7}$ each independently represent a C1-C8 alkyl group, a C3-C18 alicyclic hydrocarbon group, and a combination of them.

m1 represents an integer of 0 to 14, n1 represents an integer of 0 to 10, and n1' represents 0 to 3.

$L^{a1}$ and $L^{a2}$ are preferably an oxygen atom or *—O—$(CH_2)_{f1}$—CO—O— in which * represents a binding position to —CO—, and f1 represents an integer of 1 to 4, and is more preferably an oxygen atom.

k1 represents preferably an integer of 1 to 4, more preferably an integer of 1.

$R^{a4}$ and $R^{a5}$ are preferably methyl groups.

Examples of the groups each represented by $R^{a6}$ and $R^{a7}$ include the same as described above.

The alkyl group represented by $R^{a6}$ and $R^{a7}$ has preferably preferably 1 to 6 carbon atoms. The saturated cyclic hydrocarbon group represented by $R^{a6}$ and $R^{a7}$ preferably has 3 to 8 carbon atoms and more preferably 3 to 6 carbon atoms.

In the formula (a1-1), m1 is preferably an integer of 0 to 3, and is more preferably 0 or 1. In the formula (a1-2), n1 is preferably an integer of 0 to 3, and is more preferably 0 or 1, and n1' is preferably 0 or 1.

The monomer from which the structural units represented by the formula (a1-1) are derived includes compounds mentioned in JP2010-204646A1.

As the monomer from which the structural unit represented by the formula (a1-1) is derived, preferred are compounds represented by formulae (a1-1-1), (a1-1-2), (a1-1-3), (a1-1-4), (a1-1-5), (a1-1-6), (a1-1-7) and (a1-1-8), more preferred are compounds represented by formulae (a1-1-1), (a1-1-2), (a1-1-3) and (a1-1-4).

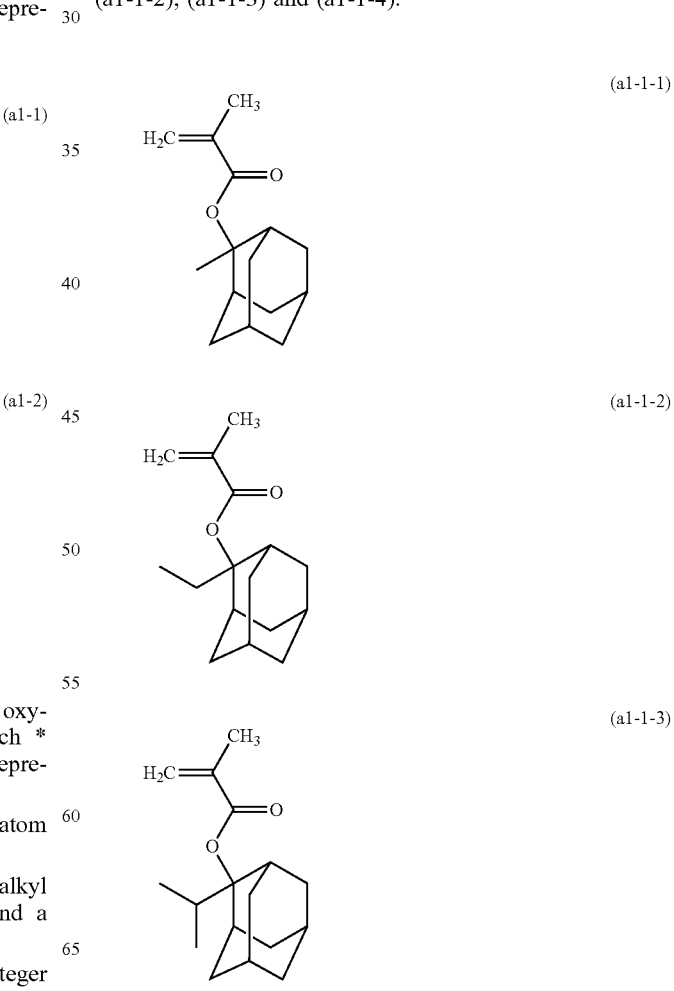

-continued

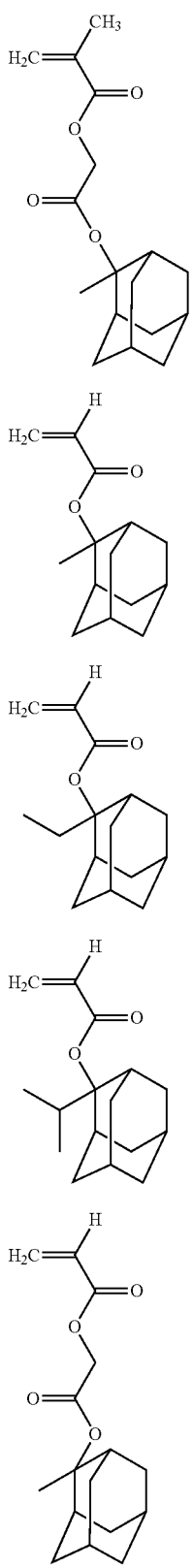

Examples of the monomer from which the structural units represented by the formula (a1-2) is derived include 1-ethyl-cyclopentant-1-yl(meth)acrylate, 1-ethyl-cyclohexan-1-yl (meth)acrylate, 1-ethyl-cyclohept-1-yl(meth)acrylate, 1-methyl-cyclopent-1-yl(meth)acrylate, 1-methyl-cyclohex-1-yl(meth)acrylate, 1-isopropyl-cyclopent-1-yl(meth)acrylate, and 1-isopropyl-cyclohex-1-yl(meth)acrylate.

As the monomer from which the structural unit represented by the formula (a1-2) is derived, preferred are those represented by formulae (a1-2-1) to (a1-2-12), more preferred are those represented by formulae (a1-2-3), (a1-2-4), (a1-2-9) and (a1-2-10), more preferred are those represented by formulae (a1-2-3) and (a1-2-9).

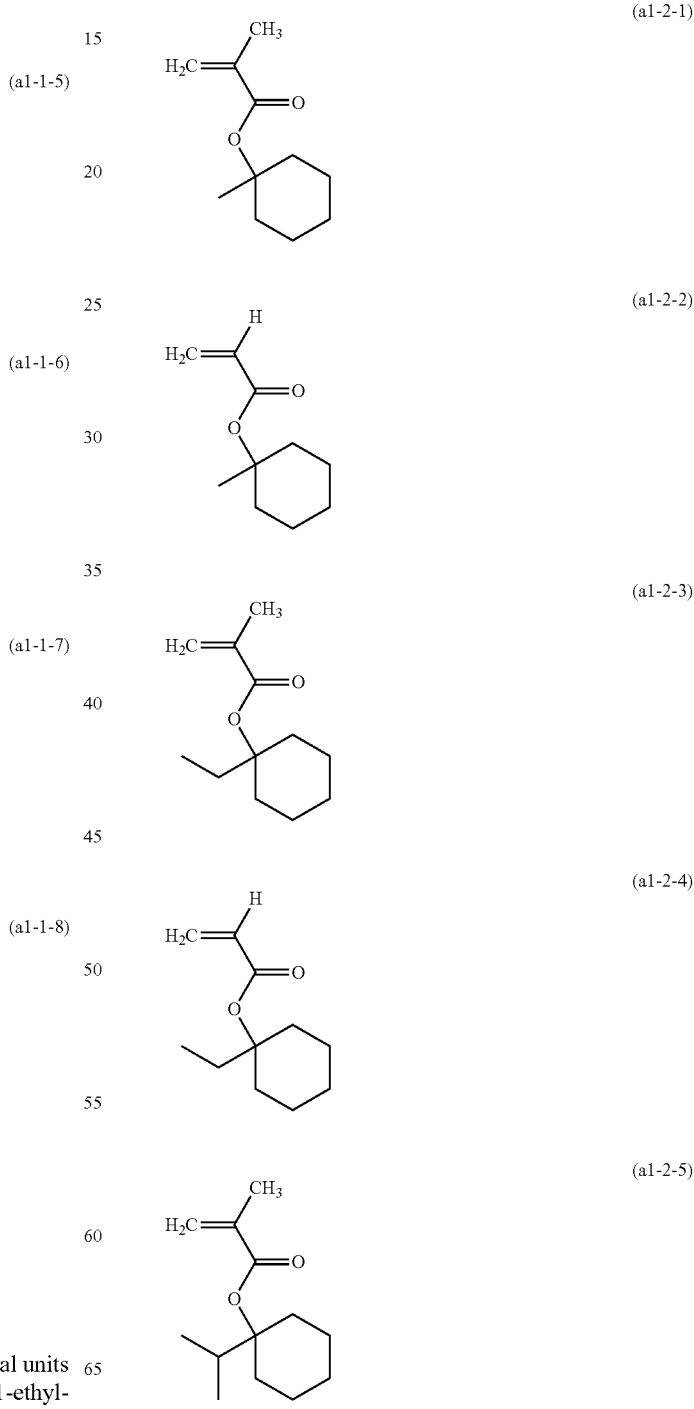

-continued (a1-2-6)
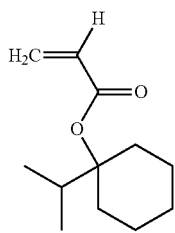

(a1-2-7)
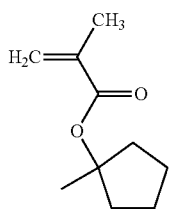

(a1-2-8)
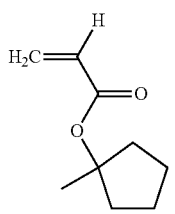

(a1-2-9)
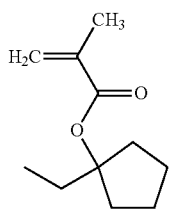

(a1-2-10)
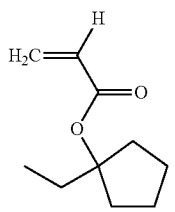

(a1-2-11)
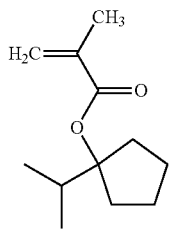

(a1-2-12)
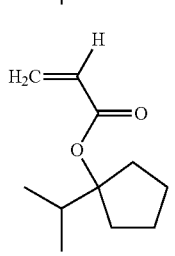

When the resin (A2) comprises at least one structural unit represented by formula (a1-1) or formula (a1-2), the content of the structural unit in the resin is usually 10 to 95% by mole, preferably 15 to 90% by mole, and more preferably 20 to 85% by mole based on all the structural units of the resin (A2).

Another example of the structural unit having an acid-labile group includes a structural unit represented by the formula (a-5).

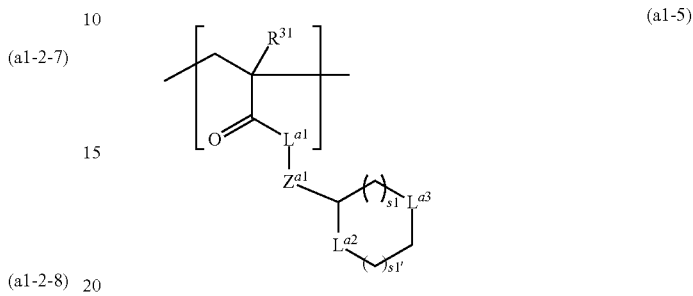

(a1-5)

wherein $R^{31}$ represents a hydrogen atom, a halogen atom, or a C1-C6 alkyl group having a halogen group, $Z^{a1}$ represents a single bond or *—O—$(CH_2)_{k4}$-$L^{a4}$-O— in which * represents a binding position to -$L^{a1}$-, and k4 represents an integer of 1 to 4, $L^{a1}$, $L^{a2}$, $L^{a3}$ and $L^{a4}$ each independently represent an oxygen atom or a sulfur atom, s1 represents an integer of 1 to 3 and s1' represents an integer of 0 to 3.

In the formula (a-5), $R^{31}$ represents preferably a hydrogen atom, a methyl group, or a trifluoromethyl group.

$L^{a1}$ preferably represents an oxygen atom.

It is preferred that one of $L^{a2}$ and $L^{a3}$ represents an oxygen atom and that the other represents a sulfur atom.

s1 preferably represents 1. s1' preferably represents an integer of 0 to 2.

$Z^{a1}$ preferably represents a single bond or —$CH_2$—CO—O—.

The monomer from which the structural unit represented by the formula (a-5) is derived includes the following ones:

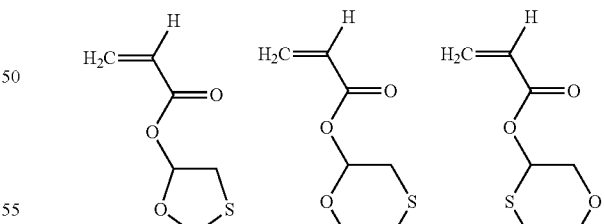

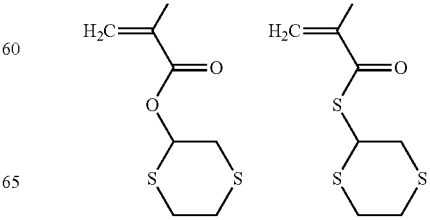

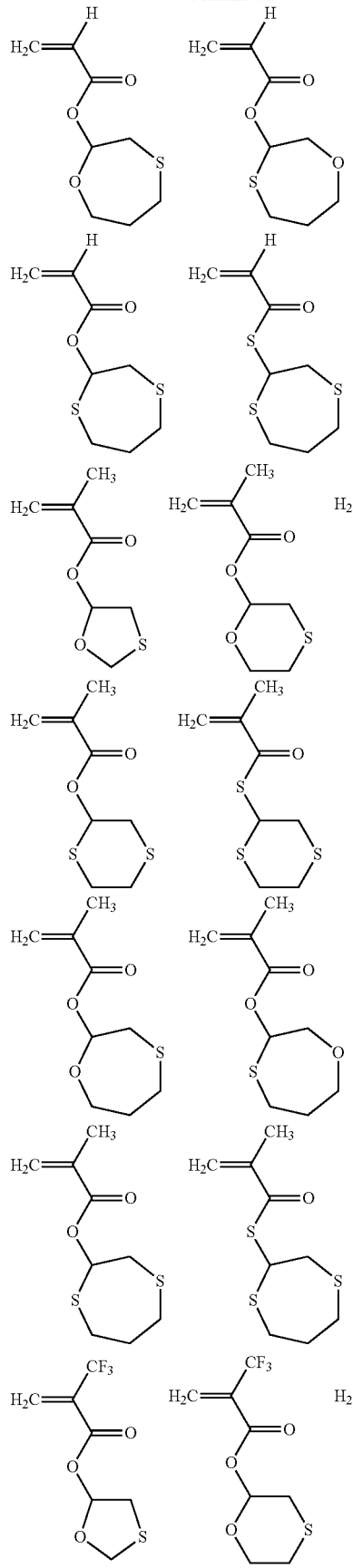
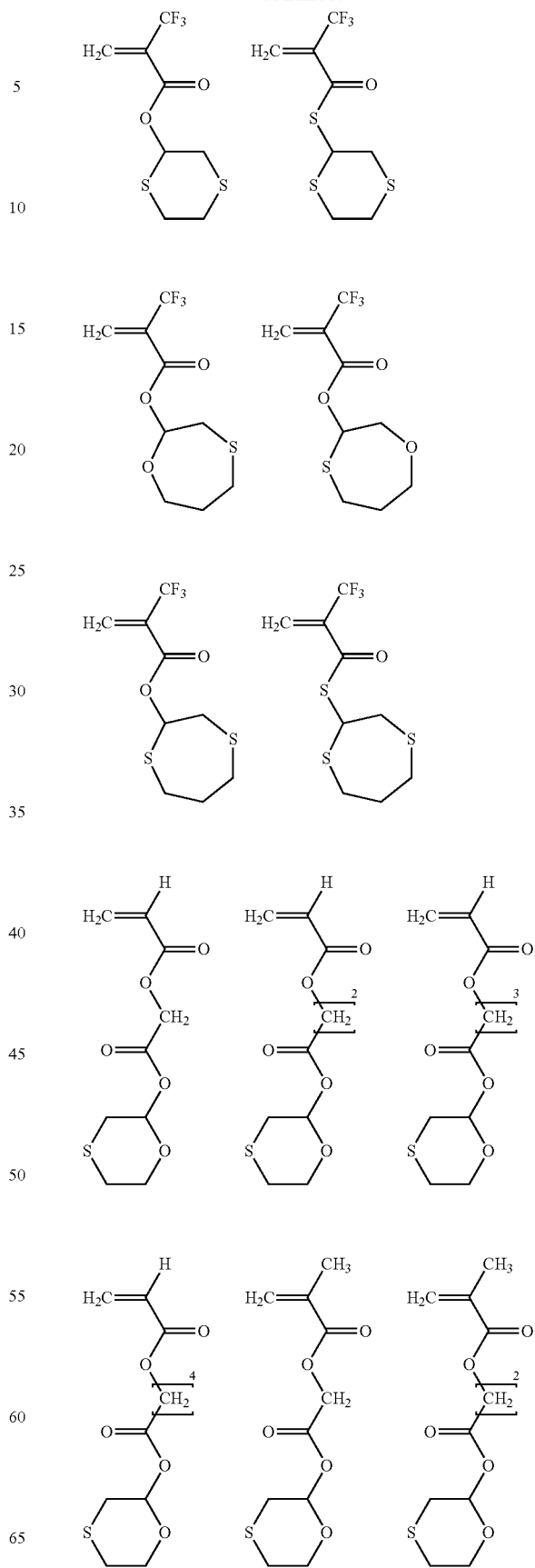

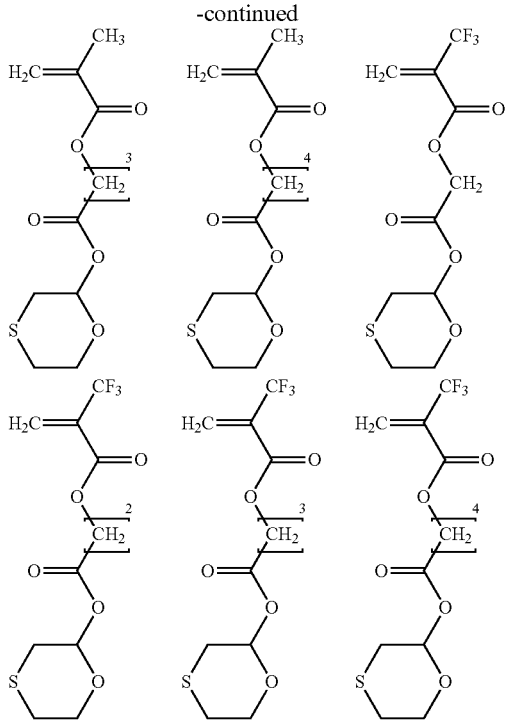

When the resin (A2) has a structural unit derived from the compound represented by the formula (a-5), the content of the structural unit is usually 1 to 50% by mole, preferably 3 to 45% by mole and more preferably 5 to 40% by mole based on all the structural units of the resin.

The content of the structural unit having an acid-labile group is usually 30 to 98% by mole, preferably 35 to 90% by mole and more preferably 40 to 80% by mole based on all the structural units of the resin (A2).

The resin (A2) may comprise a structural unit having no acid-labile group.

The structural unit having no acid-labile group preferably comprises a hydroxy group or a lactone ring. When the photoresist composition comprises such a structural unit, its resolution of photoresist pattern and its adhesiveness with a substrate can be improved. These structural units can be suitably selected depending on exposure source for producing photoresist pattern from the photoresist composition.

When KrF excimer laser (wavelength: 248 nm) lithography system, or a high energy laser such as electron beam and extreme ultraviolet is used as an exposure system, preferred is a resin which comprises the structural unit having no acid-labile group but having a phenolic-hydroxy group.

When ArF excimer laser (wavelength: 193 nm) is used as an exposure system, preferred is a resin which comprises the structural unit having no acid-labile group but having an alcoholic hydroxy group, and more preferred is a resin which comprises the structural unit represented by the following formula (a2-1).

The structural unit having no acid-labile group but having a hydroxy group, preferably has a hydroxyadamantyl group.

Preferred examples of the structural unit having no acid-labile group but having a hydroxy group include a structural unit represented by the formula (a2-1):

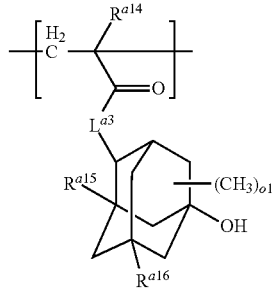

wherein $R^{a14}$ represents a hydrogen atom or a methyl group, $R^{a15}$ and $R^{a16}$ each independently represent a hydrogen atom, a methyl group or a hydroxy group, $L^{a1}$ represents an oxygen atom or *—O—$(CH_2)_{k2}$—CO—O— in which * represents a binding position to —CO—, and k2 represents an integer of 1 to 7, and o1 represents an integer of 0 to 10.

In the formula (a2-1), $L^{a3}$ is preferably an oxygen atom or *—O—$(CH_2)_{f2}$—CO—O— in which * represents a binding position to —CO—, and f2 represents an integer of 1 to 4, is more preferably an oxygen atom and *—O—$CH_2$—CO—O—, and is still more preferably an oxygen atom.

$R^{a14}$ is preferably a methyl group.

$R^{a15}$ is preferably a hydrogen atom.

$R^{a16}$ is preferably a hydrogen atom or a hydroxy group.

o1 is preferably 0, 1, 2 or 3 and is more preferably 0 or 1.

The monomer from which the structural unit represented by the formula (a2-1) is derived includes those mentioned in JP2010-204646A1, preferably those represented by formulae (a2-1-1), (a2-1-2), (a2-1-3), (a2-1-4), (a2-1-5) and (a2-1-6), and more preferably those represented by formulae (a2-1-1), (a2-1-2), (a2-1-3) and (a2-1-4), still more preferably those represented by formulae (a2-1-1) and (a2-1-3).

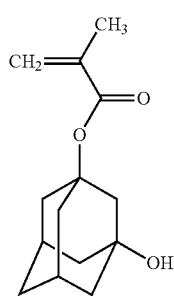

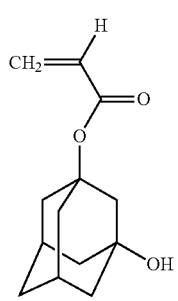

-continued

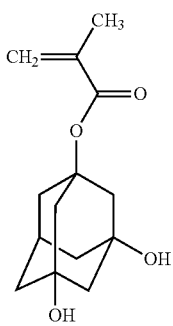
(a2-1-3)

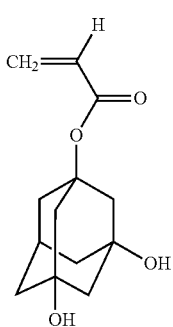
(a2-1-4)

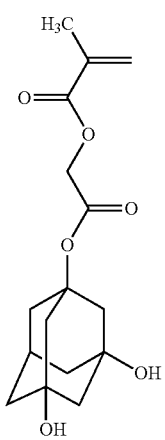
(a2-1-5)

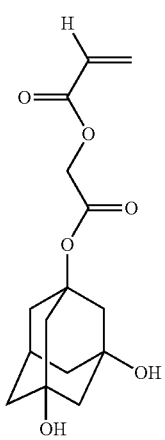
(a2-1-6)

When the resin (A2) comprises the structural unit represented by the formula (a2-1), the content of the structural unit represented by the formula (a2-1) is usually 1 to 45% by mole and preferably 1 to 40% by mole, more preferably 1 to 35% by mole, still more preferably 2 to 20% by mole, based on total molar of all the structural units of the resin.

As to the structural unit having no acid-labile group but having a lactone ring, examples of the lactone ring include a monocyclic lactone ring such as β-propiolactone ring, γ-butyrolactone ring and δ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of the structural unit having no acid-labile group but having a lactone ring include those represented by the formulae (a3-1), (a3-2) and (a3-3):

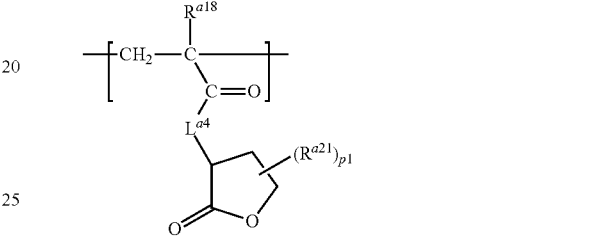
(a3-1)

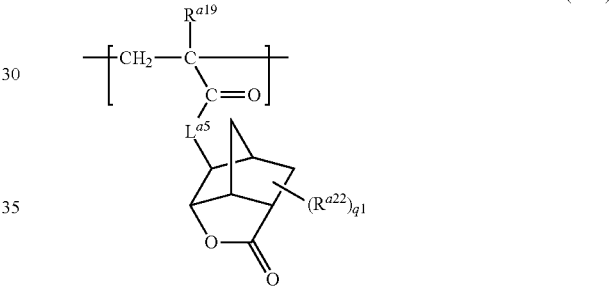
(a3-2)

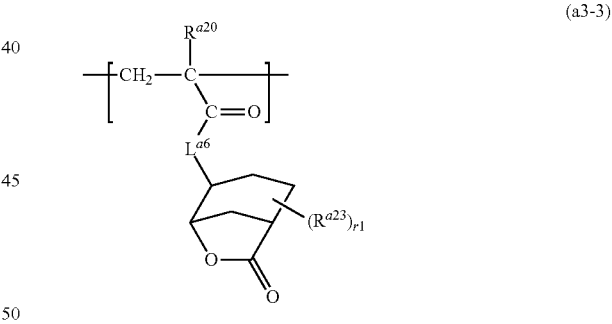
(a3-3)

wherein $L^{a4}$, $L^{a5}$ and $L^{a6}$ each independently represent *—O— or *—O—$(CH_2)_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 aliphatic hydrocarbon group, $R^{a22}$ and $R^{a23}$ are independently in each occurrence a carboxyl group, a cyano group or a C1-C4 aliphatic hydrocarbon group, and p1 represents an integer of 0 to 5, q1 and r1 independently each independently represent an integer of 0 to 3.

It is preferred that $L^{a4}$, $L^{a5}$ and $L^{a6}$ each independently represent —O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are —O— and *—O—CH$_2$—CO—O—, and it is still more preferred that $L^{a4}$, $L^{a5}$ and $L^{a6}$ are —O—.

$R^{a18}$, $R^{a19}$, $R^{a20}$ and $R^{a21}$ are preferably methyl groups.

It is preferred that $R^{a22}$ and $R^{a23}$ are independently in each occurrence a carboxyl group, a cyano group or a methyl group.

It is preferred that p1, q1 and r1 are an integer of 0 to 2, and it is more preferred that p1, q1 and r1 are 0 or 1.

Monomers from which the structural units having no acid-labile group but having a lactone ring are derived are mentioned in JP2010-204646A1. Examples of monomers from which the structural unit having no acid-labile group but having a lactone ring include preferably those represented by the formulae (a3-1-1), (a3-1-2), (a3-1-3) and (a3-1-4), the formulae (a3-2-1), (a3-2-2), (a3-2-3) and (a3-2-4), and the formulae (a3-3-1), (a3-3-2), (a3-3-3) and (a3-3-4), and more preferably those represented by the formulae (a3-1-1) and (a3-1-2), and the formulae (a3-2-3) and (a3-2-4), still more preferably those represented by the formulae (a3-1-1) and (a3-2-3).

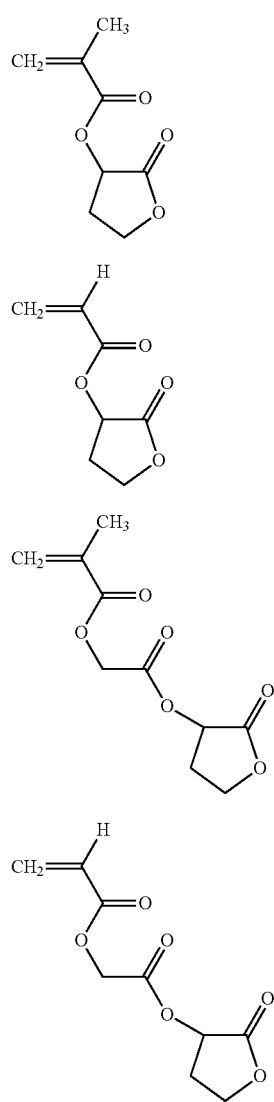

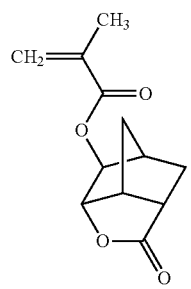

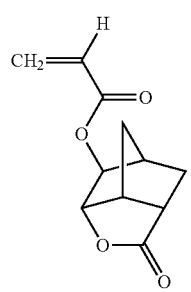

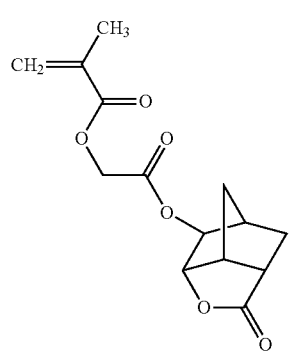

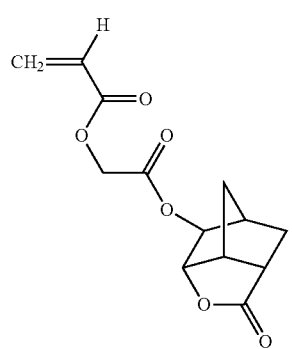

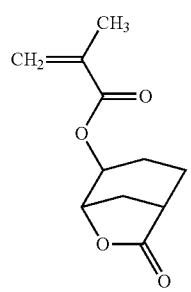

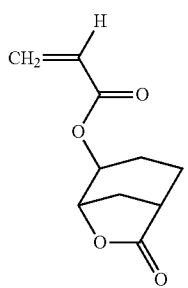
(a3-3-2)

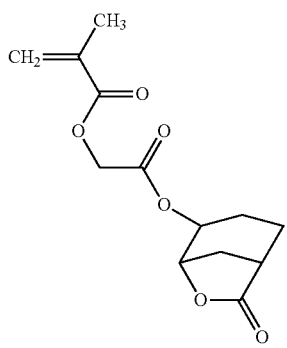
(a3-3-3)

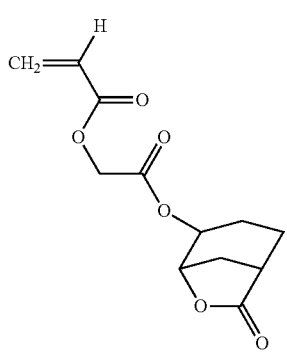
(a3-3-4)

The content of the structural unit having no acid-labile group but having a lactone ring is usually 5 to 70% by mole and preferably 10 to 65% by mole, more preferably 10 to 60% by mole, based on the total molar of the structural units in the resin (A2).

The resin (A2) preferably comprises a structural unit having an acid-labile group and a structural unit having no acid-labile group.

In the resin (A2), the structural unit having an acid-labile group is preferably those represented by formulae (a1-1) and (a1-2), more preferably those represented by formula (a1-1). The structural unit having no acid-labile group is preferably those having a hydroxyl group or a lactone ring. For the resin (A2), the structural unit having no acid-labile group but having a hydroxyl group is preferably those represented by formula (a2-1). For the resin (A2), the structural unit having no acid-labile group but having a lactone ring is preferably those represented by formulae (a3-1) and (a3-2).

When the resin (A2) comprises a structural unit derived from a monomer having an adamantyl group, preferably the structural unit represented by formula (a1-1), the content of the structural unit is preferably 15% or more by mole based on 100% by mole of all of the structural units having an acid-labile group. When the photoresist composition comprises adamantane ring-containing structural units in larger amount, the photoresist pattern obtained therefrom can have more improved resistance to dry-etching.

The resin (A2) can be produced by polymerizing monomers from which a structural unit having an acid-labile group is derived optionally with a compound from which a structural unit having no acid-labile group is derived, except for the compounds represented by formulae (I') and (a4'), in a manner of radical polymerization or a known polymerization method.

The weight-average molecular weight of the resin (A2) is usually 2,500 or more, preferably 3,000 or more, more preferably 4,000 or more, and usually 50,000 or less, preferably 30,000 or less, more preferably 15,000 or less.

The photoresist composition of the present invention comprises the resin (A1) and the resin (A2) in an amount of from usually 0.01:10 to 5:10, preferably from 0.05:10 to 3:10, more preferably from 0.1:10 to 2:10, and still more preferably from 0.2:10 to 1:10, represented by [the content of resin (A1)]:[the content of resin (A2)] basis on weight.

The photoresist composition of the present invention may further comprise another resin than the resins (A1) and (A2). Such another resin comprises another structural unit having no acid-labile groups than the structural units represented by formulae (I) and (a4).

When the photoresist composition comprises such another resin, its content is generally 1 to 50% by weight, preferably 0.5 to 30% by weight, and more preferably 1 to 20% by weight of the total amount of the resins.

The photoresist composition of the present invention usually contains 80% by weight or more of the resins in total, based on sum of solid component. The photoresist composition of the present invention usually comprises 99.9% by mass or less of the resins in total, based on sum of solid component. In this specification, "solid component" means components other than solvent in the photoresist composition.

The content can be measured with a known analysis equipment such as gas or liquid chromatography.

The photoresist composition comprises an acid generator.

The acid generator is a compound which can be decomposed by light or radiation to generate an acid. The acid generators may be either ionic or non-ionic one. The acid generator can be used singly or in combination of two or more of them.

The non-ionic acid generator includes organic halide, sulfonate esters (e.g., 2-nitrobenzylester, aromatic sulfonate, oxime sulfonate, N-sulfonyloxyimide, N-sulfonyloxyimide, sulfonyl oxyketone, diazonaphthoquinone 4-sulfonate) and sulfone (e.g., disulfone, ketosulfone, sulfonyldiazomethane). The ionic acid generator includes an onium salt comprising an onium cation (e.g., a diazonium salt, a phosphonium salt, a sulfonium salt, an iodonium salt). Anions of the onium salts include a sulfonic acid anion, a sulfonylimide anion and a sulfonylmethide anion.

The acid generator includes compounds which generate an acid upon radiation, which are described in JP63-26653A1, JP55-164824A1, JP62-69263A1, JP63-146038A1, JP63-163452A1, JP 62-153853A1, JP63-146029A1, U.S. Pat. Nos. 3,779,778, 3,849,137, German patent No. 3914407 and European patent No. 126712.

The acid generator is preferably a fluorine-containing acid generator, more preferably a salt represented by formula (B1):

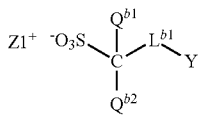
(B1)

wherein $Q^{b1}$ and $Q^{b2}$ each independently represent a fluorine atom or a C1-C6 perfluoroalkyl group, $L^{b1}$ represents a single bond or a C1-C24, preferably C1-C17, divalent saturated hydrocarbon group where a methylene group can be replaced by an oxygen atom or a carbonyl group and where a hydrogen atom can be replaced by an fluorine atom or a hydroxy group, Y represents a hydrogen atom, a fluorine atom or a C3-C18 alicyclic hydrocarbon group where a methylene group can be replaced by an oxygen atom, a sulfonyl group or a carbonyl group and where a hydrogen atom can be replaced by a substituent, and $Z1^+$ represents an organic cation.

Examples of the perfluoroalkyl group represented by $Q^{b1}$ and $Q^{b2}$ include a trifluoromethyl group, a pentafluoroethyl group, a heptafluoropropyl group, a nonafluorobutyl group, an undecafluoropentyl group and a tridecafluorohexyl group. It is preferred that $Q^{b1}$ and $Q^{b2}$ each independently represent a fluorine atom or a trifluoromethyl group, and it is more preferred that $Q^{b1}$ and $Q^{b2}$ are fluorine atoms.

Examples of the divalent saturated hydrocarbon group represented by $L^{b1}$ include linear alkanediyl groups, branched chain alkanediyl groups, a monocyclic divalent alicyclic hydrocarbon group, a polycyclic divalent alicyclic hydrocarbon group and combinations of them.

Specific examples of them include linear alkanediyl groups such as a methylene group, an ethylene group, a propane-1,3-diyl group, a propane-1,2-diyl group, a butane-1,4-diyl group, a butane-1,3-diyl group, a pentane-1,5-diyl group, a hexane-1,6-diyl group, a heptane-1,7-diyl group, an octane-1,8-diyl group, a nonane-1,9-diyl group, a decane-1,10-diyl group, an ethane-1,1-diyl group, a propane-1,1-diyl group; branched chain alkanediyl groups including a group formed by attaching a side chain to a linear alkanediyl group, such as a butan-1,3-diyl group, a 2-methylpropane-1,3-diyl group, a 2-methylpropane-1,2-diyl group, a pentane-1,4-diyl group, and a 2-methylbutane-1,4-diyl group;

a monocyclic divalent alicyclic hydrocarbon group such as a cyclobutan-1,3-diyl group, cyclopentane-1,3-diyl group, a cyclohexane-1,2-diyl group, a 1-methylcyclohexane-1,2-diyl group, cyclohexane-1,4-diyl group, cyclooctane-1,2-diyl group, and a cyclooctane-1,5-diyl group; and a polycyclic divalent alicyclic hydrocarbon group such as a norbornane-2,3-diyl group, norbornane-1,4-diyl group, a norbornane-2,5-diyl group, an amadantane-1,2-diyl group, an amadantane-1,5-diyl group and an amadantane-1,6-diyl group.

When $L^{b1}$ represents a divalent saturated hydrocarbon group in which a methylene group has been replaced by an oxygen atom or a carbonyl group, examples of $L^{b1}$ include the moiety represented by any one of formulae (b1-1) to (b1-7) as follow;

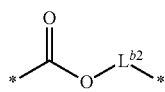
(b1-1)

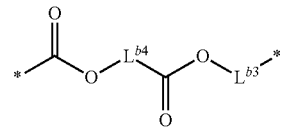
(b1-2)

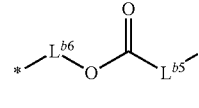
(b1-3)

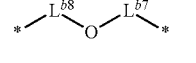
(b1-4)

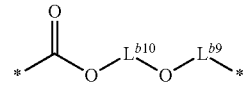
(b1-5)

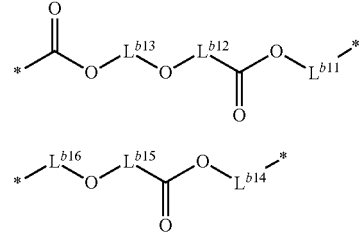
(b1-6)

(b1-7)

wherein $L^{b2}$ represents a single bond or a C1-C15 divalent saturated hydrocarbon group, $L^{b3}$ represents a single bond or a C1-C12 divalent saturated hydrocarbon group, $L^{b4}$ represents a C1-C13 divalent saturated hydrocarbon group provided that the total number of the carbon atoms in $L^{b3}$ and $L^{b4}$ is up to 13, $L^{b5}$ represents a single bond or a C1-C14 divalent saturated hydrocarbon group, $L^{b6}$ represents a C1-C15 divalent saturated hydrocarbon group provided that the total number of the carbon atoms in $L^{b5}$ and $L^{b6}$ is up to 15, $L^{b7}$ represents a single bond or a C1-C15 divalent saturated hydrocarbon group, $L^{b8}$ represents a C1-C15 divalent saturated hydrocarbon group with the proviso that total carbon number of $L^{b7}$ and $L^{b8}$ is up to 16, $L^{b9}$ represents a single bond or a C1-C13 divalent saturated hydrocarbon group, $L^{b10}$ represents a C1-C14 divalent saturated hydrocarbon group, with the proviso that total carbon number of $L^{b9}$ and $L^{b10}$ is up to 14, $L^{b11}$ and $L^{b12}$ each independently represent a single bond or a C1-C11 divalent saturated hydrocarbon group, and $L^{b13}$ represents C1-C12 divalent saturated hydrocarbon group, with the proviso that total carbon number of $L^{b11}$, $L^{b12}$ and $L^{b13}$ is up to 12, $L^{b14}$ and $L^{b15}$ each independently represent a single bond or a C1-C13 divalent saturated hydrocarbon group, and $L^{b16}$ represents C1-C14 divalent saturated hydrocarbon group, with the proviso that total carbon number of $L^{b14}$, $L^{b15}$ and $L^{b16}$ is up to 14,

* represents a binding position, * of the left side represents a binding position to —C($Q^1$)($Q^2$)-, and * of the right side represents a binding position to —(C=O)—.

$L^{b1}$ is preferably a moiety represented by anyone of formulae (b1-1) to (b1-4), more preferably a moiety represented by any formula (b1-1) or (b1-2), still more preferably a moiety represented by formula (b1-1). Among the moiety represented by formula (b1-1), preferred are those in which $L^{b2}$ represents a single bond or a methylene group, and more preferred are one in which $L^{b2}$ represents a single bond, i.e., *—CO—O— where * represents a binding position to —C(Q$^1$)(Q$^2$)-.

Examples of the moiety represented by formula (b1-1) include one represented as follows.

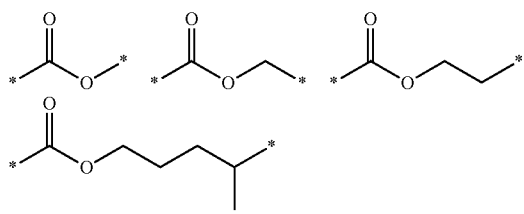

Examples of the moiety represented by formula (b1-2) include one represented as follows.

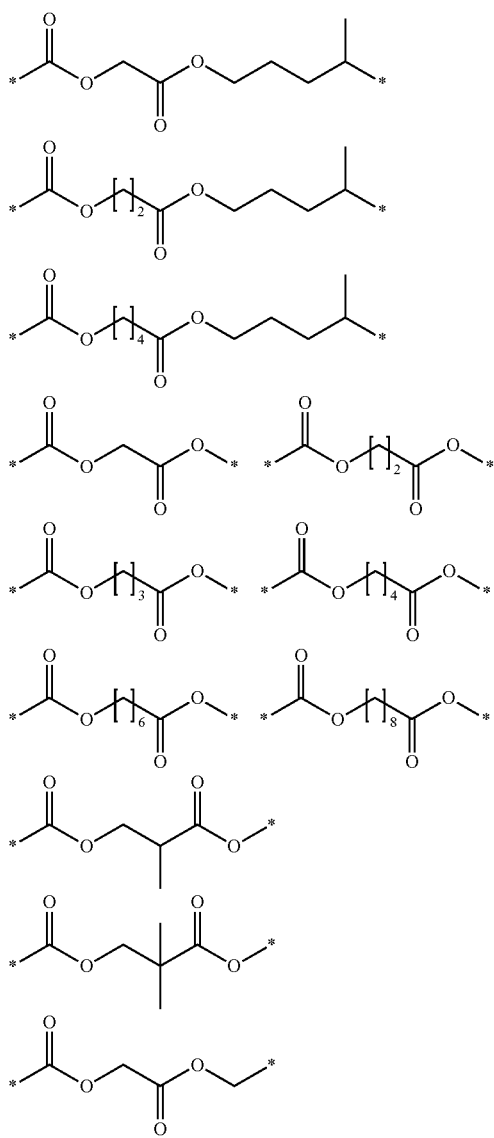

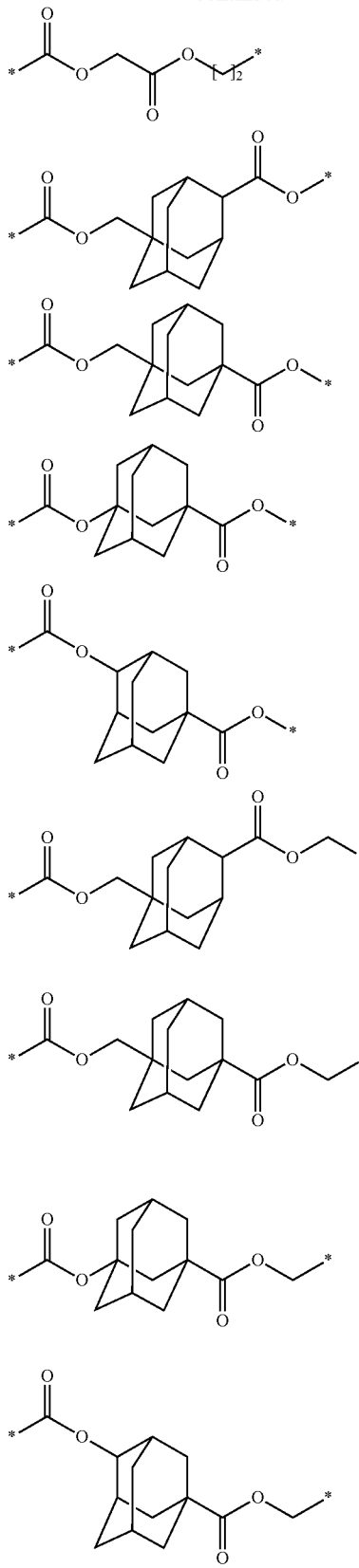

Examples of the moiety represented by formula (b1-3) include one represented as follows.

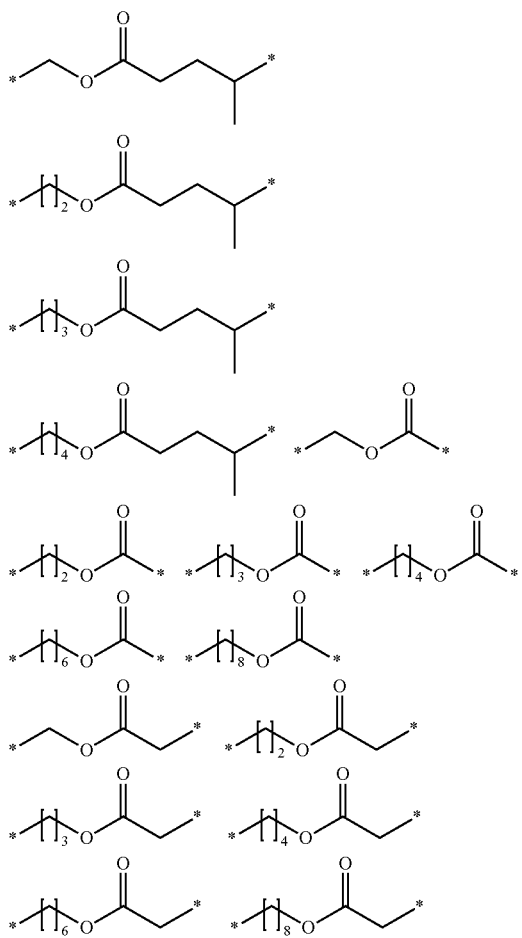
Examples of the moiety represented by formula (b1-4) include one represented as follows.
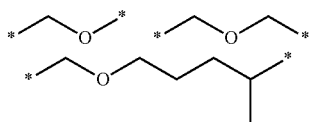
Examples of the moiety represented by formula (b1-5) include one represented as follows.
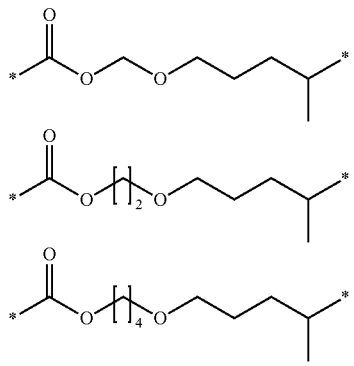
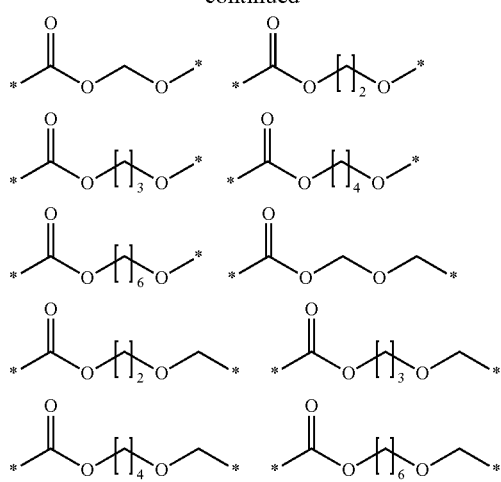
Examples of the moiety represented by formula (b1-6) include one represented as follows.
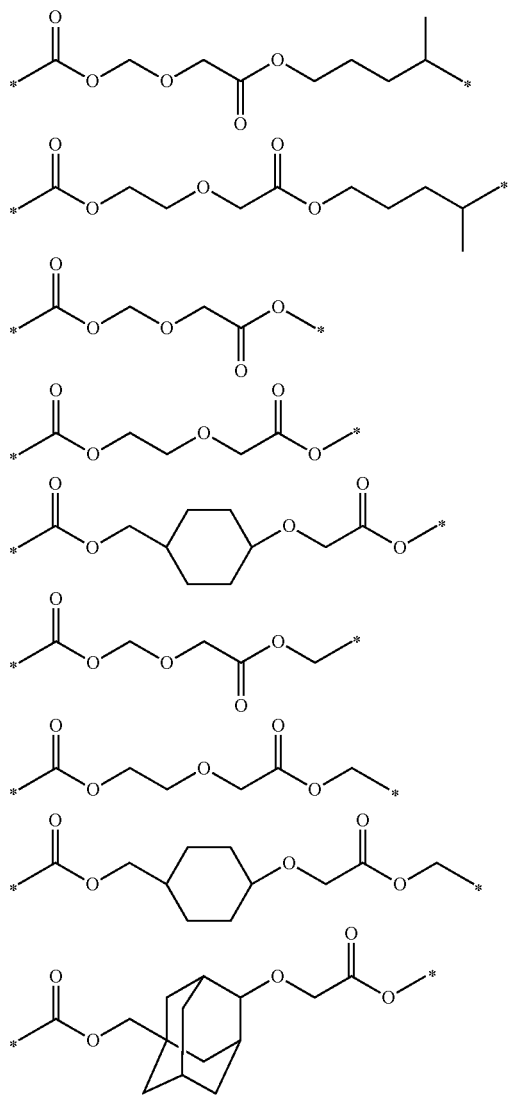

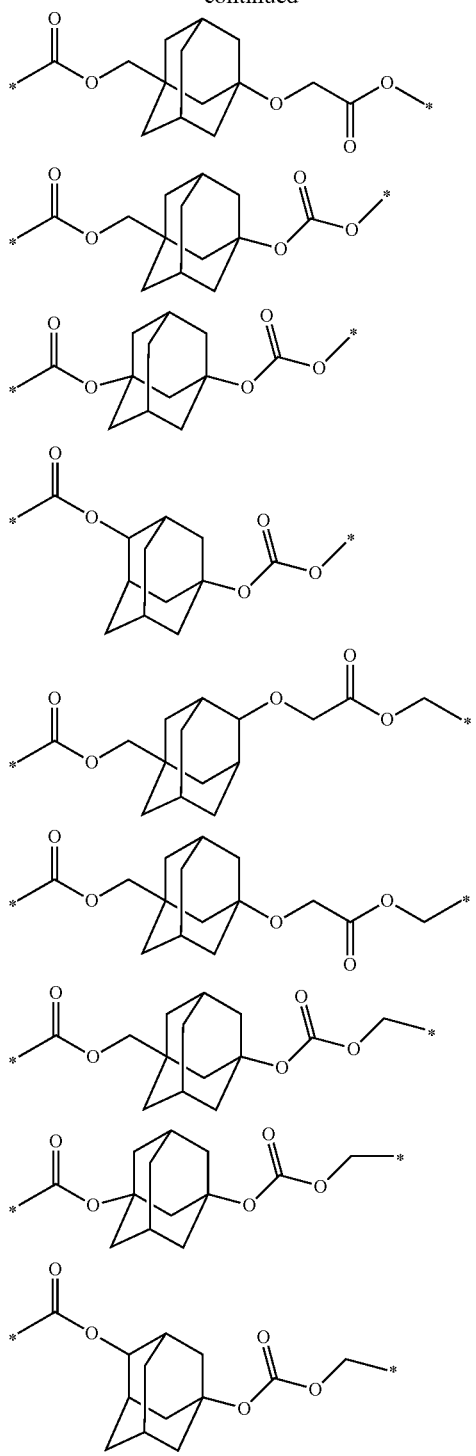
Examples of the moiety represented by formula (b1-7) include one represented as follows.
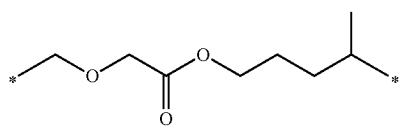
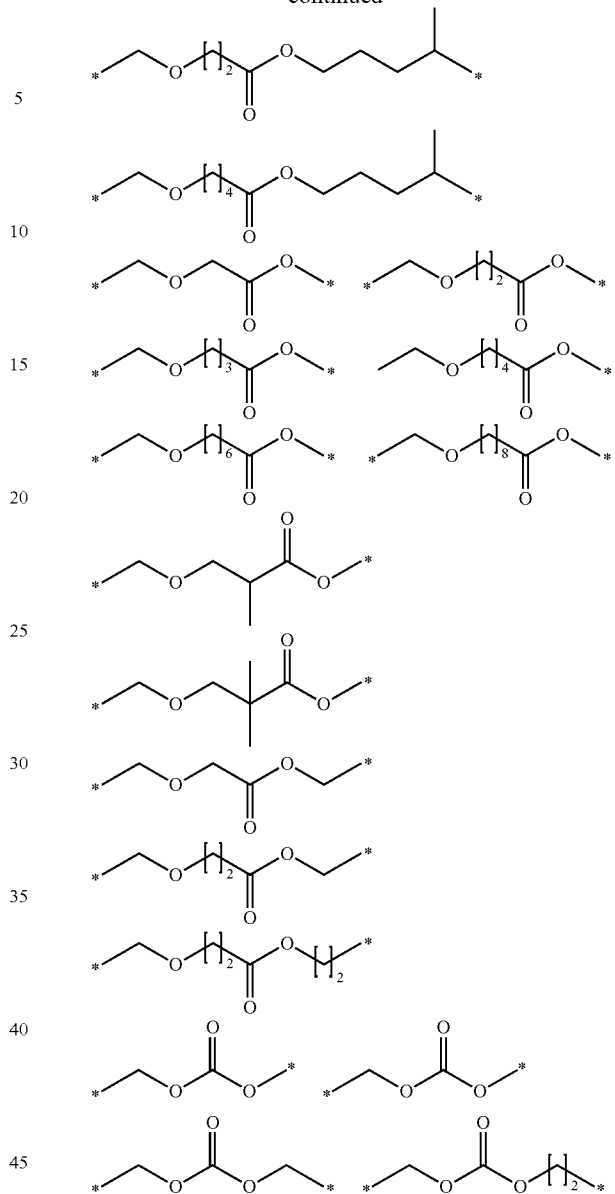
When $L^{b1}$ represents a divalent saturated hydrocarbon group where a hydrogen atom can be replaced by an fluorine atom or a hydroxy group, examples of $L^{b1}$ include one represented as follows.
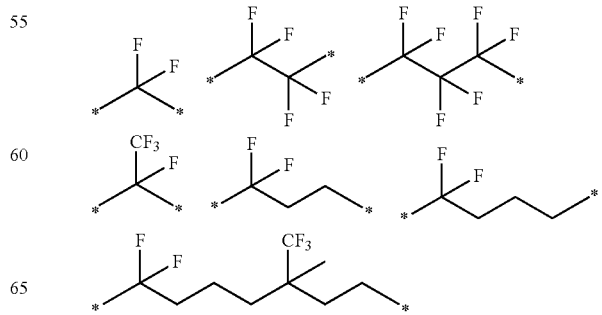

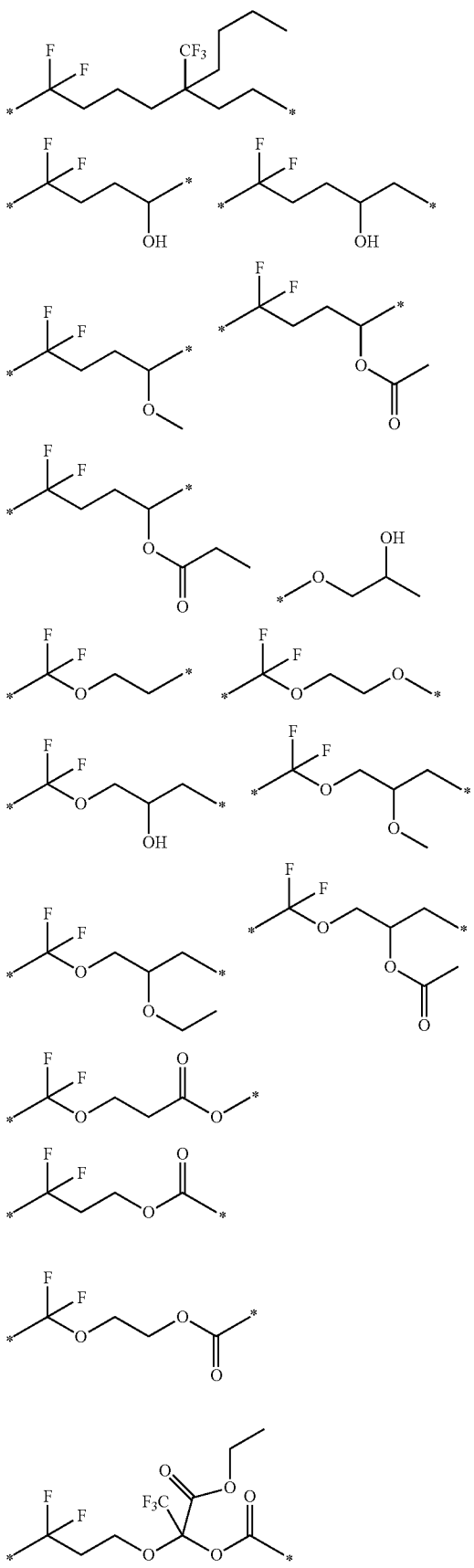
Examples of the alicyclic hydrocarbon group represented by Y include those represented by formulae (Y1) to (Y11).
Examples of the alicyclic hydrocarbon group represented by Y, in which a methylene group can be replaced by an oxygen atom, a sulfonyl group or a carbonyl group, further include those represented by formulae (Y12) to (Y26).
 (Y1)
(Y2)
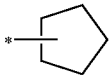 (Y3)
(Y4)
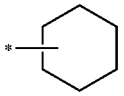 (Y5)
(Y6)
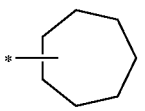 (Y7)
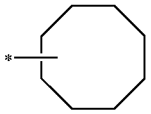
(Y8)
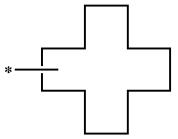
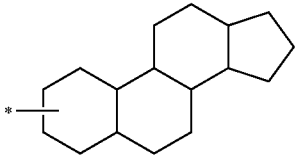 (Y9)
(Y10)

(Y11) 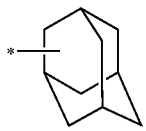

(Y12) 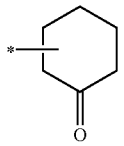

(Y13) 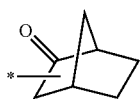

(Y14) 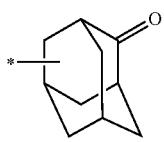

(Y15) 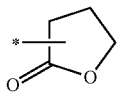

(Y16) 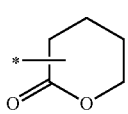

(Y17) 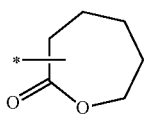

(Y18) 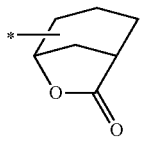

(Y19) 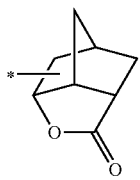

(Y20) 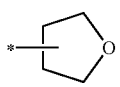

(Y21) 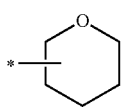

(Y22) 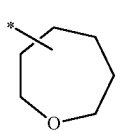

(Y23) 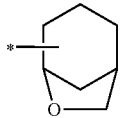

(Y24) 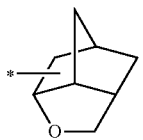

(Y25)

(Y26)

Among them, preferred are those represented by formulae (Y1) to (Y19), more preferred are those represented by formulae (Y11), (Y14), (Y15) and (Y19), and still more preferred are those represented by formulae (Y11) and (Y14).

Examples of the substituents for the alicyclic hydrocarbon group represented by Y include a halogen atom, a hydroxy group, an oxo group, a C1-C12 alkyl group, a C1-C12 hydroxy-containing alkyl group, a C3-C16 alicyclic hydrocarbon group, a C1-C12 alkoxy group, a C6-C18 aromatic hydrocarbon group optionally substituted with a C1-C4 alkyl group, a C7-C21 aralkyl group, a C2-C4 acyl group, a glycidyloxy group, or $-(CH_2)_{j2}-O-CO-R_{b1}$ group where $R_{b1}$ represents a C1-C16 alkyl group, a C3-C16 alicyclic hydrocarbon group, or a C6-C18 aromatic hydrocarbon group optionally substituted with a C1-C4 alkyl group. The symbol j2 represents an integer of 0 to 4.

Examples of the halogen atom include a fluorine atom, a chlorine atom, a bromine atom and an iodine atom.

Examples of the hydroxyl-containing alkyl group include a hydroxymethyl group and a hydroxyethyl group.

Examples of alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of an aromatic hydrocarbon group include aryl groups such as aphenyl group, anaphthyl group, anantolyl group, a p-methylphenyl group, p-tert-butylphenyl group, p-adamantylphenyl group, a tolyl group, a xylyl group, a cumenyl group, a mesityl group, a biphenyl group, a phenanthryl group, a 2,6-diethylphenyl group, 2-methyl-6-ethylphenyl group.

Examples of an aralkyl group include a benzyl group, a phenethyl group, a phenylpropyl group, a naphthylmethyl group and a naphthylethyl group.

Examples of an acyl group include an acetyl group, a propionyl group and a butyryl group.

Examples of the group represented by Y include the following ones.

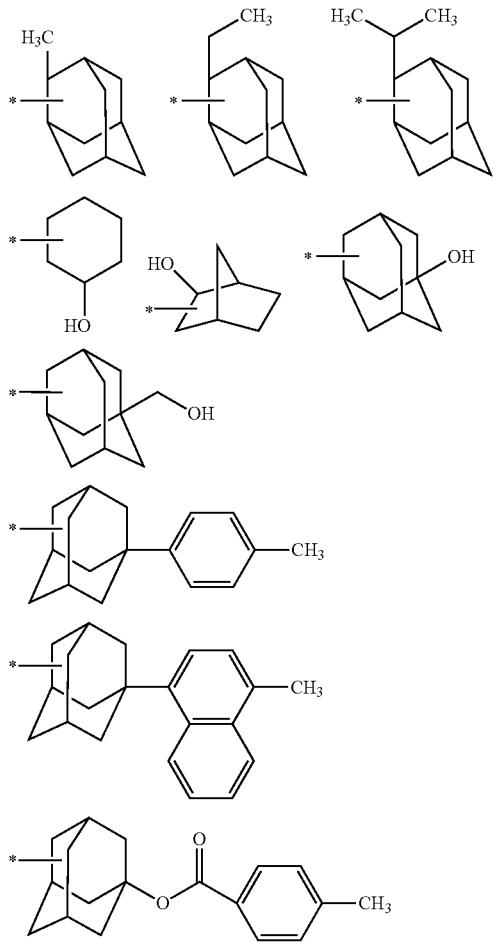

Y is preferably a C3-C18 alicyclic hydrocarbon group which can have a substituent, more preferably an adamantyl group which can have a substituent such as oxo group or a hydroxyl group, more preferably an adamantyl group, a hydroxyadamantyl group, or an oxoadamantyl group.

The sulfonic acid anion of the salt (B1) includes an anion represented by formulae (b1-1-1) to (b1-1-9):

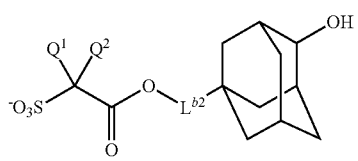
(b1-1-1)

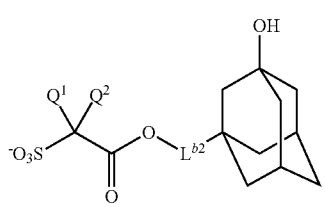
(b1-1-2)

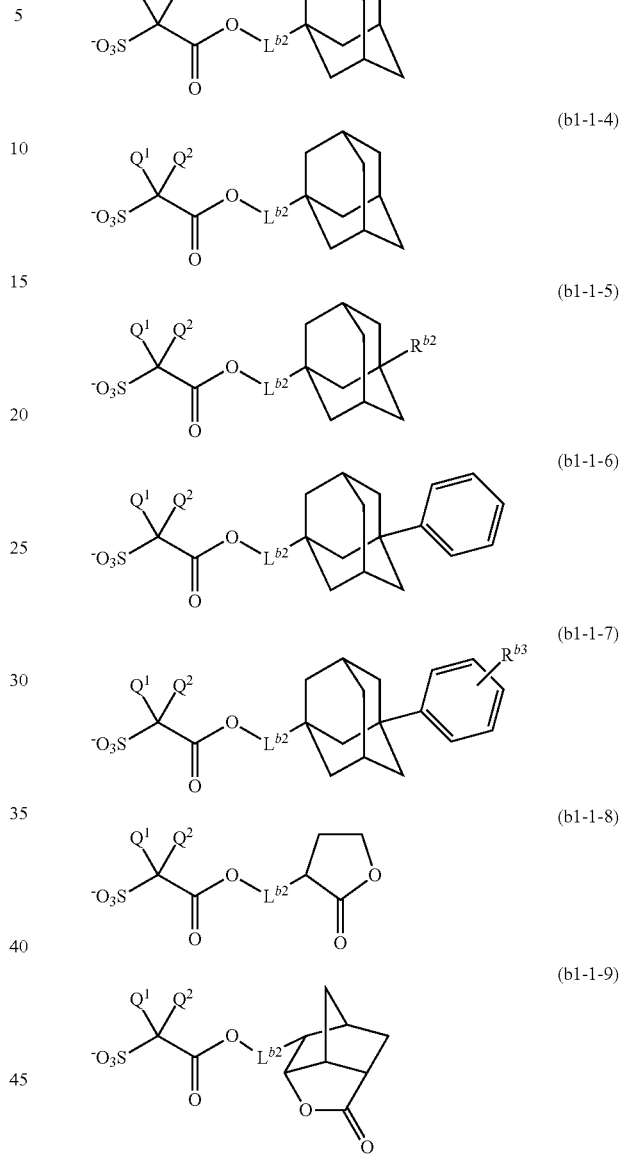

in each formula, $Q^1$, $Q^2$ and $L^{b2}$ are as defined above, and $R^{b2}$ and $R^{b3}$ independently each represent a C1-C4 alkyl group, preferably a methyl group.

Specific examples of the anion for the acid generator represented by formula (B1) include JP2010-204646A1.

Examples of the organic cation represented by $Z^+$ include an organic onium cation such as an organic sulfonium cation, an organic iodonium cation, an organic ammonium cation, a benzothiazolium cation and an organic phosphonium cation, and an organic sulfonium cation and an organic iodonium cation are preferable, and an arylsulfonium cation is more preferable. Herein, the arylsulfonium includes those having one, two or three aryl groups.

Preferable examples of the organic cation represented by $Z^+$ include the organic cations represented by the formulae (b2-1) to (b2-4):

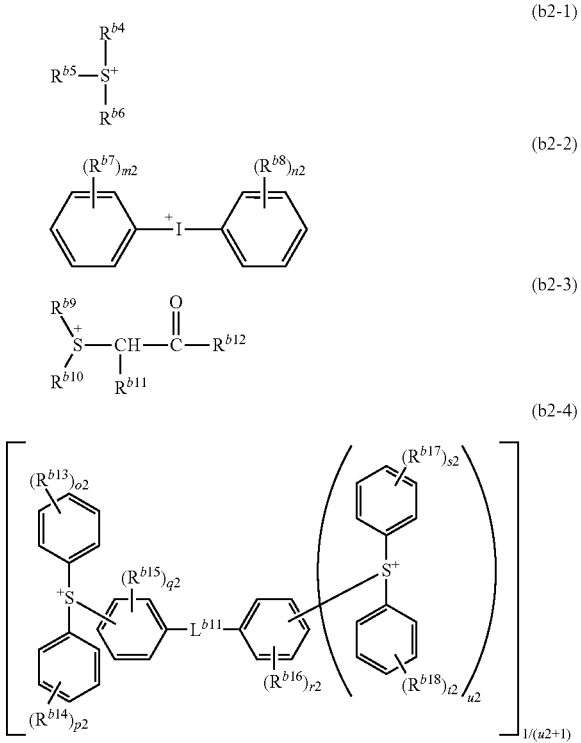

(b2-1)

(b2-2)

(b2-3)

(b2-4)

wherein $R^{b4}$, $R^{b5}$ and $R^{b6}$ independently represent a C1-C30 aliphatic hydrocarbon group in which a hydrogen atom can be replaced by a hydroxy group, a C1-C12 alkoxy-group or a C6-C18 alicyclic hydrocarbon group, a C3-C36, preferably C3-C18, alicyclic hydrocarbon group in which a hydrogen atom can be replaced by a halogen atom, a C2-C4 acyl group or a glycidyloxy group, and a C6-C36, preferably C6-C24, aromatic hydrocarbon group in which a hydrogen atom can be replaced by a halogen atom, a hydroxy group, or C1-C12 alkoxy group; and $R^{b4}$ and $R^{b5}$, $R^{b4}$ and $R^{b6}$, or $R^{b5}$ and $R^{b6}$ can be bonded each other to form a ring containing $S^+$;

$R^{b7}$ and $R^{b8}$ are independently in each occurrence a hydroxy group, a C1-C12 alkyl group or a C1-C12 alkoxy group;

m2 and n2 independently represents an integer of 0 to 5;

$R^{b9}$ and $R^{b10}$ independently represent a C1-C30, preferably C1-C18 aliphatic hydrocarbon group or a C3-C36, preferably C3-C18 alicyclic hydrocarbon group, or $R^{b9}$ and $R^{b10}$ are bonded each other to form a C1-C10 divalent acyclic hydrocarbon group which forms a 3- to 12-membered ring, preferably 3- to 7-membered ring together with the adjacent —$S^+$—, and one or more —$CH_2$— in the divalent acyclic hydrocarbon group may be replaced by an oxygen atom, sulfur atom or carbonyl group; and $R^{b11}$ represents a hydrogen atom, a C1-C30, preferably C1-C18, aliphatic hydrocarbon group, a C3-C36, preferably C3-C18 alicyclic hydrocarbon group, or a C6-C36, preferably C6-C18 aromatic hydrocarbon group, and $R^{b12}$ represents a C1-C30, preferably C1-C12 aliphatic hydrocarbon group where a hydrogen atom can be replaced by a C6-C18 aromatic hydrocarbon group, a C3-C30, preferably C3-C18 alicyclic hydrocarbon group, and a C6-C30, preferably C6-C18 aromatic hydrocarbon group optionally substituted with C1-C12 alkoxy group or C1-C12 alkylcarbonyloxy group;

or $R^{b11}$ and $R^{b12}$ are bonded each other to form a C1-C10 divalent acyclic hydrocarbon group which forms a 2-oxo-cycloalkyl group together with the adjacent —CHCO—, and one or more —$CH_2$— in the divalent acyclic hydrocarbon group may be replaced by an oxygen atom, sulfur atom or carbonyl group; and $R^{b13}$, $R^{b14}$, $R^{b15}$, $R^{b16}$, $R^{b17}$ and $R^{b18}$ independently represent a hydroxy group, a C1-C12 alkyl group or a C1-C12 alkoxy group;

$L^{b11}$ represents —S— or —O—; and o2, p2, s2 and t2 each independently represents an integer of 0 to 5;

q2 and r2 each independently represents an integer of 0 to 4; and u2 represents 0 or 1.

Examples of the aliphatic hydrocarbon group represented by each substituent include an alkyl group such as a methyl group, an ethyl group, a propyl group, an isopropyl group, a butyl group, a sec-butyl group, a tert-butyl group, a pentyl group, a hexyl group, an octyl group, and a 2-ethylhexyl group. The aliphatic hydrocarbon group represented by $R^{b9}$ to $R^{b12}$ is preferably a C1-C18 alkyl group, more preferably a C1-C12 alkyl group.

Examples of the alkyl group where a hydrogen atom has been replaced by an alicyclic hydrocarbon group include 1-(adamantane-1-yl)alkane-1-yl group.

The alicyclic hydrocarbon group represented by each substituent may be monocyclic or polycyclic, a hydrogen atom of which can be replaced by an alkyl group. When a hydrogen atom of it has been replaced by an alkyl group, the total number of carbon atoms is 30 or less.

Examples of the monocyclic alicyclic hydrocarbon group include a cycloalkyl group such as a cyclopropyl group, a cyclobutyl group, a cyclopentyl group, a cyclohexyl group, a cycloheptyl group, a cyclodecyl group.

Examples of the polycyclic alicyclic hydrocarbon group include a decahydronaphtyl group, an adamantyl group, a nobornyl group, and the following ones.

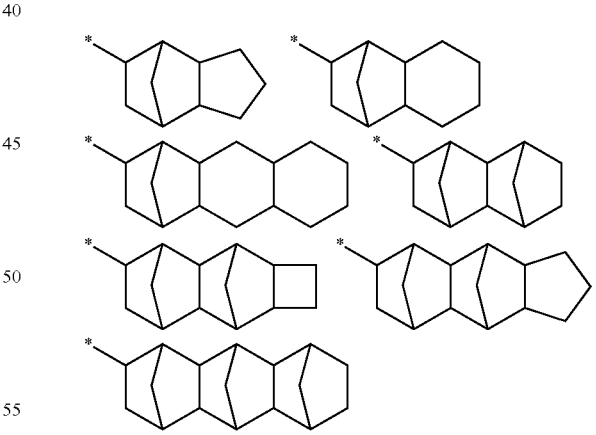

The alicyclic hydrocarbon group represented by $R^{b9}$ to $R^{b12}$ has preferably 3 to 18, more preferably 4 to 12, carbon atoms.

Examples of the alicyclic hydrocarbon group where a hydrogen atom has been replaced by an alkyl group include a methylcyclohexyl group, a 2-alkyladamantane-2-yl group, a methylnorbornyl group, and an isobornyl group.

Preferable examples of the aromatic hydrocarbon group include substituted or unsubstituted phenyl group such as a phenyl group, a tolyl group, a xylyl group, a cumenyl group, a mesityl group, a 4-ethylphenyl group, 4-tert-butylphenyl group, 4-cyclohexylphenyl group, a 4-adamantylphenyl group, a 2,6-diethylphenyl group, a 2-methyl-6-ethylphenyl group; a biphenyl group, a naphtyl group, a phenanthryl group.

Preferable examples of the aromatic hydrocarbon group where a hydrogen atom has been replaced by an alkoxy group include 4-methoxyphenyl group.

Preferable examples of the alkyl group where a hydrogen atom has been replaced by an aromatic hydrocarbon group, i.e., an aralkyl group, include a benzyl group, a phenethyl group, a phenylpropyl group, a trityl group, a naphthylmethyl group and a naphthylethyl group.

When the aromatic hydrocarbon group has an alkyl group or an alicyclic hydrocarbon group as a substituent, the substituent is preferably a C1-C12 alkyl group or a C3-C18 alicyclic hydrocarbon group.

Examples of the alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the C2-C4 acyl group include an acetyl group, a propyonyl group and a butyryl group.

Examples of the halogen atom include a fluorine atom, a chlorine atom, a bromine atom and an iodine atom.

Preferable examples of the alkylcarbonyloxy group include a methylcarbonyloxy group, an ethylcarbonyloxy group, n-propylcarbonyloxy group, an isopropylcarbonyloxy group, n-butylcarbonyloxy group, sec-butylcarbonyloxy group, a tert-butylcarbonyloxy group, a pentylcarbonyloxy group, a hexylcarbonyloxy group, an octylcarbonyloxy group and 2-ethyl hexylcarbonyloxy group.

The ring containing $S^+$ formed by bonding $R^{b4}$ and $R^{b5}$, $R^{b4}$ and $R^{b6}$ or $R^{b5}$ and $R^{b6}$ each other may be a monocyclic ring, a polycyclic ring, an aromatic ring, a non-aromatic ring, a saturated ring or a unsaturated ring. The ring can contain one or more sulfur atom or oxygen atom in addition to $S^+$. The ring preferably has 3 to 18 carbon atoms, and more preferably has 4 to 13 carbon atoms.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. AC3-C7 divalent acyclic hydrocarbon group is preferable.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group and examples of the ring group include oxocyclopentane ring, oxocyclohexane ring, oxonorbornane ring and oxoamadantane ring. A C1-C5 divalent acyclic hydrocarbon group is preferable.

Among the above-mentioned cations, preferred is the cation represented by the formula (b2-1), more preferred is the cation represented by the formula (b2-1) in which any of $R^{b4}$, $R^{b5}$ and $R^{b6}$ is an aromatic hydrocarbon group, still more preferred is the cation represented by the formula (b2-1-1), especially more preferred is a triphenylphosphonium cation, a diphenyltolylsulfonium cation or a tritolylsulfonium cation.

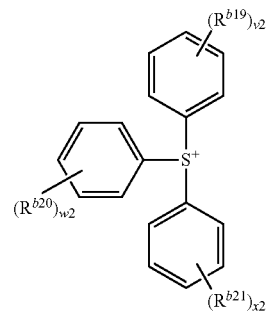

(b2-1-1)

wherein $R^{b19}$, $R^{b20}$ and $R^{b21}$ are independently in each occurrence a halogen atom (preferably a fluorine atom), a hydroxy group, a C1-C18 aliphatic hydrocarbon group, a C1-C12 alkoxy group, or a C3-C18 alicyclic hydrocarbon group; or $R^{b19}$ and $R^{b20}$, $R^{b19}$ and $R^{b21}$ or $R^{b20}$ and $R^{b21}$ can be bonded each other to form a ring together with $S^+$; and v2, w2 and x2 each independently represent an integer of 0 to 5.

Each of $R^{b19}$, $R^{b20}$ and $R^{b21}$ is preferably a halogen atom (preferably a fluorine atom), a hydroxy group, a C1-C12 alkyl group and a C1-C12 alkoxy group, and more preferably a halogen atom (preferably a fluorine atom) and a C1-C6 alkyl group.

The v2, w2 and x2 each independently represent 0 or 1.

The cation represented by the formula (b2-1-1) includes specifically those mentioned in JP2010-204646A1.

The acid generator represented by formula (B1) consists of any one of the above-mentioned anions and any one of the above-mentioned cations.

The acid generator is preferably those represented by formulae (B1-1) to (B1-24), more preferably those represented by formulae (B1-1), (B1-2), (B1-3), (B1-5), (B1-6), (B1-7), (B1-11), (B1-12), (B1-13), (B1-18), (B1-20), (B1-21), (B1-22), (B1-23) and (B1-24), still more preferably those represented by formulae (B1-20), (B1-21) and (B1-22).

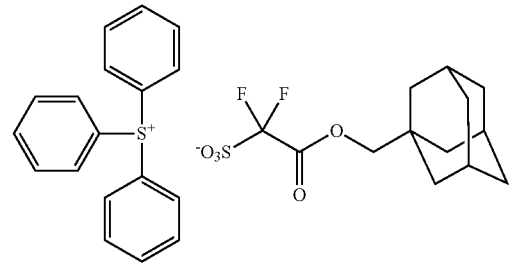

(B1-1)

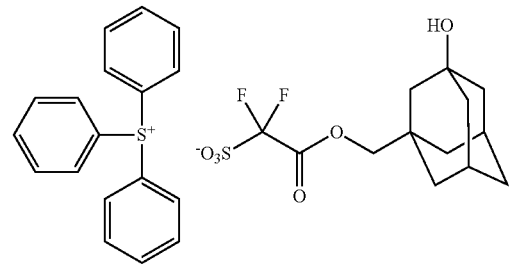

(B1-2)

(B1-3)
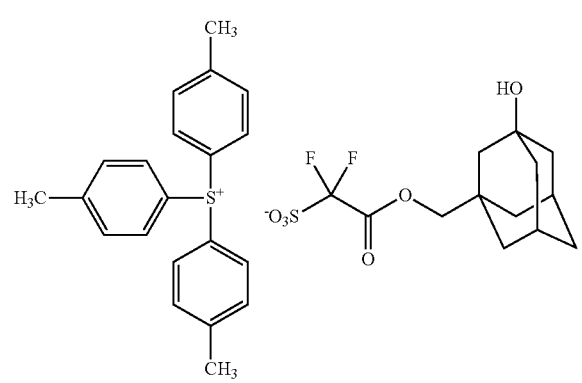
(B1-7)
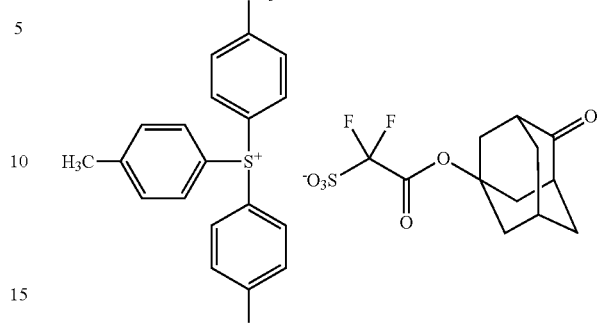
(B1-4)
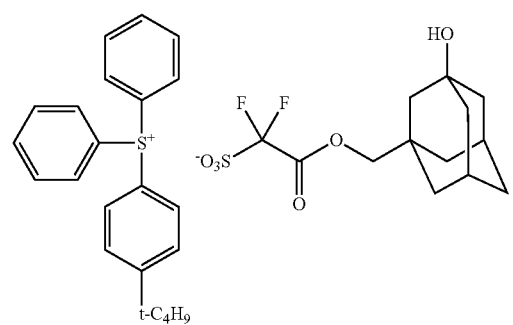
(B1-8)
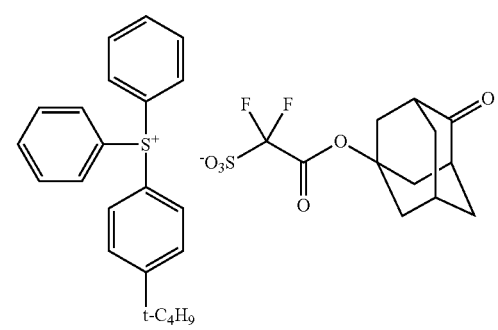
(B1-5)
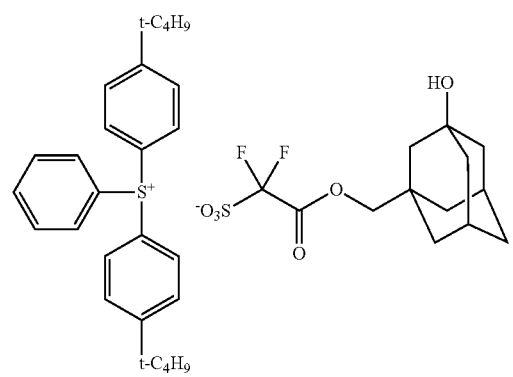
(B1-9)
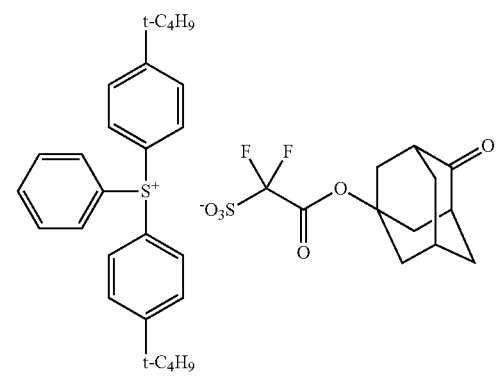
(B1-6)
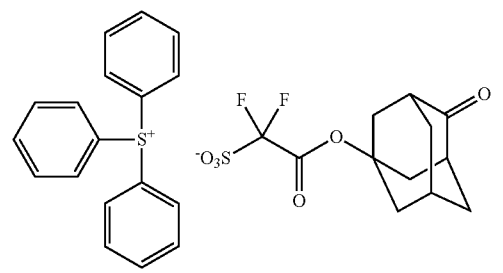
(B1-10)
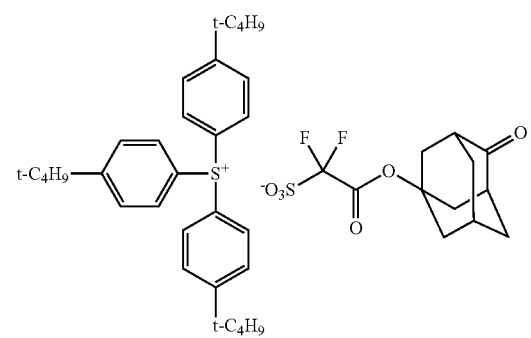

(B1-11) 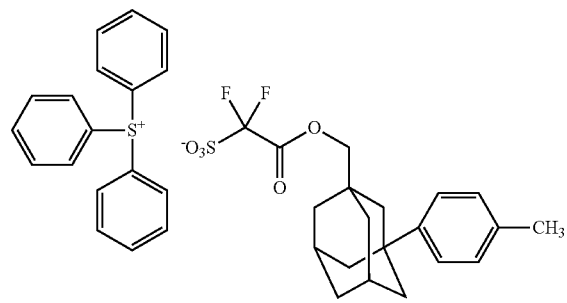
(B1-12) 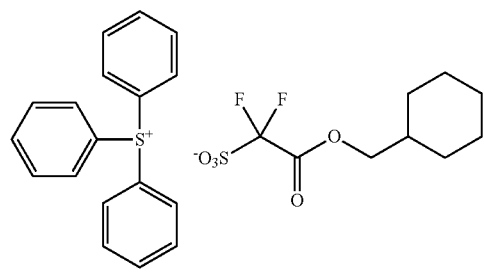
(B1-13) 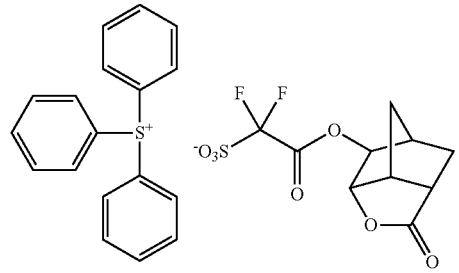
(B1-14) 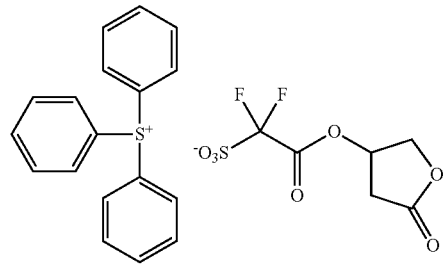
(B1-15) 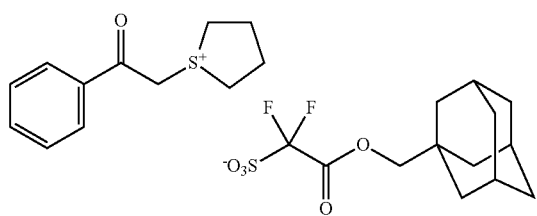
(B1-16) 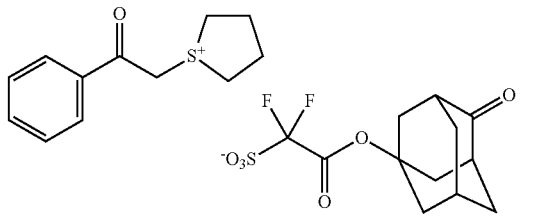
(B1-17) 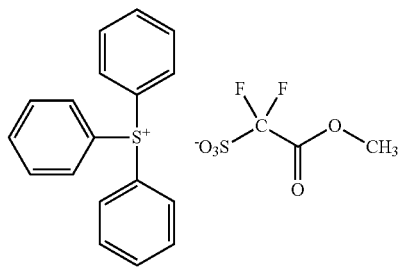
(B1-18) 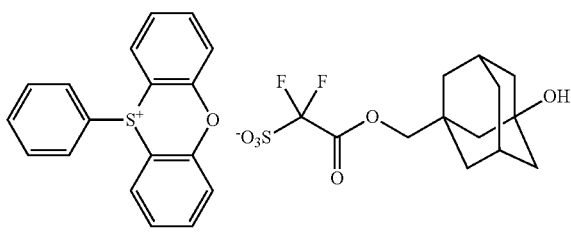
(B1-19) 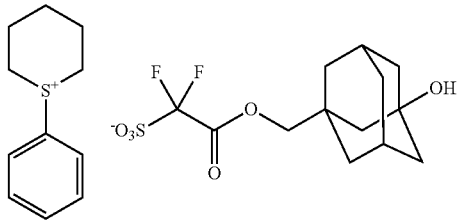
(B1-20) 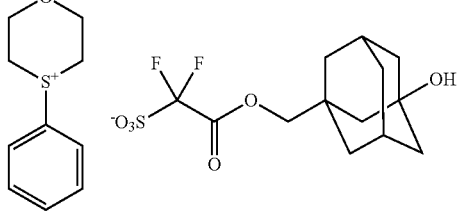
(B1-21) 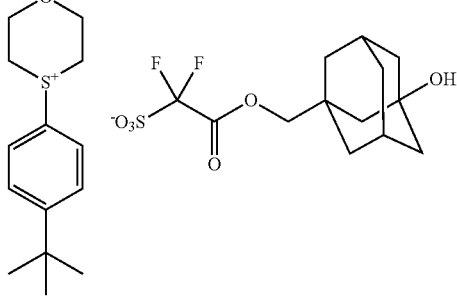

-continued

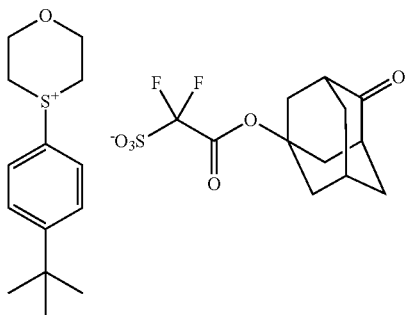
(B1-22)

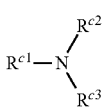
(B1-23)

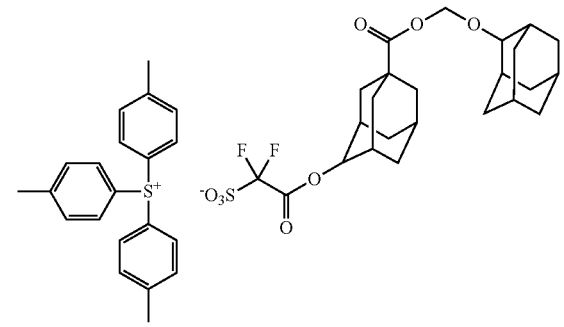
(B1-24)

The content of the acid generator is preferably 1 weight parts or more, more preferably 3 weight parts or more, and preferably 30 weight parts or less, and more preferably 25 weight parts or less relative to 100 weight parts of the total resins.

The photoresist compositions of the present invention generally comprise a solvent.

Examples of the solvent include a glycoletherester such as ethylcellosolve acetate, methylcellosolve acetate and propyleneglycolmonomethylether acetate; an ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by weight or more, preferably 92% by weight or more preferably 94% by weight or more based on total amount of the photoresist composition of the present invention. The amount of the solvent is usually 99.9% by weight or less and preferably 99% by weight or less based on total amount of the photoresist composition of the present invention.

The photoresist compositions of the present invention may comprise a basic compound.

The basic compound is preferably a basic nitrogen-containing organic compound, and examples thereof include an amine compound and an ammonium salt. Amine compound includes an aliphatic amine and an aromatic amine. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine.

The basic compounds include preferably a compound represented by the formulae (C1), (C2), (C3), (C4), (C5), (C6), (C7) and (C8), more preferably a compound represented by the formulae (C1-1).

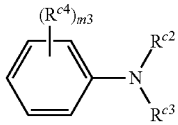
(C1)

wherein $R^{c1}$, $R^{c2}$ and $R^{c3}$ independently represent a hydrogen atom, a C1-C6 alkyl group, a C5-C10 alicyclic hydrocarbon group or a C6-C10 aromatic hydrocarbon group, and the alkyl group and the alicyclic hydrocarbon group can have a substituent selected from the group consisting of a hydroxy group, an amino group and a C1-C6 alkoxy group, and the aromatic hydrocarbon group can have a substituent selected from the group consisting of C1-C6 alkyl groups, a C5-C10 alicyclic hydrocarbon group, a hydroxy group, an amino group, and a C1-C6 alkoxy group, (C1-1)

wherein $R^{c2}$ and $R^{c3}$ are defined as above, each of $R^{c4}$ independently represents a C1-C6 alkyl group, a C1-C6 alkoxy group, a C5-C10 alicyclic hydrocarbon group or a C6-C10 aromatic hydrocarbon group, and m3 represents an integer of 0 to 3,

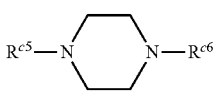
(C2)

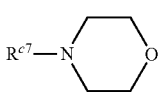
(C3)

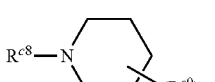
(C4)

wherein $R^{c5}$, $R^{c6}$, $R^{c7}$ and $R^{c8}$ are defined same as $R^{x1}$, each of $R^{c9}$ independently represents a C1-C6 alkyl group, a C3-C6 alicyclic group, or a C2-C6 alkanoyl group, and n3 represents an integer of 0 to 8,

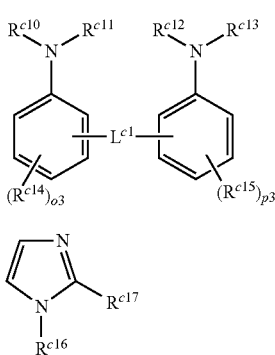

(C5)

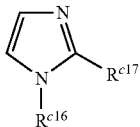

(C6)

wherein each of $R^{c10}$, $R^{c11}$, $R^{c12}$, $R^{c13}$ and $R^{c16}$ is defined same as $R^{c1}$, each of $R^{c14}$, $R^{c15}$ and $R^{c17}$ is defined same as $R^{c4}$, $L^{c1}$ represents a C1-C6 alkanediyl group, —CO—, —C(=NH)—, —S— or a combination thereof, and o3 and p3 each independently represent an integer of 0 to 3,

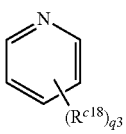

(C7)

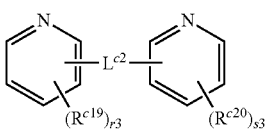

(C8)

wherein each of $R^{c18}$, $R^{c19}$ and $R^{c20}$ is defined same as $R^{c4}$, $L^{c2}$ represents a single bond, a C1-C6 alkanediyl group, —CO—, —C(=NH)—, —S— or a combination thereof, and q3, r3 and p3 each independently represent an integer of 0 to 3.

In each of formulae (C1) to (C8) and formula (C1-1), examples of an alkyl group, an alicyclic hydrocarbon group, an aromatic hydrocarbon group, an alkoxy group and an alkanediyl group are the same as mentioned above.

Examples of alkanoyl groups include an acetyl group, a 2-methyl acetyl group, a 2,2-dimethyl acetyl group, a propionyl group, a butyryl group, an isobutyryl group, a pentanoyl group, a 2,2-dimethyl propionyl group.

Examples of the compound represented by the formula (C1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane. Among them, preferred is diisopropylaniline and more preferred is 2,6-diisopropylaniline Examples of the compound represented by the formula (C2) include piperazine.

Examples of the compound represented by the formula (C3) include morpholine.

Examples of the compound represented by the formula (C4) include piperidine and hindered amine compounds having a piperidine skeleton as disclosed in JP 11-52575 A1.

Examples of the compound represented by the formula (C5) include 2,2'-methylenebisaniline.

Examples of the compound represented by the formula (C6) include imidazole and 4-methylimidazole.

Examples of the compound represented by the formula (C7) include pyridine and 4-methylpyridine.

Examples of the compound represented by the formula (C8) include di-2-pyridylketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

When the photoresist compositions contain the basic compound, the content thereof is usually 0.01 to 5% by weight, preferably 0.01 to 3% by weight, more preferably 0.01 to 1% by weight based on sum of solid component.

The photoresist compositions of the present invention can contain, if necessary, a small amount of various additives such as a sensitizer, a dissolution inhibitor, other polymers, a surfactant, a stabilizer and a dye as long as the effect of the present invention is not prevented.

The photoresist compositions of the present invention can usually be prepared by mixing, in a solvent, resin (A1), resin (A2), an acid generator, and if necessary a basic compound and/or additives at a suitable ratio for the composition, optionally followed by filtrating the mixture with a filter having 0.003 μm to 0.2 μm of a pore size.

The order of mixing these components is not limited to any specific order. The temperature at mixing the components is usually 10 to 40° C., which can be selected in view of the resin or the like.

The mixing time is usually 0.5 to 24 hours, which can be selected in view of the temperature. The means for mixing the components is not limited to specific one. The components can be mixed by being stirred.

The amounts of the components in the photoresist compositions can be adjusted by selecting the amount to be used for production of them.

The photoresist compositions of the present invention are useful for a chemically amplified photoresist composition.

A photoresist pattern can be produced using the photoresist composition of the present invention by the following steps (1) to (5):

(1) a step of applying the photoresist composition of the present invention on a substrate, (2) a step of forming a composition film by drying the composition, (3) a step of exposing the composition film to radiation,
(4) a step of baking the exposed composition film, and
(5) a step of developing the baked composition film to form a photoresist pattern.

The applying of the photoresist composition on a substrate is usually conducted using a conventional apparatus such as spin coater. Examples of the substrate include a silicon wafer or other inorganic material. The substrate may be coated with a reflect-preventing layer such as one containing hexamethyldisilazane. For forming the reflect-preventing layer, such composition for organic reflect-preventing layer as available on the market can be used.

The composition film is usually formed by heating the coat layer with a heating apparatus such as hot plate or a decompressor, to thereby dry off the solvent. The heating temperature is preferably 50 to 200° C., the time of heating is preferably 10 to 180 seconds, and the operation pressure is preferably 1 to $1.0*10^5$ Pa. These conditions can be selected in view of the solvent.

The composition film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a F2 laser (wavelength: 157 nm), and a light source radiating harmonic laser light in a far UV region or a vacuum UV region by wavelength conversion of laser light from a solid laser light source (such as YAG or semiconductor laser). The exposure source may be electric beam or extremely ultraviolet (EUV).

The step of baking of the exposed composition film is so called post-exposure bake, which is conducted with heating means such as hotplates. The temperature of baking of the exposed composition film is preferably 50 to 200° C., and more preferably 70 to 150° C. The deprotection reaction further proceeds by post-exposure bake.

The development of the baked composition film is usually carried out with a developer using a development apparatus. The development method includes dipping methods, paddle methods, spray methods and dynamic dispense method. The developing temperature is preferably 5 to 60° C., and the developing time is preferably 5 to 300 seconds.

When a positive type photoresist pattern is prepared from the photoresist composition of the present invention, the development can be conducted with an alkaline developer. The alkaline developer to be used may be any one of various alkaline aqueous solution used in the art. Generally, an aqueous solution of tetramethylammonium hydroxide or (2-hydroxyethyl)trimethylammonium hydroxide (commonly known as "choline") is often used. The alkaline developer may comprise a surfactant.

After development, the photoresist film having photoresist pattern is preferably washed with ultrapure water, and the remained water on the photoresist film and the substrate is preferably removed therefrom.

When a negative type photoresist pattern is prepared from the photoresist composition of the present invention, the development can be conducted with a developer containing an organic solvent, such developer is sometimes referred to as "organic developer".

Examples of an organic solvent for organic developer include ketone solvents such as 2-hexanone, 2-heptanone; glycolether ester solvents such as propyleneglycolmonomethylether acetate; ester solvents such as butyl acetate; glycolether solvents such as propyleneglycolmonomethylether; amide solvents such as N,N-dimethylacetamide; and aromatic hydrocarbon solvents such as anisole.

The content of organic solvent is preferably from 90% to 100% by weight, more preferably from 95% to 100% by weight, in an organic developer. Preferred is that the organic developer essentially consists of an organic solvent.

Among them, the organic developer is preferably a developer comprising butyl acetate and/or 2-heptanone.

The total content of butyl acetate and 2-heptanone is preferably from 50% to 100% by weight, more preferably from 90% to 100% by weight. Preferred is that the organic developer essentially consists of butyl acetate and/or 2-heptanone.

The organic developer may comprise a surfactant or a very small amount of water.

Development with an organic developer can be stopped by replacing the developer by other solvent than it such as alcohol.

After development, the photoresist film having a photoresist pattern is preferably washed with a rinse agent. Such agent is not limited to specific one provided that it dissolve the film to be washed, example of which include a solvent containing a general organic solvent, preferably alcohol or ester solvents.

After washing, the remained rinse agent on the photoresist film and the substrate is preferably removed therefrom.

The photoresist composition of the present invention is suitable for KrF excimer laser lithography, ArF excimer laser lithography, EB (electron beam) lithography and EUV exposure lithography, particularly for liquid immersion exposure lithography. The photoresist composition is suitable for the fine processing of the semiconductor.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

The weight-average molecular weight of any material used in the following examples is a value found by gel permeation chromatography under the following conditions.
Equipment: HLC-8120GPC type, manufactured by TOSOH CORPORATION
Column: Three of TSKgel Multipore HXL-M with guard column, manufactured by TOSOH CORPORATION
Solvent: tetrahydrofuran,
Flow rate: 1.0 mL/min.
Detector: RI Detector
Column temperature: 40° C.
Injection volume: 100 μL
Standard reference material: standard polystyrene, manufactured by TOSOH CORPORATION.

Synthesis Example 1

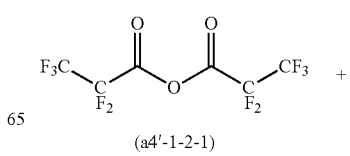

(a4'-1-2-1)

-continued

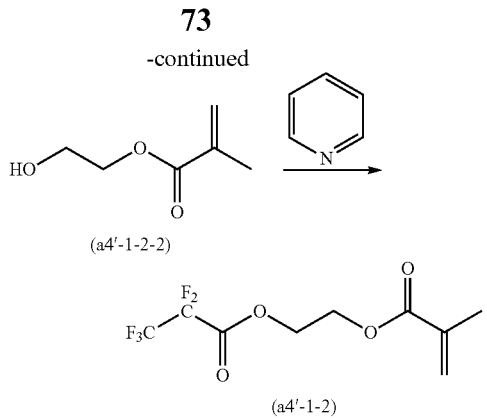

(a4'-1-2-2)

(a4'-1-2)

To the reactor, 88 parts of the compound represented by formula (a4'-1-2-2), 616 parts of methyl isobutyl ketone and 60.98 parts of pyridine were added and stirred at 23° C. for 30 minutes and cooled to 0° C. To the obtained mixture, 199.17 parts of compounds represented by formula (a4'-1-2-1) was fed with keeping it at 0° C. over one hour, and its temperature was raised to around 10° C., followed by stirring it at 10° C. for one hour.

To the reactant, 1446.22 parts of n-heptane and 703.41 parts of 2% aqueous hydrochloric acid solution were added and then stirred at 23° C. for 30 minutes, followed by standing the mixture still to separate into an organic layer. To the collected organic layer, 361.56 parts of 2% aqueous hydrochloric acid solution was fed and then stirred at 23° C. for 30 minutes, followed by standing the mixture still to separate into an organic layer. The organic layer was collected.

To the organic layer, 361.56 parts of ion exchanged water was fed and then stirred at 23° C. for 30 minutes, followed by standing the mixture still to collect the washed layer.

To the collected organic layer, 443.92 parts of 10% aqueous potassium carbonate solution was fed and then stirred at 23° C. for 30 minutes, followed by standing it still to separate into an organic layer. Then the organic layer was collected: The washing process was conducted twice.

To the washed organic layer, 361.56 parts of ion exchanged water was fed and then stirred at 23° C. for 30 minutes, followed by standing the mixture still. Then the organic layer was collected: The washing process was conducted five times.

The collected organic layer was concentrated to give 163.65 parts of the compound represented by formula (a4'-1-2).

A mass spectrum: 276.0 (molecular ion peak)

Synthesis Example 2

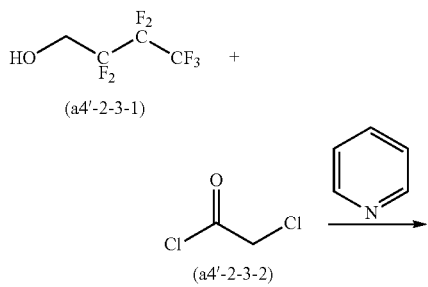

(a4'-2-3-1)

(a4'-2-3-2)

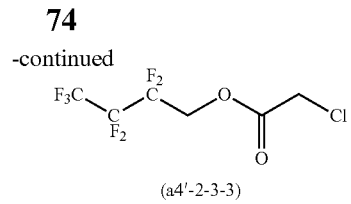

(a4'-2-3-3)

To the reactor, 25 parts of the compound represented by formula (a4'-2-3-1), 175 parts of tetrahydrofuran and 11.86 parts of pyridine were added and stirred at 23° C. for 30 minutes and cooled to 5° C.

To the obtained mixture, 14.82 parts of compounds represented by formula (a4'-2-3-2) was added over 30 minutes and then stirred at 5° C. over one hour. Then 340 parts of ethyl acetate, 66 parts of 5% aqueous hydrochloric acid solution and 85 parts of ion exchanged water were added thereto and stirred, followed by separating into an organic layer. To the collected organic layer, 55 parts of 10% aqueous potassium carbonate solution was added and then stirred, followed by separating into an organic layer. Then 85 parts of ion exchanged water was added to the collected organic layer and then stirred, followed by separating it into an organic layer: The washing process was conducted 5 times.

The collected organic layer was concentrated to give 28.62 parts of the compound represented by formula (a4'-2-3-3).

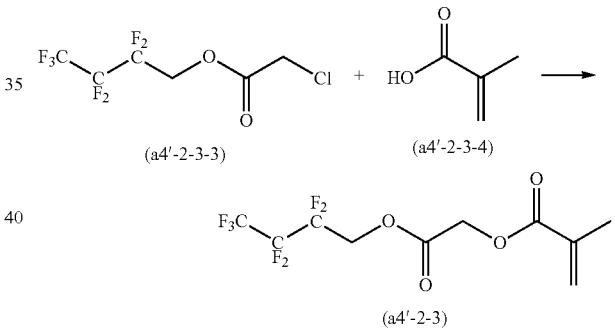

(a4'-2-3-3)  (a4'-2-3-4)

(a4'-2-3)

Into a reactor, 10.69 parts of compounds represented by formula (a4'-2-3-4), 53.47 parts of dimethylformamide, 8.58 parts of potassium carbonate and 1.03 parts of potassium iodide were fed and then stirred at 40° C. for one hour. Then the mixture of 28.62 parts of compounds represented by formula (a4'-2-3-3) and 57.24 parts of dimethylformamide was added thereto over 30 minutes and stirred at 40° C. for 6 hours, followed by cooling it to 23° C.

To the obtained reaction mixture, 670 parts of chloroform and 166 parts of 5% aqueous oxalic acid solution were added and then stirred, followed by separating into an organic layer. To the collected organic layer, 265 parts of ion exchanged water was added and then stirred, followed by separating it into an organic layer. Then the organic layer was collected: The washing process was conducted 6 times.

The collected organic layer was concentrated, and then 7.58 parts of acetonitrile and 26.53 parts of ethyl acetate were added thereto and stirred for 3 hours, followed by filtrating it to give 32.13 parts of the compound represented by formula (a4'-2-3).

Synthesis Example 3

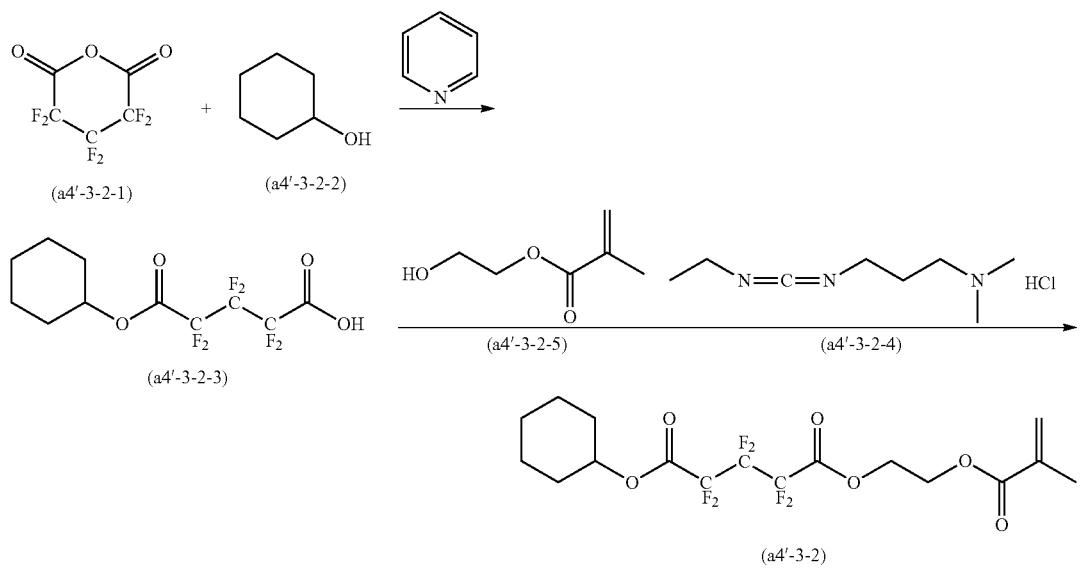

In a reactor, 6.32 parts of the compound represented by formula (a4'-3-2-2), 30 parts of tetrahydrofuran and 5.99 parts of pyridine were mixed and stirred at 23° C. for 30 minutes and then cooled it to 0° C. With keeping the obtained mixture at 0° C., 14.00 parts of compounds represented by formula (a4'-3-2-1) was added thereto over one hour and then raised its temperature to around 10° C., followed by stirring it for 1 hour.

To the reaction mixture which contained a compound represented by formula (a4'-3-2-3), 14.51 parts of the compound represented by formula (a4'-3-2-4), i.e., 1-(3-dimethylaminopropyl)-3-ethylcarbodiimide hydrochloride, and 8.20 parts of the compound represented by formula (a4'-3-2-5) were added, followed by stirring it at 23° C. for three hours. Then to the reaction mixture, 270 parts of ethyl acetate and 16.57 parts of 5% aqueous hydrochloric acid solution were added and then stirred at 23° C. for 30 minutes, followed by standing it still and separating it into an organic layer. Then the organic layer was collected.

To the organic layer, 65 parts of aqueous saturated sodium hydrocarbonate solution was added and then stirred at 23° C. for 30 minutes, followed by standing it still to separate it into an organic layer: The washing process was conducted twice.

After washing the organic layer, 65 parts of ion exchanged water was added thereto and then stirred at 23° C. for 30 minutes, followed by standing it still and separating it into an organic layer: The washing process was conducted 5 times. Then the collected organic layer was concentrated and then separated with silica gel column chromatography of solid phase: silica gel 60-200 mesh, product by Merck & Co., solvent: n-heptane/ethyl acetate into 9.9 parts of the compound represented by formula (a4'-3-2).

MS (mass spectrometry): 434.1 (molecular ion peak)

Synthesis Example 4

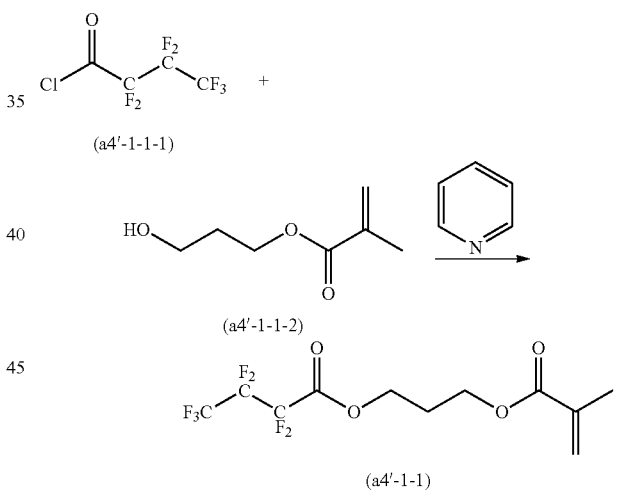

To the reactor, 27.34 parts of the compound represented by formula (a4'-1-1-2), 190 parts of methyl isobutyl ketone and 18 parts of pyridine were added and stirred at 23° C. for 30 minutes and cooled to 0° C. To the obtained mixture, 48.5 parts of the compound represented by formula (a4'-1-1-1) was fed with keeping it at 0° C. over one hour, and its temperature was raised to around 5° C., followed by stirring it at 5° C. for one hour.

To the reactant, 570 parts of ethyl acetate, 99.68 parts of 5% aqueous hydrochloric acid solution and 126 parts of ion exchanged water were added and then stirred at 23° C. for 30 minutes. Then, after standing the mixture still, an organic layer was collected.

To the collected organic layer, 86.5 parts of 10% aqueous potassium carbonate solution was fed and then stirred at 23°

C. for 30 minutes, followed by standing it still to separate into an organic layer and collecting it: The washing process was conducted twice.

To the washed organic layer, 150 parts of ion exchanged water was fed and then stirred at 23° C. for 30 minutes, followed by standing the mixture still. Then the organic layer was collected: The washing process was conducted five times.

The collected organic layer was concentrated to give 23.89 parts of the compound represented by formula (a4'-1-1).

A mass spectrum: 340.1 (molecular ion peak)

Synthesis Example 5 pound represented by formula (a4'-3-1-4), i.e., 1-(3-dimethylaminopropyl)-3-ethylcarbodiimide, and 8.2 parts of the compound represented by formula (a4' (a4'-3-1-5) were added, followed by stirring it at 23° C. for three hours.

For washing, to the reaction mixture, 271.95 parts of ethyl acetate and 16.57 parts of 5% aqueous hydrochloric acid solution were added and then stirred at 23° C. for 30 minutes, followed by standing it still and separating it into an organic layer: The washing process was conducted twice. After washing the organic layer, 67.99 parts of ion exchanged water was added thereto and then stirred at 23° C. for 30 minutes, followed by standing it still and separating it into an organic layer: The washing process was conducted 5 times. Then the collected organic layer was concentrated and then 107.71 parts of ethyl acetate was

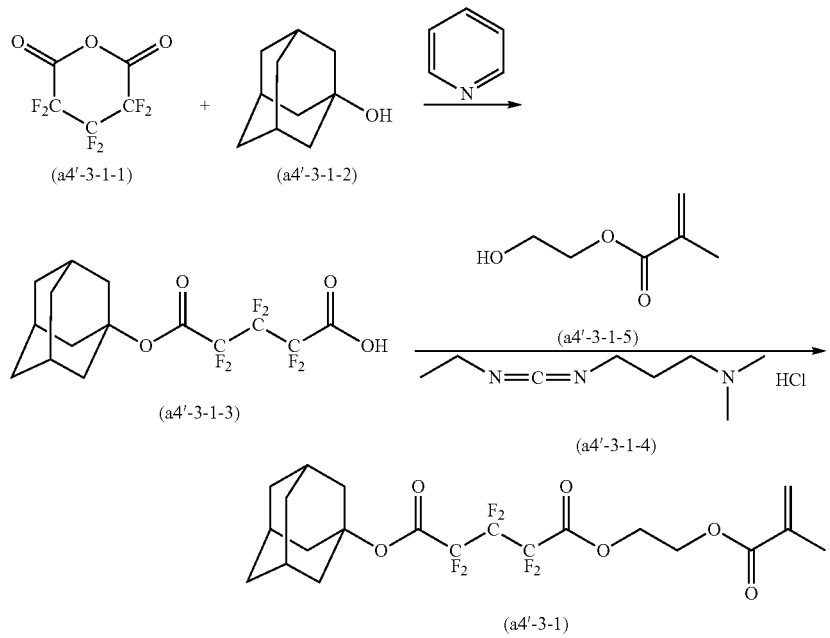

In a reactor, 9.6 parts of the compound represented by formula (a4'-3-1-2), 38.4 parts of tetrahydrofuran and 5.99 parts of pyridine were mixed and stirred at 23° C. for 30 minutes and then cooled it to 0° C. With keeping the obtained mixture at 0° C., 14 parts of the compound represented by formula (a4'-3-1-1) was added thereto over one hour and then raised its temperature to around 10° C., followed by stirring it for 1 hour.

To the reaction mixture which contained a compound represented by formula (a4'-3-1-3), 14.51 parts of the comadded thereto and stirred until it had been completely dissolved therein. Then 646.26 parts of n-heptane was dropped thereto and then stirred at 23° C. for 30 minutes, followed by filtrating it to give 15.11 parts of the compound represented by formula (a4'-3-1).

MS (mass spectrometry): 486.2 (molecular ion peak)

Synthesis Example 6

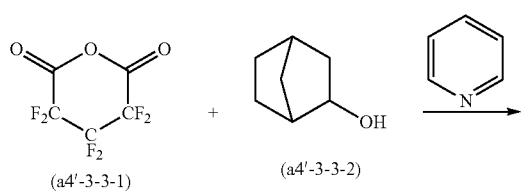

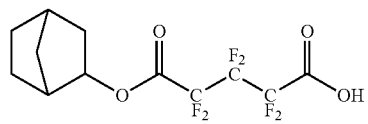

(a4'-3-3-3)

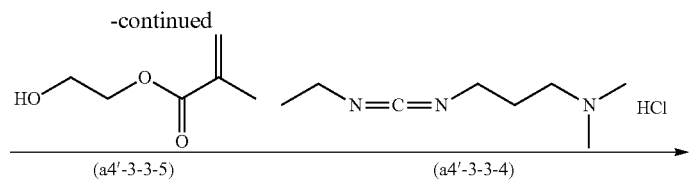

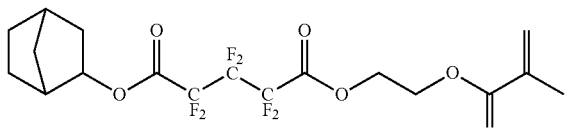

(a4'-3-3)

In a reactor, 7.08 parts of the compound represented by formula (a4'-3-3-2), 30 parts of tetrahydrofuran and 5.99 parts of pyridine were mixed and stirred at 23° C. for 30 minutes and then cooled it to 0° C. With keeping the obtained mixture at 0° C., 14 parts of the compound represented by formula (a4'-3-3-1) was added thereto over one hour and then raised its temperature to around 10° C., followed by stirring it for 1 hour.

To the reaction mixture which contained a compound represented by formula (a4'-3-3-3), 14.51 parts of the compound represented by formula (a4'-3-3-4), i.e., 1-(3-dimethylaminopropyl)-3-ethylcarbodiimide hydrochloride, and 8.20 parts of the compound represented by formula (a4'-3-3-5) were added, followed by stirring it at 23° C. for three hours.

For washing, to the reaction mixture, 270 parts of ethyl acetate and 16.57 parts of 5% aqueous hydrochloric acid solution were added and then stirred at 23° C. for 30 minutes, followed by standing it still and separating it into an organic layer. Then to the organic layer, 65 parts of aqueous saturated potassium carbonate was added and then stirred at 23° C. for 30 minutes, followed by standing it still and separating it into an organic layer: The washing process was conducted twice.

To the washed organic layer, 65 parts of ion exchanged water was fed and then stirred at 23° C. for 30 minutes, followed by standing the mixture still to separate into an organic layer. Then the organic layer was collected: The washing process was conducted five times.

Then the collected organic layer was concentrated and then separated into 10.24 parts of the compound represented by formula (a4'-3-3) with silica gel column chromatography of solid phase: silica gel 60-200 mesh, product by Merck & Co., solvent: n-heptane/ethyl acetate.

MS (mass spectrometry): 446.1 (molecular ion peak)

Synthesis of Resin

The monomers used in the syntheses of the resin are as follow.

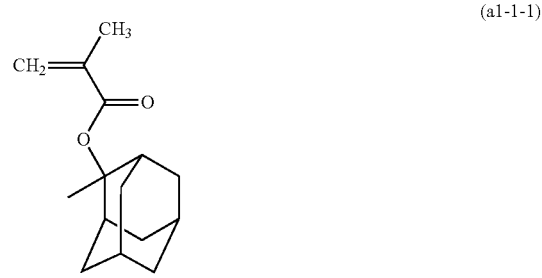

(a1-1-1)

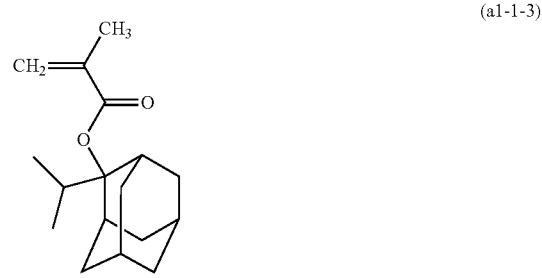

(a1-1-3)

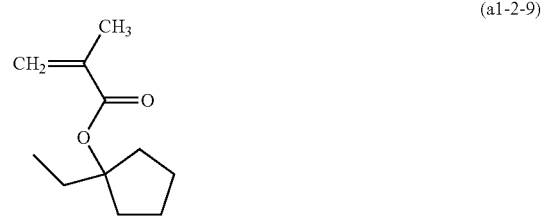

(a1-2-9)

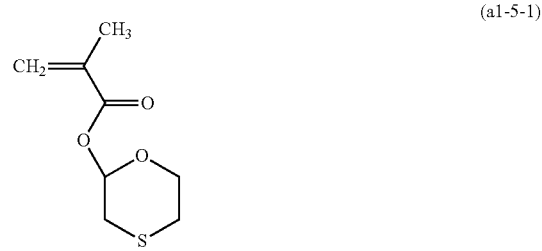

(a1-5-1)

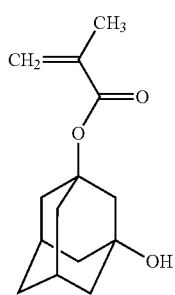
(a2-1-1)
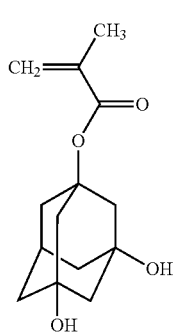
(a2-1-3)
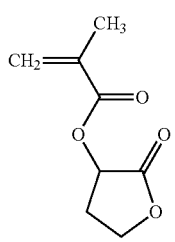
(a3-1-1)
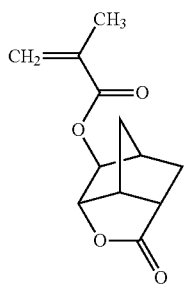
(a3-2-1)
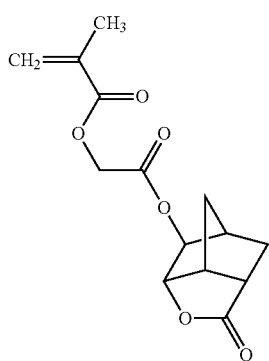
(a3-2-3)
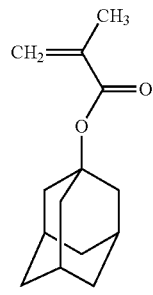
(I'-1)
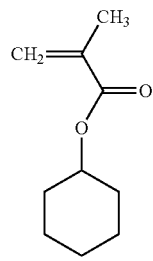
(I'-2)
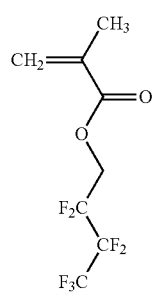
(a4'-0-1)
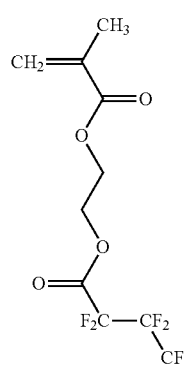
(a4'-1-1)
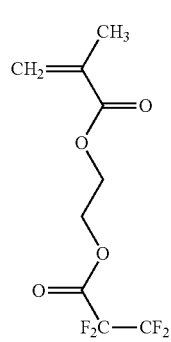
(a4'-1-2)

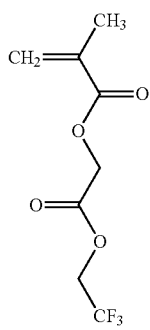
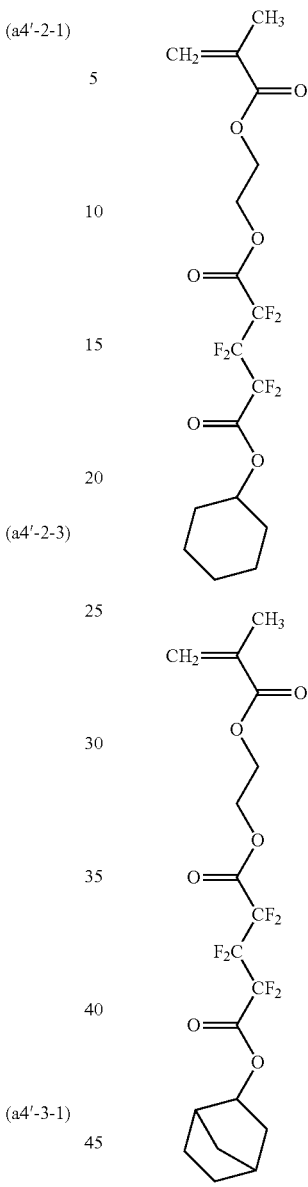

Each monomer is referred to as "monomer X" where X represents the symbol of its formula.

Synthesis Example 7

The monomers (I'-1) and (a4'-0-1) were mixed in a molar ratio of 50/50 [monomer (I'-1)/monomer (a4'-0-1)], and methyl isobutyl ketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 was added, and the resulting reaction mixture was heated at 70° C. for about 5 hours.

The obtained reaction mixture was poured into a large amount of a mixture of methanol and water to cause precipitation, followed by collecting it by filtration. As a result, a resin having a weight-average molecular weight of about $1.1 \times 10^4$ was obtained in a yield of 89%. This resin is called as resin A1-1. Resin A1-1 had the following structural units.

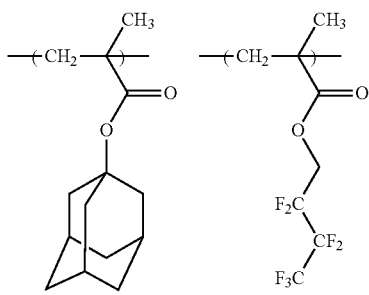

Synthesis Example 8

The monomers (I'-2) and (a4'-0-1) were mixed in a molar ratio of 50/50 [monomer (I'-2)/monomer (a4'-0-1)], and methyl isobutyl ketone acetate was added thereto in the amount ratio of 1.2 times weight parts relative to the total parts of all monomers to prepare a mixture. To the mixture, azobis(2,4-dimethylvaleronitrile) as an initiator in the molar ratio of azobis(2,4-dimethylvaleronitrile)/all monomers=4/100 was added, and the obtained mixture was heated at 70° C. for about 5 hours. The obtained reaction mixture was poured into a large amount of a mixture of methanol and water to cause precipitation, followed by collecting it by filtration. As a result, a resin having a weight-average molecular weight of about $1.2 \times 10^4$ was obtained in a yield of 92%. This resin is called as resin A1-2. Resin A1-2 had the following structural units.

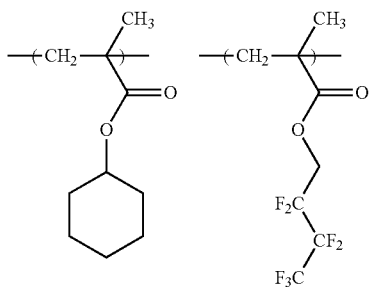

Synthesis Example 9

The monomers (I'-1) and (a4'-0-1) were mixed in a molar ratio of 75/25 [monomer (I'-1)/monomer (a4'-0-1)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $9.8 \times 10^3$ was obtained in a yield of 87%. This resin is called as resin A1-3. Resin A1-3 had the following structural units.

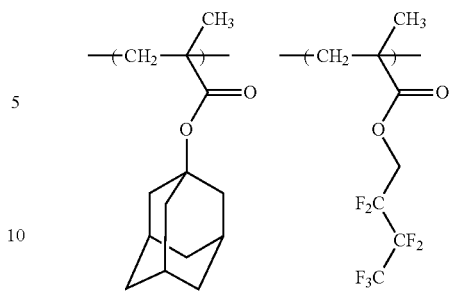

Synthesis Example 10

The monomers (I'-1) and (a4'-0-1) were mixed in a molar ratio of 25/75 [monomer (I'-1)/monomer (a4'-0-1)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $1.3 \times 10^4$ was obtained in a yield of 90%. This resin is called as resin A1-4. Resin A1-4 had the following structural units.

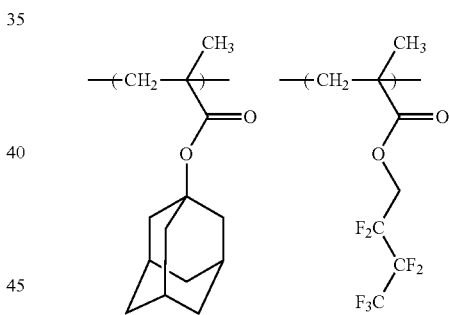

Synthesis Example 11

The monomers (I'-1) and (a4'-1-2) were mixed in a molar ratio of 50/50 [monomer (I'-1)/monomer (a4'-1-2)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $9.7 \times 10^3$ was obtained in a yield of 82%. This resin is called as resin A1-5. Resin A1-5 had the following structural units.

87

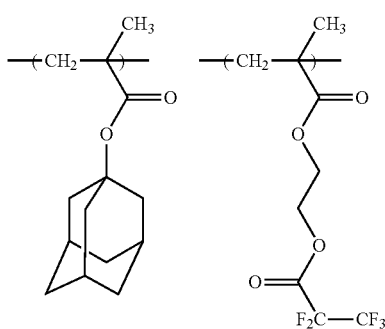

Synthesis Example 12

The monomers (I'-1) and (a4'-2-3) were mixed in a molar ratio of 50/50 [monomer (I'-1)/monomer (a4'-2-3)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $9.1 \times 10^3$ was obtained in a yield of 78%. This resin is called as resin A1-6. Resin A1-6 had the following structural units.

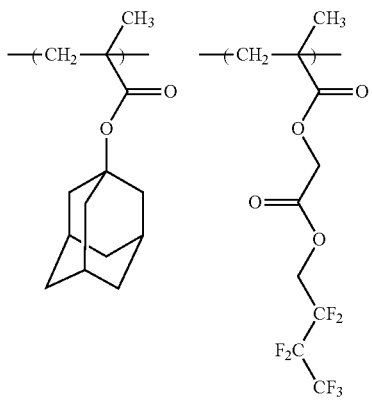

Synthesis Example 13

The monomers (I'-1) and (a4'-3-2) were mixed in a molar ratio of 50/50 [monomer (I'-1)/monomer (a4'-3-2)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

88

As a result, a resin having a weight-average molecular weight of about $8.8 \times 10^3$ was obtained in a yield of 70%. This resin is called as resin A1-7. Resin A1-7 had the following structural units.

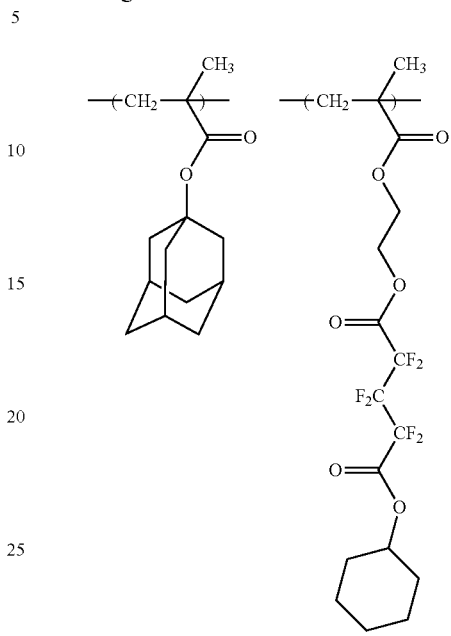

Synthesis Example 14

The monomers (I'-1) and (a4'-1-1) were mixed in a molar ratio of 50/50 [monomer (I'-1)/monomer (a4'-1-1)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $1.1 \times 10^4$ was obtained in a yield of 76%. This resin is called as resin A1-8. Resin A1-8 had the following structural units.

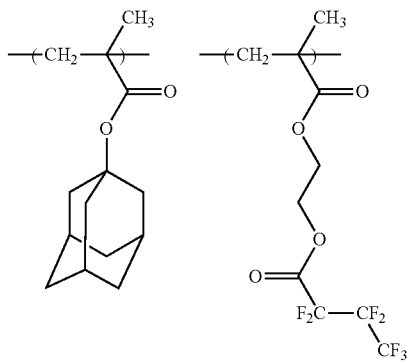

Synthesis Example 15

The monomers (I'-1) and (a4'-3-1) were mixed in a molar ratio of 50/50 [monomer (I'-1)/monomer (a4'-3-1)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $9.4 \times 10^3$ was obtained in a yield of 66%. This resin is called as resin A1-9. Resin A1-9 had the following structural units.

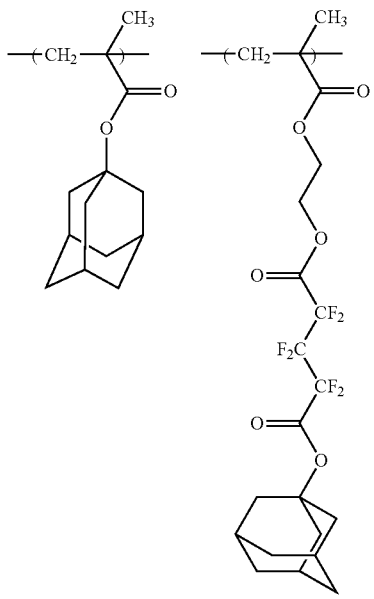

Synthesis Example 16

The monomers (I'-1) and (a4'-3-3) were mixed in a molar ratio of 50/50 [monomer (I'-1)/monomer (a4'-3-3)], and methylisobutylketone was added thereto in the amount ratio of 1.2 times weight parts relative to the total parts of all monomers to prepare a mixture.

To the mixture, azobis(2,4-dimethylvaleronitrile) as an initiator in the molar ratio of azobis(2,4-dimethylvaleronitrile)/all monomers=4/100 were added, and the obtained mixture was heated at 70° C. for about 5 hours.

The obtained reaction mixture was poured into a large amount of a mixture of methanol and water to cause precipitation, followed by collecting it by filtration.

As a result, a resin having a weight-average molecular weight of about $9 \times 10^3$ was obtained in a yield of 72%. This resin is called as resin A1-10. Resin A1-10 had the following structural units.

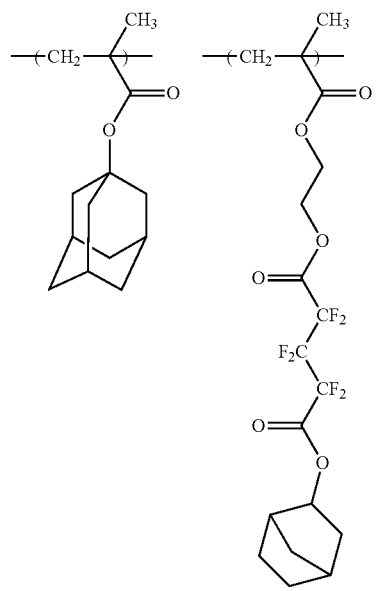

Synthesis Example 17

The monomers (a1-1-3), (a1-2-9), (a2-1-3), (a3-2-3) and (a3-1-1) were mixed in a molar ratio of 45/14/2.5/22/16.5 [monomer (a1-1-3)/monomer (a1-2-9)/monomer (a2-1-3)/monomer (a3-2-3)/monomer (a3-1-1)], and propyleneglycolmonomethylether acetate was added thereto in the amount ratio of 1.5 times weight parts relative to the total parts of all monomers to prepare a mixture.

To the mixture, azobisisobutyronitrile as an initiator in the molar ratio of azobisisobutyronitrile/all monomer=0.95/100 and azobis(2,4-dimethylvaleronitrile) as an initiator in the molar ratio of azobis(2,4-dimethylvaleronitrile)/all monomer=2.85/100 were added, and the obtained mixture was heated at 73° C. for about 5 hours. The obtained reaction mixture was poured into a large amount of methanol/ion exchanged water mixture [weight ratio: methanol/ion exchanged water=4/1] to cause precipitation of the resin, followed by collecting it by filtration. As a result, a resin having a weight-average molecular weight of about $7.8 \times 10^3$ was obtained in a yield of 73%. This resin is called as resin A2-1.

Resin A2-1 had the following structural units and soluble in butyl acetate.

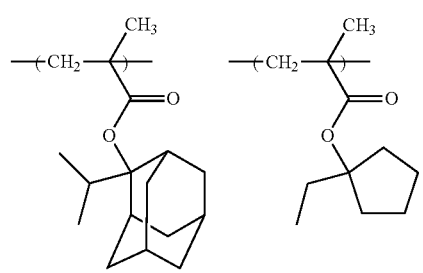

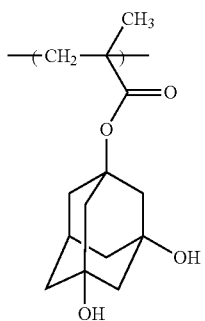

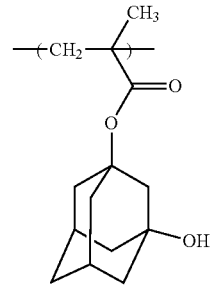

Synthesis Example 19

The monomers (a4'-2-1) and (a1-1-1) were mixed in a molar ratio of 80/20 [monomer (a4'-2-1)/monomer (a1-1-1)], and dioxane acetate was added thereto in the amount ratio of 1.5 times weight parts relative to the total parts of all monomers to prepare a mixture. To the mixture, azobisisobutyronitrile as an initiator in the molar ratio of azobisisobutyronitrile/all monomers=0.5/100 and azobis(2,4-dimethylvaleronitrile) as an initiator in the molar ratio of azobis(2,4-dimethylvaleronitrile)/all monomers=1.5/100 were added, and the obtained mixture was heated at 70° C. for about 5 hours. The obtained reaction mixture was poured into a large amount of methanol/water mixture to cause precipitation of the resin, followed by collecting it by filtration.

Then the collected resin was dissolved in dioxane and then poured into a large amount of methanol/water mixture to cause precipitation of the resin, followed by collecting it by filtration: The recrystallization process was conducted twice.

As a result, a resin having a weight-average molecular weight of about $2.8 \times 10^4$ was obtained in a yield of 70%. This resin is called as resin A2-3. Resin A2-3 had the following structural units and soluble in butyl acetate.

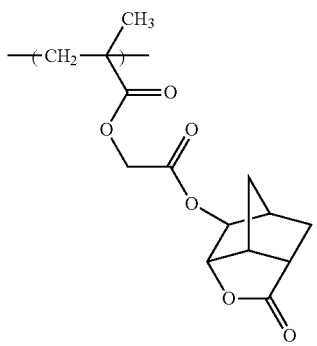

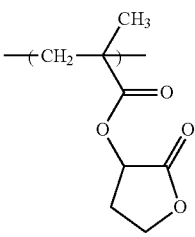

Synthesis Example 18

The monomers (a1-1-1), (a3-1-1) and (a2-1-1) were mixed in a molar ratio of 35/45/20 [monomer (a1-1-1)/monomer (a3-1-1)/monomer (a2-1-1)], and dioxane was added thereto in the amount ratio of 1.5 times weight parts relative to the total parts of all monomers to prepare a mixture. To the mixture, azobisisobutyronitrile as an initiator in the molar ratio of azobisisobutyronitrile/all monomers=1/100 and azobis(2,4-dimethylvaleronitrile) as an initiator in the molar ratio of azobis(2,4-dimethylvaleronitrile)/all monomers=3/100 were added, and the obtained mixture was heated at 75° C. for about 5 hours. The obtained reaction mixture was poured into a large amount of methanol to cause precipitation of the resin, followed by collecting it by filtration. As a result, a resin having a weight-average molecular weight of about $7 \times 10^3$ was obtained in a yield of 75%.

This resin is called as resin A2-2. Resin A2-2 had the following structural units and soluble in butyl acetate.

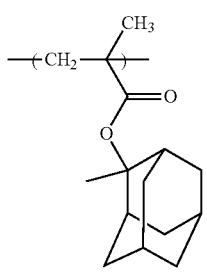 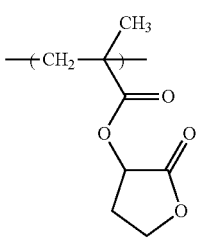

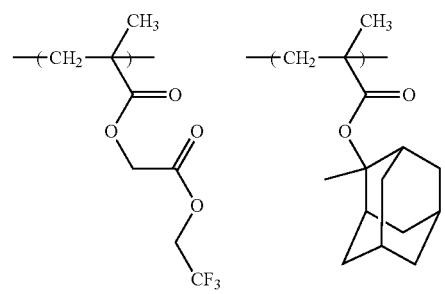

Synthesis Example 20

The monomers (a1-1-3), (a1-5-1), (a2-1-3), (a3-2-1) and (a3-1-1) were mixed in a molar ratio of 45/14/2.5/22/16.5 [monomer (a1-1-3)/monomer (a1-5-1)/monomer (a2-1-3)/monomer (a3-2-1)/monomer (a3-1-1)] and propyleneglycolmonomethylether acetate was added thereto in the amount ratio of 1.5 times weight parts relative to the total parts of all monomers to prepare a mixture. To the mixture, azobisisobutyronitrile as an initiator in the molar ratio of azobisisobutyronitrile/all monomers=0.95/100 and azobis(2,4-dimethylvaleronitrile) as an initiator in the molar ratio of azobis(2,4-dimethylvaleronitrile)/all monomers=2.85/100 were added, and the obtained mixture was heated at 73° C. for about 5 hours. The obtained reaction mixture was poured into a large amount of methanol/water mixture to cause precipitation of the resin, followed by collecting it by filtration.

Then the collected resin was dissolved in propyleneglycolmonomethylether acetate and then poured into a large amount of methanol/water mixture to cause precipitation of the resin, followed by collecting it by filtration: The recrystallization process was conducted twice.

As a result, a resin having a weight-average molecular weight of about $7.6 \times 10^3$ was obtained in a yield of 68%. This resin is called as resin A2-4. Resin A2-4 had the following structural units and soluble in butyl acetate.

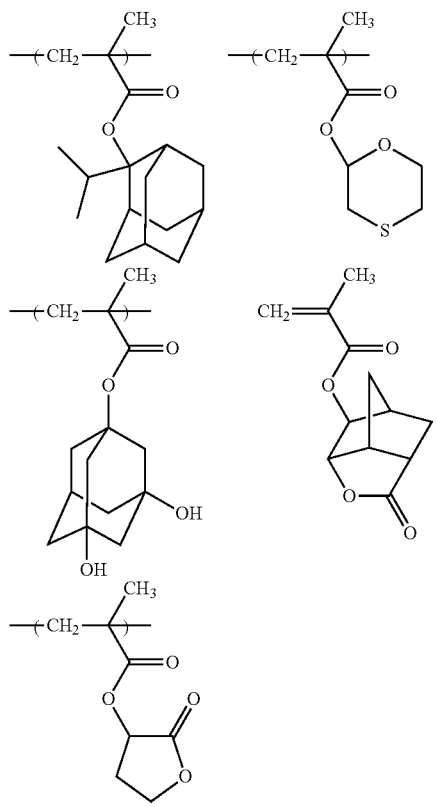

Synthesis Example 21

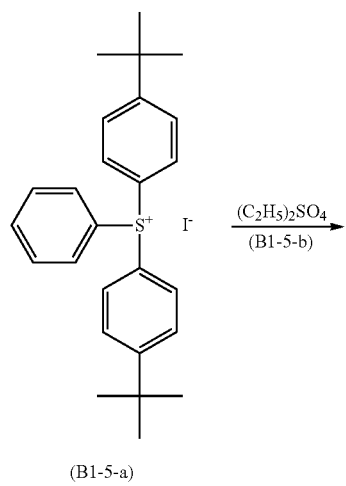

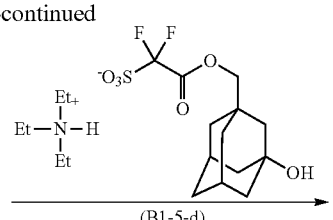

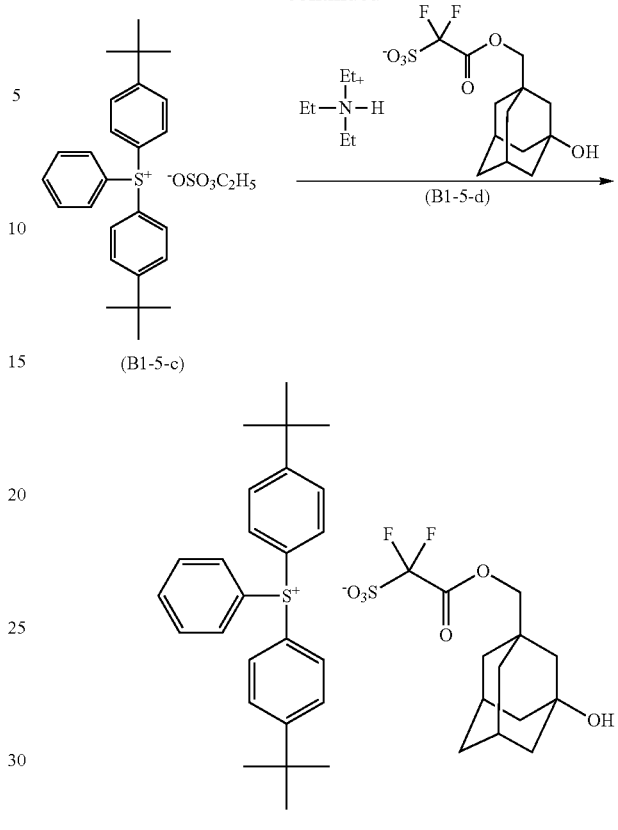

Into a reactor, 50.49 parts of salt represented by formula (B1-5-a) and 252.44 parts of chloroform were fed and stirred at 23° C. for about 30 minutes. Then 16.27 parts of salt represented by formula (B1-5-b) was dropped thereto and stirred at 23° C. for 1 hour to give a solution containing salt represented by formula (B1-5-c).

To the solution, 48.80 parts of salt represented by formula (B1-5-d) and 84.15 parts of ion exchanged water were added and then stirred at 23° C. for 12 hours, resulting that a reaction mixture having two separated layers was obtained. Of the layers, the chloroform layer was collected by separation and then 84.15 parts of ion exchanged water was added thereto for washing it: The washing process was conducted five times. To the washed chloroform layer, 3.88 parts of active carbon was added and stirred, followed by filtrating it.

The collected filtrate was concentrated and 125.87 parts of acetonitrile was added to its residues and stirred, followed by concentrating it. To its residues, 20.62 parts of acetonitrile and 309.30 parts of tert-butylmethylether were added and stirred at 23° C. for 30 minutes, then its supernatant was removed therefrom, followed by concentrating its residue. Thereto 200 parts of n-heptane was added and then stirred at 23° C. for 30 minutes, followed by filtrating it to give 61.54 parts of salt represented by formula (B1-5).

MASS (ESI (+) Spectrum): $M^+$ 375.2
MASS (ESI (−) Spectrum): $M^-$ 339.1

Synthesis Example 22

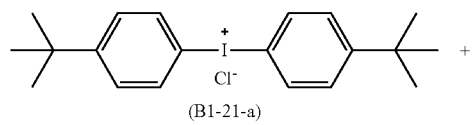
(B1-21-a)

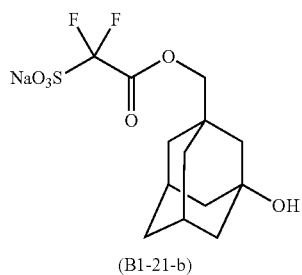
(B1-21-b)

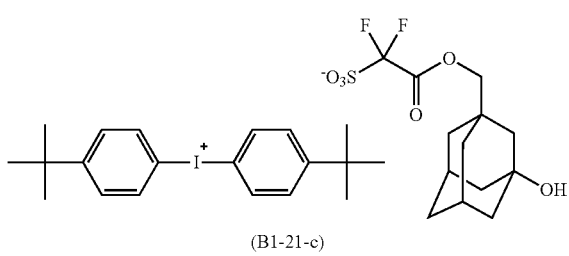
(B1-21-c)

The compound represented by formula (B1-21-b) was obtained with a method described in JP2008-209917A1.

Into a reactor, 30 parts of compounds represented by formula (B1-21-b), 35.50 parts of salt represented by formula (B1-21-a), 100 parts of chloroform and 50 parts of ion exchanged water were fed and then stirred at 23° C. for 15 hours, resulting that a reaction mixture having two separated layers was obtained. Of the layers, the chloroform layer was collected by separation and then 30 parts of ion exchanged water was added thereto for washing it: The washing process was conducted five times. To the washed chloroform layer, 100 parts of tert-butyl methyl ether was added and stirred at 23° C. for 30 minutes, followed by filtrating it to give 48.57 parts of salt represented by formula (B1-21-c).

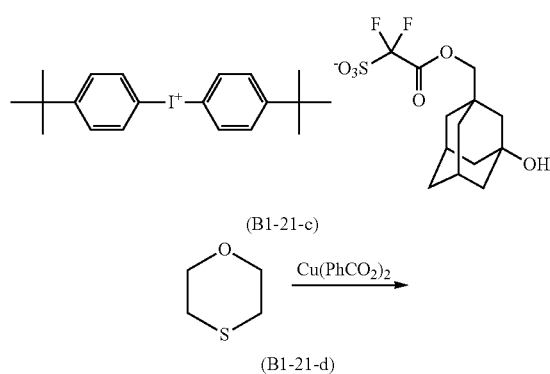

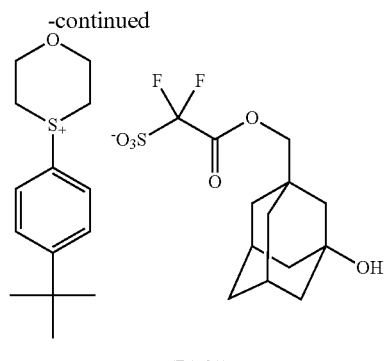
(B1-21)

Into a reactor, 20 parts of salt represented by formula (B1-21-c), 2.84 parts of compound represented by formula (B1-21-d) and 250 parts of monochlorobenzene were fed and stirred at 23° C. for 30 minutes.

To the obtained mixture, 0.21 parts of dibenzoic acid copper (II) was added and then stirred at 23° C. for an hour. Then the reaction mixture was concentrated, and 200 parts of chloroform and 50 parts of ion exchanged water were added to the obtained residues and then stirred at 23° C. for 30 minutes, followed by separating it into an organic layer: The washing process was conducted five times.

The resultant organic layer was concentrated. Then its residue was dissolved in 53.51 parts of acetonitrile, then concentration was conducted and 113.05 parts of tert-butyl methyl ether was added to its residue, followed by filtrating it to obtain 10.47 parts of salt represented by formula (B1-21).

MASS (ESI (+) Spectrum): $M^+$ 237.1
MASS (ESI (−) Spectrum): $M^-$ 339.1

<Preparation of Photoresist Composition>

The following components shown in Table 1 were mixed and dissolved, further, filtrated through a fluorine resin filter having pore diameter of 0.2 μm, to prepare photoresist compositions.

TABLE 1

| No. | Resin (Kind/Parts) | Acid generator (Kind/Parts) | Basic Compound (Kind/Parts) | PB/PEB |
|---|---|---|---|---|
| Composition 1 | A1-1/0.7 A2-1/10 | I1-21/0.1 B1-5/0.3 | C1/0.05 | 95° C./85° C. |
| Composition 2 | A1-2/0.7 A2-1/10 | I1-21/0.1 B1-5/0.3 | C1/0.05 | 95° C./85° C. |
| Composition 3 | A1-3/0.7 A2-1/10 | I1-21/0.1 B1-5/0.3 | C1/0.05 | 95° C./85° C. |
| Composition 4 | A1-4/0.7 A2-1/10 | I1-21/0.1 B1-5/0.3 | C1/0.05 | 95° C./85° C. |
| Composition 5 | A1-5/0.7 A2-1/10 | I1-21/0.1 B1-5/0.3 | C1/0.05 | 95° C./85° C. |
| Composition 6 | A1-6/0.7 A2-1/10 | I1-21/0.1 B1-5/0.3 | C1/0.05 | 95° C./85° C. |
| Composition 7 | A1-7/0.7 A2-1/10 | I1-21/0.1 B1-5/0.3 | C1/0.05 | 95° C./85° C. |
| Composition 8 | A1-1/0.7 A2-2/10 | I1-21/0.1 B1-5/0.3 | C1/0.05 | 120° C./115° C. |
| Composition 9 | A1-1/0.7 A2-2/10 | B2/0.3 B3/0.1 | C1/0.05 | 120° C./115° C. |
| Composition 10 | A1-8/0.7 A2-1/10 | I1-21/0.1 B1-5/0.3 | C1/0.05 | 95° C./85° C. |
| Composition 11 | A1-9/0.7 A2-1/10 | I1-21/0.1 B1-5/0.3 | C1/0.05 | 95° C./85° C. |

TABLE 1-continued

| No. | Resin (Kind/Parts) | Acid generator (Kind/Parts) | Basic Compound (Kind/Parts) | PB/PEB |
|---|---|---|---|---|
| Composition 12 | A1-10/0.7<br>A2-1/10 | I1-21/0.1<br>B1-5/0.3 | C1/0.05 | 95° C./85° C. |
| Composition 13 | A1-1/0.7<br>A2-4/10 | I1-21/0.1<br>B1-5/0.3 | C1/0.05 | 95° C./85° C. |
| Composition 14 | A1-2/0.7<br>A2-4/10 | I1-21/0.1<br>B1-5/0.3 | C1/0.05 | 95° C./85° C. |
| Composition 15 | A1-3/0.7<br>A2-4/10 | I1-21/0.1<br>B1-5/0.3 | C1/0.05 | 95° C./85° C. |
| Composition 16 | A1-4/0.7<br>A2-4/10 | I1-21/0.1<br>B1-5/0.3 | C1/0.05 | 95° C./85° C. |
| Composition 17 | A1-5/0.7<br>A2-4/10 | I1-21/0.1<br>B1-5/0.3 | C1/0.05 | 95° C./85° C. |
| Composition 18 | A1-6/0.7<br>A2-4/10 | I1-21/0.1<br>B1-5/0.3 | C1/0.05 | 95° C./85° C. |
| Composition 19 | A1-7/0.7<br>A2-4/10 | I1-21/0.1<br>B1-5/0.3 | C1/0.05 | 95° C./85° C. |
| Composition 20 | A1-8/0.7<br>A2-4/10 | I1-21/0.1<br>B1-5/0.3 | C1/0.05 | 95° C./85° C. |
| Composition 21 | A1-9/0.7<br>A2-4/10 | I1-21/0.1<br>B1-5/0.3 | C1/0.05 | 95° C./85° C. |
| Composition 22 | A1-10/0.7<br>A2-4/10 | I1-21/0.1<br>B1-5/0.3 | C1/0.05 | 95° C./85° C. |
| Compar. Composition 1 | A2-3/0.7<br>A2-2/10 | B2/0.3<br>B3/0.1 | C1/0.05 | 120° C./115° C. |

The symbols shown in Table 1 represent the following components.

<Resin>

A1-1: Resin A1-1, A1-2: Resin A1-2, A1-3: Resin A1-3,

A1-4: Resin A1-4, A1-5: Resin A1-5, A1-6: Resin A6,

A1-7: Resin A1-7, A1-8: Resin A1-8, A1-9: Resin A9,

A1-10: Resin A10, A2-1: Resin A2-1, A2-2: Resin A2-2,

A2-3: Resin A2-3, A2-4: Resin A2-4

<Acid Generator>

B1-5: Salt represented by formula (B1-5)

B1-21: Salt represented by formula (B1-21)

B2: Salt represented by the following formula, prepared by the methods according to Examples of WO2008/99869A1 and Examples of JP2010-264781A1

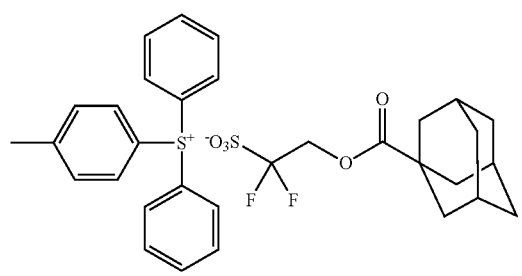

B3: Salt represented by the following formula, prepared in a manner described in Examples of JP2005-221721A1.

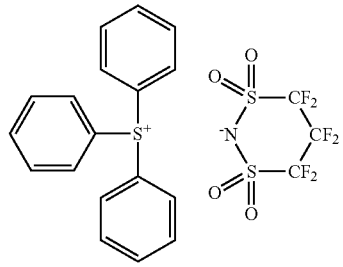

<Basic Compound>

C1: 2,6-diisopropylaniline (Product of Tokyo Chemical Industry, Co., Ltd.)

<Solvent>

| | |
|---|---|
| propylene glycol monomethyl ether acetate | 265 parts |
| propylene glycol monomethyl ether | 20 parts |
| 2-heptanone | 20 parts |
| γ-butyrolactone | 3.5 parts |

(Production of Photoresist Pattern)

Silicon wafers (12 inches) were each coated with "ARC-29", which is an organic anti-reflective coating composition available from Nissan Chemical Industries, Ltd., and then baked at 205° C. for 60 seconds, to form a 78 nm-thick organic anti-reflective coating.

Each of the photoresist compositions prepared as above was spin-coated over the anti-reflective coating so that the thickness of the resulting film became 110 nm after drying.

The silicon wafers thus coated with the respective photoresist compositions were each prebaked on a direct hotplate at a temperature shown in the column "PB" in Table 1 for 60 seconds.

Using anArF excimer stepper for immersion exposure ("XT: 1900Gi" manufactured by ASML, NA=1.35, Dipole 0.9/0.7, Y-polarization illumination) and a mask for contact-hole pattern (hole pitch 120 nm/diameter of hole 55 nm), each wafer thus formed with the respective composition film was subjected to the exposure with the exposure quantity being varied stepwise. Ultra pure water was used for immersion solvent.

After the exposure, each wafer was subjected to post-exposure baking on a hotplate at a temperature shown in the column "PEB" in Table 1 for 60 seconds and then to conduct development in the manner of dynamic dispense method for 14 seconds at 23° C. with butyl acetate, product of Tokyo Chemical Industry, Co., Ltd.

Examples 1 to 22 and Comparative Example 1

Effective sensibility (ES) means the exposure quantity such that the diameter of hole pattern became 55 nm after exposure through the above-mentioned mask.

<Evaluation of CD Uniformity (CDU)>

The photoresist patterns were prepared in the same manner as mentioned above except that a mask forming contact-hole pattern (hole pitch 120 nm/diameter of hole 60 nm) was used and exposure was conducted with exposure quantity of Effective sensibility.

The photoresist pattern was observed with a scanning electron microscope. The hole diameter of the contact hole pattern was twenty four (24) times measured and its average diameter was calculated.

The average diameters of 400 holes on the same wafer were respectively measured. With defining the average diameters of 400 holes as its population, the standard deviation was calculated as CDU.

When the standard deviation was 2.4 nm or less, it was evaluated as good and shown by "○" in Table 2.

When the standard deviation was over 2.4 nm, it was evaluated as bad and shown by "X" in Table 2.

The smaller the standard deviation is, the better is. Furthermore, each of CDU is shown in columns of "CDU" of Table 2.

<Evaluation of Defects>

The negative type photoresist patterns were prepared in the same manner as mentioned above except that the exposure was conducted with the exposure quantity making the width ratio of line and space 1:1, using a mask forming of 1:1 line and space with its pitch 80 nm and an ArF excimer stepper for immersion exposure ("XT: 1900Gi" manufactured by ASML, NA=1.35, 3/4 Annular, X-Y polarization).

The number of defects on the line patterns was determined using defect review systems (KLA-2060, manufactured by KLR Tencor, Co., Ltd.).

The results are shown in Table 2.

TABLE 2

| Ex. No. | Composition | CDU (nm) | Defects |
|---|---|---|---|
| Ex. 1 | Composition 1 | ○ (1.89) | 220 |
| Ex. 2 | Composition 2 | ○ (1.88) | 310 |
| Ex. 3 | Composition 3 | ○ (1.92) | 330 |
| Ex. 4 | Composition 4 | ○ (1.90) | 140 |
| Ex. 5 | Composition 5 | ○ (1.90) | 230 |
| Ex. 6 | Composition 6 | ○ (1.94) | 290 |
| Ex. 7 | Composition 7 | ○ (1.95) | 110 |
| Ex. 8 | Composition 8 | ○ (2.00) | 260 |
| Ex. 9 | Composition 9 | ○ (2.31) | 320 |
| Ex. 10 | Composition 10 | ○ (1.91) | 180 |
| Ex. 11 | Composition 11 | ○ (1.96) | 80 |
| Ex. 12 | Composition 12 | ○ (1.97) | 100 |
| Ex. 13 | Composition 13 | ○ (1.86) | 210 |
| Ex. 14 | Composition 14 | ○ (1.87) | 290 |
| Ex. 15 | Composition 15 | ○ (1.90) | 320 |
| Ex. 16 | Composition 16 | ○ (1.88) | 130 |
| Ex. 17 | Composition 17 | ○ (1.90) | 220 |
| Ex. 18 | Composition 18 | ○ (1.92) | 290 |
| Ex. 19 | Composition 19 | ○ (1.90) | 100 |
| Ex. 20 | Composition 20 | ○ (1.89) | 160 |
| Ex. 21 | Composition 21 | ○ (1.91) | 70 |
| Ex. 22 | Composition 22 | ○ (1.92) | 90 |
| Compar. Ex. 1 | Comparative Composition 1 | X (2.68) | 810 |

Examples 23 to 44 and Comparative Example 2

Negative type photoresist patterns were prepared and their CDU was evaluated in the same manner as mentioned above except that the developer was changed to 2-heptanone (Kyowa Hakko, Ltd.). The results are shown in Table 3.

TABLE 3

| Ex. No. | Composition | CDU (nm) |
|---|---|---|
| Ex. 23 | Composition 1 | ○ (1.89) |
| Ex. 24 | Composition 2 | ○ (1.90) |
| Ex. 25 | Composition 3 | ○ (1.96) |
| Ex. 26 | Composition 4 | ○ (1.92) |
| Ex. 27 | Composition 5 | ○ (1.88) |
| Ex. 28 | Composition 6 | ○ (1.96) |

TABLE 3-continued

| Ex. No. | Composition | CDU (nm) |
|---|---|---|
| Ex. 29 | Composition 7 | ○ (1.98) |
| Ex. 30 | Composition 8 | ○ (2.04) |
| Ex. 31 | Composition 9 | ○ (2.32) |
| Ex. 32 | Composition 10 | ○ (1.92) |
| Ex. 33 | Composition 11 | ○ (1.97) |
| Ex. 34 | Composition 12 | ○ (1.97) |
| Ex. 35 | Composition 13 | ○ (1.87) |
| Ex. 36 | Composition 14 | ○ (1.88) |
| Ex. 37 | Composition 15 | ○ (1.92) |
| Ex. 38 | Composition 16 | ○ (1.88) |
| Ex. 39 | Composition 17 | ○ (1.91) |
| Ex. 40 | Composition 18 | ○ (1.93) |
| Ex. 41 | Composition 19 | ○ (1.89) |
| Ex. 42 | Composition 20 | ○ (1.89) |
| Ex. 43 | Composition 21 | ○ (1.90) |
| Ex. 44 | Composition 22 | ○ (1.91) |
| Compar. Ex. 2 | Comparative Composition 1 | X (2.59) |

The photoresist composition of the present invention is capable of excellent CD uniformity (CDU) in production of photoresist pattern and giving a negative type photoresist pattern with less occurrence of defects.

What is claimed is:

1. A photoresist composition comprising:
a resin which has no acid-labile group and which comprises a structural unit represented by formula (I):

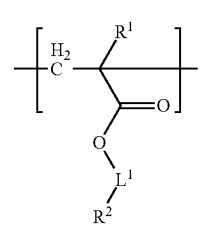

(I)

wherein $R^1$ represents a hydrogen atom or a methyl group, $R^2$ represents a C3-C18 alicyclic hydrocarbon group where a hydrogen atom can be replaced by a C1-C8 aliphatic hydrocarbon group or a hydroxyl group provided that the carbon atom attached to $L^1$ is unsubstituted with a C1-C8 aliphatic hydrocarbon group, and $L^1$ represents a single bond or a C1-C18 divalent saturated hydrocarbon group where a methylene group can be replaced by an oxygen atom or a carbonyl group, and a structural unit represented by formula (a4):

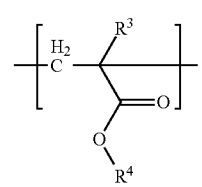

(a4)

wherein $R^3$ represents a hydrogen atom or a methyl group, and
$R^4$ represents a C1-C24 fluorine-containing saturated hydrocarbon group where a methylene group can be replaced by an oxygen atom or a carbonyl group;
a resin which has an acid-labile group; and a salt represented by formula (B1):

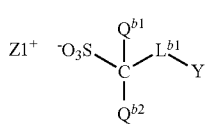
(B1)

wherein $Q^{b1}$ and $Q^{b2}$ each independently represent a fluorine atom or a C1-C6 perfluoroalkyl group,
$L^{b1}$ represents a moiety represented by any one of formulae (b1-1) to (b1-7):

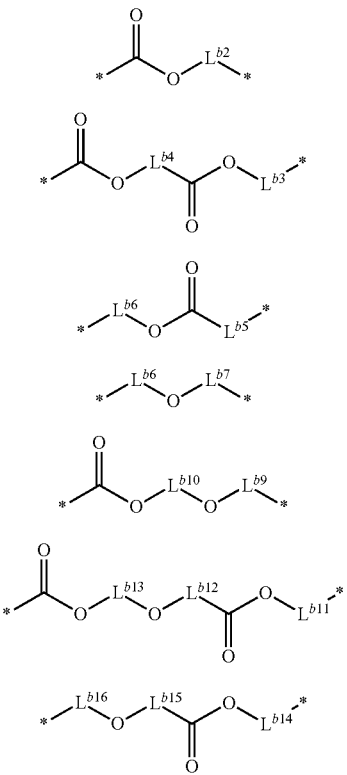

wherein $L^{b2}$ represents a single bond or a C1-C15 divalent saturated hydrocarbon group,
$L^{b3}$ represents a single bond or a C1-C12 divalent saturated hydrocarbon group and $L^{b4}$ represents a C1-C13 divalent saturated hydrocarbon group provided that the total number of the carbon atoms in $L^{b3}$ and $L^{b4}$ is up to 13,
$L^{b5}$ represents a single bond or a C1-C14 divalent saturated hydrocarbon group, and $L^{b6}$ represents a C1-C15 divalent saturated hydrocarbon group provided that the total number of the carbon atoms in $L^{b5}$ and $L^{b6}$ is up to 15,
$L^{b7}$ represents a single bond or a C1-C15 divalent saturated hydrocarbon group and $L^{b8}$ represents a C1-C15 divalent saturated hydrocarbon group with the proviso that total carbon number of $L^{b7}$ and $L^{b8}$ is up to 16,
$L^{b9}$ represents a single bond or a C1-C14 divalent saturated hydrocarbon group and $L^{b10}$ represents a C1-C14 divalent saturated hydrocarbon group, with the proviso that total carbon number of $L^{b9}$ and $L^{b10}$ is up to 14, $L^{b11}$ and $L^{b12}$ each independently represent a single bond or a C1-C11 divalent saturated hydrocarbon group, and $L^{b13}$ represents C1-C12 divalent saturated hydrocarbon group, with the proviso that total carbon number of $L^{b11}$, $L^{b12}$ and $L^{b13}$ is up to 12,
$L^{b14}$ and $L^{b15}$ each independently represent a single bond or a C1-C13 divalent saturated hydrocarbon group, and $L^{b16}$ represents C1-C14 divalent saturated hydrocarbon group, with the proviso that total carbon number of $L^{b14}$, $L^{b15}$ and $L^{b16}$ is up to 14, and
* represents a binding position, * of the left side represents a binding position to $-C(Q^{b1})(Q^{b2})-$;
Y represents a C3-C18 alicyclic hydrocarbon group where a methylene group can be replaced by an oxygen atom, a sulfonyl group or a carbonyl group and where a hydrogen atom can be replaced by a substituent, and $Z1^+$ represents an organic cation.

2. The photoresist composition according to claim 1, wherein $R^2$ represents a C3-C18 unsubstituted alicyclic hydrocarbon group.

3. The photoresist composition according to claim 1, wherein the structural unit represented by formula (a4) is one selected from the group consisting of a structural unit represented by formula (a4-1), a structural unit represented by formula (a4-2) and a structural unit represented by formula (a4-0);

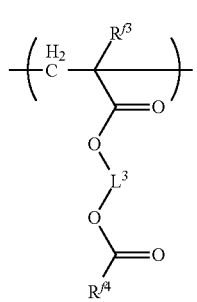
(a4-1)

where $R^{f3}$ represents a hydrogen atom or a methyl group,
$L^3$ represents a C1-C18 divalent saturated hydrocarbon group where a methylene group can be replaced by an oxygen atom or a carbonyl group, and
$R^{f4}$ represents a C1-C20 fluorine-containing saturated hydrocarbon group provided that the total number of carbon atoms in $L^3$ and $R^{f4}$ is 20 or less;

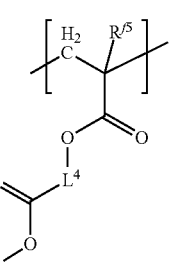
(a4-2)

where $R^{f5}$ represents a hydrogen atom or a methyl group,
$L^4$ represents a C1-C18 divalent saturated hydrocarbon group where a methylene group can be replaced by an oxygen atom or a carbonyl group, and $R^{f6}$ represents a C1-C20 fluorine-containing saturated hydrocarbon group provided that the total number of carbon atoms in $L^4$ and $R^{f6}$ is 20 or less;

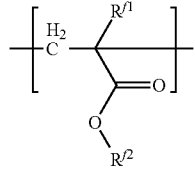

(a4-0)

where $R^{f1}$ represents a hydrogen atom or a methyl group, and $R^{f2}$ represents a C1-C20 fluorine-containing saturated hydrocarbon group.

4. The photoresist composition according to claim 1, wherein the resin which has an acid-labile group comprises a structural unit represented by formula (a1-1) and a structural unit represented by formula (a1-2);

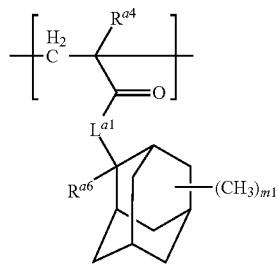

(a1-1)

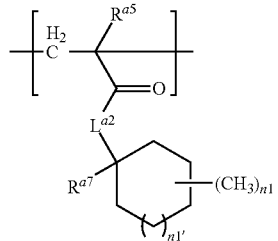

(a1-2)

wherein $L^{a1}$ and $L^{a2}$ each independently represents —O— or *—O—$(CH_2)_{k1}$—CO—O— in which * represents a binding position to —CO—, and k1 represents an integer of 1 to 7, $R^{a4}$ and $R^{a5}$ each independently represent a hydrogen atom or a methyl group, $R^{a6}$ and $R^{a7}$ each independently represent a C1-C8 alkyl group, a C3-C18 alicyclic hydrocarbon group, and a combination of them, m1 represents an integer of 0 to 14, n1 represents an integer of 0 to 10, and n1' represents 0 to 3.

5. A process for producing a photoresist pattern comprising the following steps (1) to (5):

(1) a step of applying the photoresist composition according to claim 1 on a substrate, (2) a step of forming a composition film by drying the composition, (3) a step of exposing the composition film to radiation, (4) a step of baking the exposed composition film, and (5) a step of developing the baked composition film, thereby forming a photoresist pattern.

6. The photoresist composition according to claim 2, wherein the structural unit represented by formula (a4) is one selected from the group consisting of a structural unit represented by formula (a4-1), a structural unit represented by formula (a4-2) and a structural unit represented by formula (a4-0);

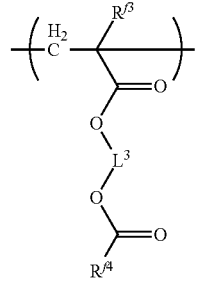

(a4-1)

where $R^{f3}$ represents a hydrogen atom or a methyl group, $L^3$ represents a C1-C18 divalent saturated hydrocarbon group where a methylene group can be replaced by an oxygen atom or a carbonyl group, and $R^{f4}$ represents a C1-C20 fluorine-containing saturated hydrocarbon group provided that the total number of carbon atoms in $L^3$ and $R^{f4}$ is 20 or less;

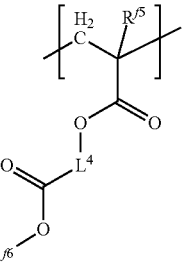

(a4-2)

where $R^{f5}$ represents a hydrogen atom or a methyl group, $L^4$ represents a C1-C18 divalent saturated hydrocarbon group where a methylene group can be replaced by an oxygen atom or a carbonyl group, and $R^{f6}$ represents a C1-C20 fluorine-containing saturated hydrocarbon group provided that the total number of carbon atoms in $L^4$ and $R^{f6}$ is 20 or less;

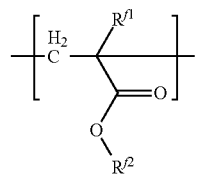

(a4-0)

where $R^{f1}$ represents a hydrogen atom or a methyl group, and $R^{f2}$ represents a C1-C20 fluorine-containing saturated hydrocarbon group.

7. A process for producing a photoresist pattern comprising the following steps (1) to (5):

(1) a step of applying the photoresist composition according to claim 2 on a substrate, (2) a step of forming a composition film by drying the composition,
(3) a step of exposing the composition film to radiation,
(4) a step of baking the exposed composition film, and
(5) a step of developing the baked composition film, thereby forming a photoresist pattern.

* * * * *